US012784834B2

(12) United States Patent
Clampitt et al.

(10) Patent No.: US 12,784,834 B2
(45) Date of Patent: Nov. 3, 2026

(54) MEMORY DEVICE WITH SEGMENTED SGD DRAIN

(71) Applicant: Micron Technology, Inc., Boise, ID (US)

(72) Inventors: Darwin A. Clampitt, Wilder, ID (US); Collin Howder, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 18/746,904

(22) Filed: Jun. 18, 2024

(65) Prior Publication Data

US 2025/0006261 A1 Jan. 2, 2025

Related U.S. Application Data

(60) Provisional application No. 63/523,560, filed on Jun. 27, 2023.

(51) Int. Cl.
*G11C 16/04* (2006.01)
*G11C 16/14* (2006.01)
(Continued)

(52) U.S. Cl.
CPC .......... *G11C 16/0483* (2013.01); *G11C 16/14* (2013.01); *H10B 41/27* (2023.02);
(Continued)

(58) Field of Classification Search
CPC .... G11C 16/0483; G11C 16/14; H10B 41/27; H10B 41/35; H10B 43/27; H10B 43/35
(Continued)

(56) References Cited

U.S. PATENT DOCUMENTS 8,884,357 B2 11/2014 Wang et al.
9,356,043 B1 5/2016 Sakakibara et al.
(Continued)

FOREIGN PATENT DOCUMENTS

CN 111354734 A 6/2020
CN 111540748 A 8/2020
(Continued)

OTHER PUBLICATIONS

"Chinese Application Serial No. 202210949317.4, Office Action mailed Mar. 25, 2026", with English translation, 9 pages.
(Continued)

*Primary Examiner* — Tha-O H Bui
(74) *Attorney, Agent, or Firm* — Schwegman Lundberg & Woessner, P.A.

(57) ABSTRACT

A variety of applications can include memory devices designed to provide enhanced gate-induced-drain-leakage (GIDL) current during memory erase operations. The enhanced operation can be provided by enhancing the electric field in the channel structures of select gate transistors to strings of memory cells at segmented drains of the select gate transistors. The segmented drains can have conductive fins integrated with the transistor channel structure and extending vertically from a top border of the transistor channel structure, where the conductive fins are separated from each other by non-conductive regions on the top border. The segmented drain can include portions extending downward below the top border. The transistor channel structures can be integrated with the channel structures of the pillars forming the strings of memory cells. Additional devices, systems, and methods are discussed.

20 Claims, 51 Drawing Sheets

(51) Int. Cl.

| | |
|---|---|
| ***H10B 41/27*** | (2023.01) |
| ***H10B 41/35*** | (2023.01) |
| ***H10B 43/27*** | (2023.01) |
| ***H10B 43/35*** | (2023.01) |

(52) U.S. Cl.
CPC ............ *H10B 41/35* (2023.02); *H10B 43/27* (2023.02); *H10B 43/35* (2023.02)

(58) Field of Classification Search
USPC ..................................................... 365/185.01
See application file for complete search history.

(56) References Cited

U.S. PATENT DOCUMENTS

| | | | | |
|---|---|---|---|---|
| 9,711,522 | B2 * | 7/2017 | Park | H10B 43/27 |
| 10,103,155 | B2 * | 10/2018 | Sakaike | H10B 41/27 |
| 11,211,400 | B2 * | 12/2021 | She | H01L 23/528 |
| 11,362,175 | B1 * | 6/2022 | Fayrushin | H10D 30/689 |
| 11,742,380 | B2 | 8/2023 | Fayrushin et al. | |
| 11,887,667 | B2 * | 1/2024 | Clampitt | H10B 43/27 |
| 2009/0103367 | A1 | 4/2009 | Lue | |
| 2010/0327323 | A1 | 12/2010 | Choi | |
| 2011/0180941 | A1 | 7/2011 | Hwang et al. | |
| 2011/0298037 | A1 | 12/2011 | Choe et al. | |
| 2013/0017629 | A1 | 1/2013 | Pyo et al. | |
| 2014/0167129 | A1 | 6/2014 | Kim | |
| 2017/0069731 | A1 | 3/2017 | Kim et al. | |
| 2018/0053768 | A1 | 2/2018 | Kim et al. | |
| 2019/0147954 | A1 | 5/2019 | Yip | |
| 2019/0214395 | A1 | 7/2019 | Zhang et al. | |
| 2020/0066749 | A1 | 2/2020 | Yamasaki et al. | |
| 2020/0152793 | A1 | 5/2020 | Majhi et al. | |
| 2020/0176033 | A1 | 6/2020 | Hosotani et al. | |
| 2020/0395374 | A1 | 12/2020 | Huo et al. | |
| 2021/0066334 | A1 | 3/2021 | Yang | |
| 2023/0041326 | A1 | 2/2023 | Clampitt et al. | |

FOREIGN PATENT DOCUMENTS

| | | | |
|---|---|---|---|
| CN | 111725219 | A | 9/2020 |
| CN | 112530973 | A | 3/2021 |
| CN | 113178451 | A | 7/2021 |
| CN | 115019845 | B | 2/2026 |
| KR | 20190085475 | A | 7/2019 |

OTHER PUBLICATIONS

"Fayrushin, Albert et al., Select Gate Gate-Induced-Drain-Leakage Enhancement, U.S. Appl. No. 17/193,845, filed Mar. 5, 2021, 46 pgs.", 46 pgs.

Lee, G H., et al., "Architecture and Process Integration Overview of 3D NAND Flash Technologies", Appl. Sci. 11,6703., (2021), 18 pgs.

* cited by examiner

MEMORY DEVICE WITH SEGMENTED SGD DRAIN

PRIORITY APPLICATION

This application claims the benefit of priority to U.S. Provisional Application Ser. No. 63/523,560, filed Jun. 27, 2023, which is incorporated herein by reference in its entirety.

FIELD OF THE DISCLOSURE

Embodiments of the disclosure relate generally to memory devices and operation of memory devices and, more specifically, to structures and methods related to erase operations of memory devices.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. Properties of memory devices and other electronic devices can be improved by enhancements to the structure and fabrication of components in the memory devices to access storage units of the memory devices.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
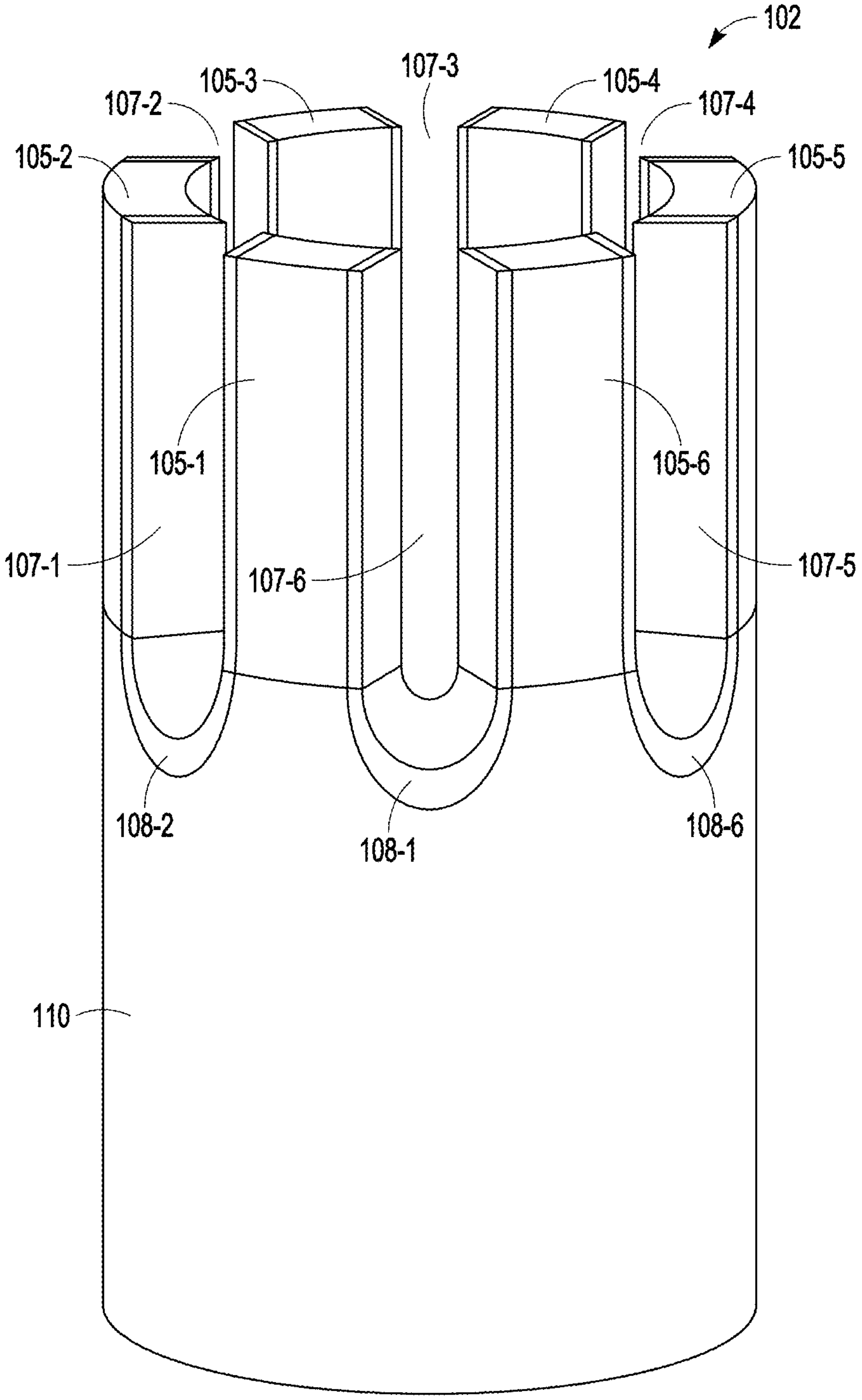
FIGS. 1-4 illustrate a set of example segmented structures that can be implemented in a transistor to couple a digit line to a vertical pillar of memory cells, in accordance with various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. The various embodiments are not necessarily mutually exclusive, as some embodiments can be combined with one or more other embodiments to form new embodiments. The following detailed description is, therefore, not to be taken in a limiting sense.

Flash memory is utilized as non-volatile memory for a wide range of electronic applications. Flash memory devices typically include one or more groups of one-transistor, floating gate or charge trap memory cells, that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a digit line (e.g., a bit line). In a NAND architecture, the drains of each memory cell in a string of the array are coupled together in series, source to drain, between a source line and a digit line.

Using 3D architectures for memory devices, such as NAND memory devices, can provide increased capacity over planar structures. The memory arrays for 3D structures can include memory cells stacked vertically as strings of memory cells. In selecting one or more strings for access to given memory cells, gating structures can be located at the top and bottom of these strings with memory cells storing data therebetween. The gating structures can include a select gate transistor with its drain coupled to a digit line, such as a bitline, at one end of a string and a select gate transistor with its source coupled to a source line at the other end of the string.

In a number of NAND flash devices, an erase operation on a string of memory cells is performed by applying relatively high positive voltages to the string body. In the case of 3D NAND architectures, with the string body of memory cells being electrically isolated, holes can be generated and injected in the string body in order to sustain a positive potential in the string during erase of the memory cells of the string. Gate-Induced-Drain-Leakage (GIDL) is a technique to achieve high-performance and reliable erase operation. It is a leakage mechanism in devices, such as insulated gate field effect transistor (IGFETs), due to large field effect in the drain junction. Existing methods to enhance GIDL operations in a 3D NAND flash memory device include attempts at optimization of the device doping profile of a select transistor to a string of memory cells to make the junction of the select transistor abrupt. With the number of tiers of memory cells in vertical strings in 3D NAND flash memory devices rising to several hundreds or more, it is important to provide sufficient GIDL current during erase operations.

Both NOR and NAND flash architecture semiconductor memory arrays of flash memory devices are accessed through decoders that activate specific memory cells by selecting an access line (WL) coupled to gates of specific memory cells. In a NOR architecture semiconductor memory array, once activated, the selected memory cells place their data values on digit lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (Vpass) to operate the unselected memory cells of each group as pass transistors, for example, to pass current in a manner unrestricted by their stored data values. Current then flows in the line between the source line and the digit line through each series-coupled group, restricted only by the selected memory cells of each group, placing current-encoded data values of selected memory cells on the digit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context, to refer to any memory cell(s) that can store more than one bit of data per cell (i.e., that can represent more than two programmed states). Herein, a memory cell that can store two bits of data per cell (e.g., one of four programmed states) is referred to as a dual-level cell (DLC). A triple-level cell (TLC) refers to a memory cell that can store three bits of data per cell (e.g., one of eight programmed states). A quad-level cell (QLC) can store four bits of data per cell, and a penta-level cell (PLC) can store five bits of data per cell. In a string of memory cells in a 3D memory device such as a 3D NAND memory, access to the string to operate on a memory cell in the string can be controlled by a gating selector device, such as a select gate transistor, which is in series with the memory cells of the string.

In various embodiments, band-to-band charge generation in a transisor channel of a select gate transistor at the digit line side of a 3D NAND flash pillar of memory cells can be increased based on segmentation of a drain of the select gate transistor. The pillar can include a string of memory cells coupled, at one end of the pillar, to a source line by one or more source-side select gate (SGS) transistors coupled to the pillar with the string of memory cells arranged in series to the source line. At the other end, the string of memory cells can be coupled to the digit line by one or more SGD transistors coupled to the pillar and arranged to couple the string of memory cells to the digit line. The pillar, providing the string, can be a vertical semiconductor pillar coupled to memory cells, where the vertical semiconductor pillar has a channel structure arranged as channel portions of the memory cells. The SGD transistor can include a gate, a gate dielectric, a transistor channel structure, and a segmented drain. The transistor channel structure is separated from the gate by the gate dielectric, where the transistor channel structure is vertically integrated with the channel structure of the memory cells of the vertical semiconductor pillar. The segmented drain can have conductive fins integrated with the transistor channel structure and can extend vertically from a top border of the transistor channel structure. The conductive fins are separated from each other by non-conductive regions on the top border. The segmented drain can also include conductive portions extending downward below the top border from intersections of the conductive fins with the non-conductive regions. A drain contact can contact the conductive fins of the segmented drain, where the drain contact can include titanium at the conductive fins. Each pillar of multiple pillars of memory cells in a 3D NAND memory array may be coupled with one SGD transistor to a digit line and one SGS transistor to a source line.

The increased generation of band-to-band charge, based on the structural interface of the segmented drain with the transistor channel structure that is integrated with the channel structure of the pillar, can further enhance drain-side current GIDL in an erase operation. This structural interface of the segmented drain provides a different approach from doping optimization between a contact and a channel structure of the SGD transistor. The band-to-band tunneling field giving rise to GIDL current can be enhanced by using the segmented drain integrated with the channel structure of the pillar via the channel structure of the SGD transistor. The cross-dissected segmented drain provided by the fins and non-conductive regions of the segmented drain breaks uniformity of the electric field and allows electric field lines to concentrate in the dissected area, enhancing band-to-band offset.

A SGD transistor for a vertical NAND string of memory cells can be implemented with a segmented drain having fins interfacing a channel region of the SGD transistor, with fanged regions extending from the fins into the channel region. A SGD transistor with segmented fins and fangs can be realized in a number of arrangements. In an arrangement, a thin low-capacitance drain contact can be built in situ with the segmented module. The drain contact can be, but is not limited to, a tungsten (W) drain contact. In another arrangement, a drain contact can be constructed to touch down to a conductive landing pad. The drain contact can be, but is not limited to, a W drain contact, and the conductive landing pad can be, but is not limited to, a n+ drain landing pad. A drain contact can include a titanium (Ti)/titanium nitride (TiN)/W in contact with the fins of the segmented drain. With the fins of the segmented drain being a silicon composition, the Ti/TiN/W drain contact can form a tianium silicide ($TiSi_X$) interface with the silicon of the segmented drain, which can enhance the ohmic property of the drain contact. The $TiSi_X$ can be an interface of one or more monolayers or larger thickness. Other semiconductor material can be used for the segmented drain and the drain contact that has enhanced ohmic properties.

The configuration and shape of the interface between a channel structures of the SGD transistor and the segmented fins of the drain of the SGD transistor can be engineered to improve performance. The segmented fins of the drain can be more heavily doped than the channel region. For example, the segmented fins of the drain can be n+ regions and the channel region can be a n region or a n− region. Fangs extending from the segmented fins can also be structured as n+ regions.

FIGS. 1-4 illustrate a set of example structures 102, 202, 302, and 402 that can be implemented in a transistor to couple a digit line to a vertical pillar of memory cells in which these structures include segmented fins and are integrated in the respective vertical pillar of memory cells. The transistor coupling the digit line to the vertical pillar of memory cells can be implemented, for example, as a SGD transistor in a memory array of a NAND memory device. Each of structures 102, 202, 302, and 402 includes a transistor channel structure to couple to channel material of the vertical pillar of memory cells and extend vertically from the channel material of the vertical pillar, in an integrated manner. The transistor channel structure provides for transistor operation and is separated from a gate of the transistor by dielectric material providing a transistor tunnel region. Each of structures 102, 202, 302, and 402 can also include one or more fins of a segmented drain doped more heavily than the transistor channel structure. The one or more fins can be separated from each other by one or more non-conductive regions. The one or more fins can contact and can extend vertically from and above the transistor channel structure, and the one or more non-conductive regions can contact and extend vertically from and above the transistor channel structure.

FIG. 1 shows a structure 102 forming part of a SGD transistor. Structure 102 has fins 105-1, 105-2, 105-3, 105-4, 105-5, and 105-6 and electrically non-conductive regions 107-1, 107-2, 107-3, 107-4, 107-5, and 107-6, with fins 105-1, 105-2, 105-3, 105-4, 105-5, and 105-6 and non-conductive regions 107-1, 107-2, 107-3, 107-4, 107-5, and 107-6 extending vertically from a channel structure 110 of structure 102 for the SGD transistor. Though non-conductive regions 107-1, 107-2, 107-3, 107-4, 107-5, and 107-6 are shown as voids, these non-conductive regions can include dielectric material. The interface of non-conductive region 107-1 with channel structure 110 has a rounding 108-2, which is a rounded border for channel structure 110 from a lower end corner of fin 105-1 to a lower end corner of fin 105-2. The interface of non-conductive region 107-6 with channel structure 110 has a rounding 108-1, which is a rounded border for channel structure 110 from a lower end corner of the fin 105-6 to a lower end corner of the fin 105-1. The interface of non-conductive region 107-5 with channel structure 110 has a rounding 108-6, which is a rounded border for channel structure 110 from a lower end corner of the fin 105-5 to a lower end corner of the fin 105-6. A non-conductive region between fin 105-2 and fin 105-3 can also have a rounding as a rounded border for channel structure 110. A non-conductive region between fin 105-3 and fin 105-4 can also have a rounding as a rounded border for channel structure 110. A non-conductive region between fin 105-4 and fin 105-5 can also have a rounding as a rounded border for channel structure 110. The roundings of structure 102 can be structured as regions more heavily doped than channel structure 110. For example, with channel structure 110 doped as a n− structure, the roundings of structure 102 can include n+ doping. Implemented in a SGD transistor for a memory string of a memory array of a memory device, structure 102 can be disposed around a dielectric region.

Figure 2:
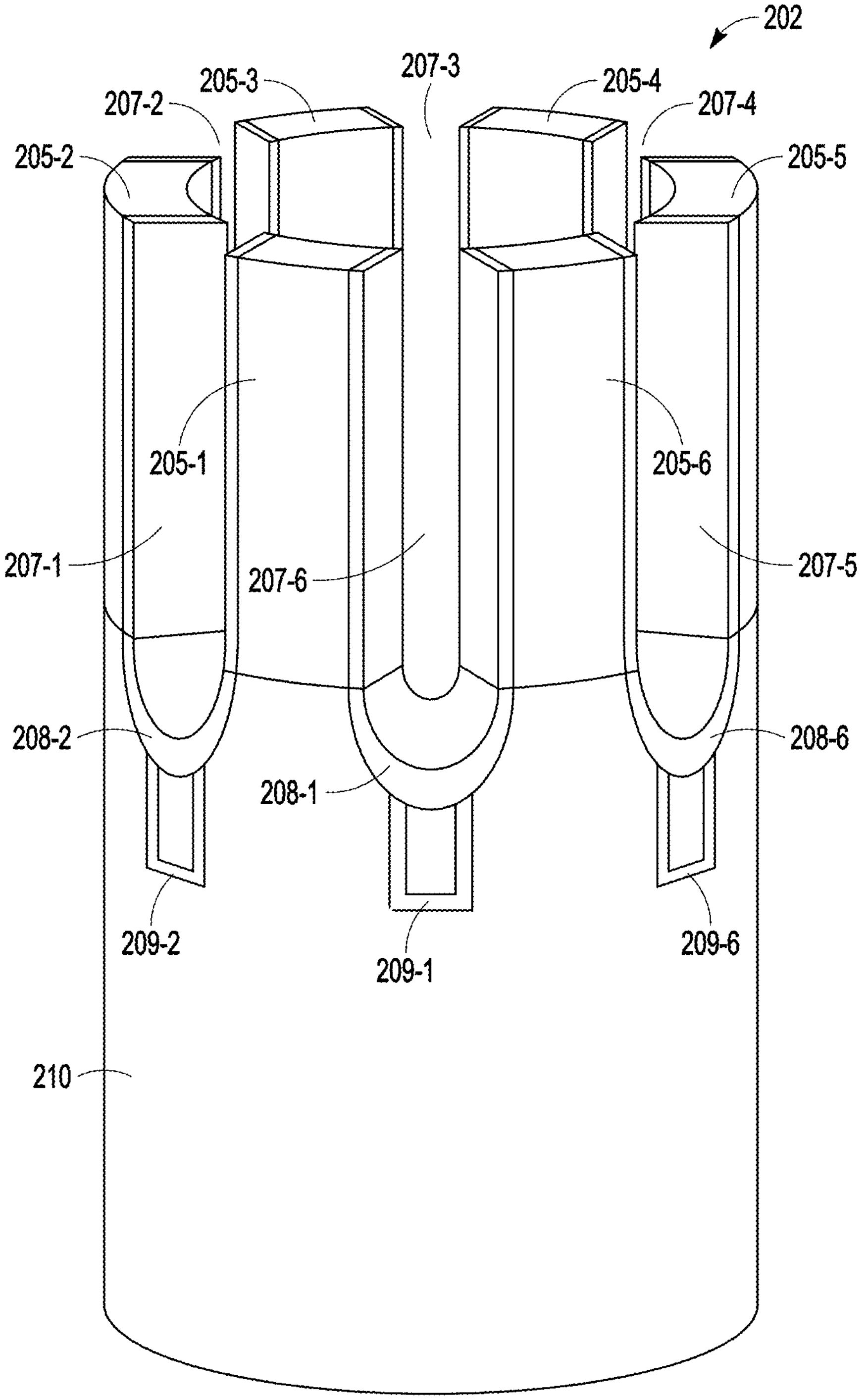

FIG. 2 shows a structure 202 forming part of a SGD transistor. Structure 202 has fins 205-1, 205-2, 205-3, 205-4, 205-5, and 205-6 and electrically non-conductive regions 207-1, 207-2, 207-3, 207-4, 207-5, and 207-6 with fins 205-1, 205-2, 205-3, 205-4, 205-5, and 205-6 and non-conductive regions 207-1, 207-2, 207-3, 207-4, 207-5, and 207-6 extending vertically from a channel structure 210 of structure 202. Though non-conductive regions 207-1, 207-2, 207-3, 207-4, 207-5, and 207-6 are shown as voids, these non-conductive regions can include dielectric material. The interface of non-conductive region 207-1 with the channel structure 210 has a rounding 208-2, which is a rounded border for the channel structure 210, from a lower end corner of the fin 205-1 to a lower end corner of the fin 205-2. The interface of non-conductive region 207-6 with the channel structure 210 has a rounding 208-1, which is a rounded border for the channel structure 210, from a lower end corner of the fin 205-6 to a lower end corner of the fin 205-1. The interface of non-conductive region 207-5 with the channel structure 210 has a rounding 208-6, which is a rounded border for the channel structure 210, from a lower end corner of the fin 205-5 to a lower end corner of the fin 205-6. The interface of non-conductive region 207-2 with the channel structure 210 can also have a rounding as a rounded border for the channel structure 210 between fin 205-2 and fin 205-3. The interface of non-conductive region 207-3 with the channel structure 210 can also have a rounding as a rounded border for the channel structure 210 between fin 205-3 and fin 205-4. The interface of non-conductive region 207-4 with the channel structure 210 can also have a rounding as a rounded border for the channel structure 210 between fin 205-4 and fin 205-5. The roundings of structure 202 can be structured as regions more heavily doped than the channel structure 210. For example, with the channel structure 210 doped as a n− structure, the roundings of structure 202 can have n+ doping.

Additionally, an emitter 209-1 can be structured extending from rounding 208-1 into the channel structure 210. The emitter 209-1 can be located extending downward in the channel structure 210 from a location at about a center of rounding 208-1 and can have a width in size that is a portion of rounding 208-1 along rounding 208-1. An emitter 209-2 can be structured extending from rounding 208-2 into the channel structure 210. The emitter 209-2 can be located extending downward in the channel structure 210 from a location at about a center of rounding 208-2 and can have a width in size that is a portion of rounding 208-2 along rounding 208-2. An emitter 209-6 can be structured extending from rounding 208-6 into the channel structure 210. The emitter 209-6 can be located extending downward in the channel structure 210 from a location at about a center of rounding 208-6 and can have a width in size that is a portion of rounding 208-6 along rounding 208-6. Though not shown, emitters can be structured into the channel structure 210 extending from other roundings at interfaces of non-conductive regions with the channel structure 210. The emitters of the channel structure 202 can be structured to be more heavily doped than channel structure 210. For example, with channel structure 210 doped as a n− structure, the emitters can be n+ emitters. Implemented in a SGD transistor for a memory string of a memory array of a memory device, structure 202 can be disposed around a dielectric region.

Figure 3:
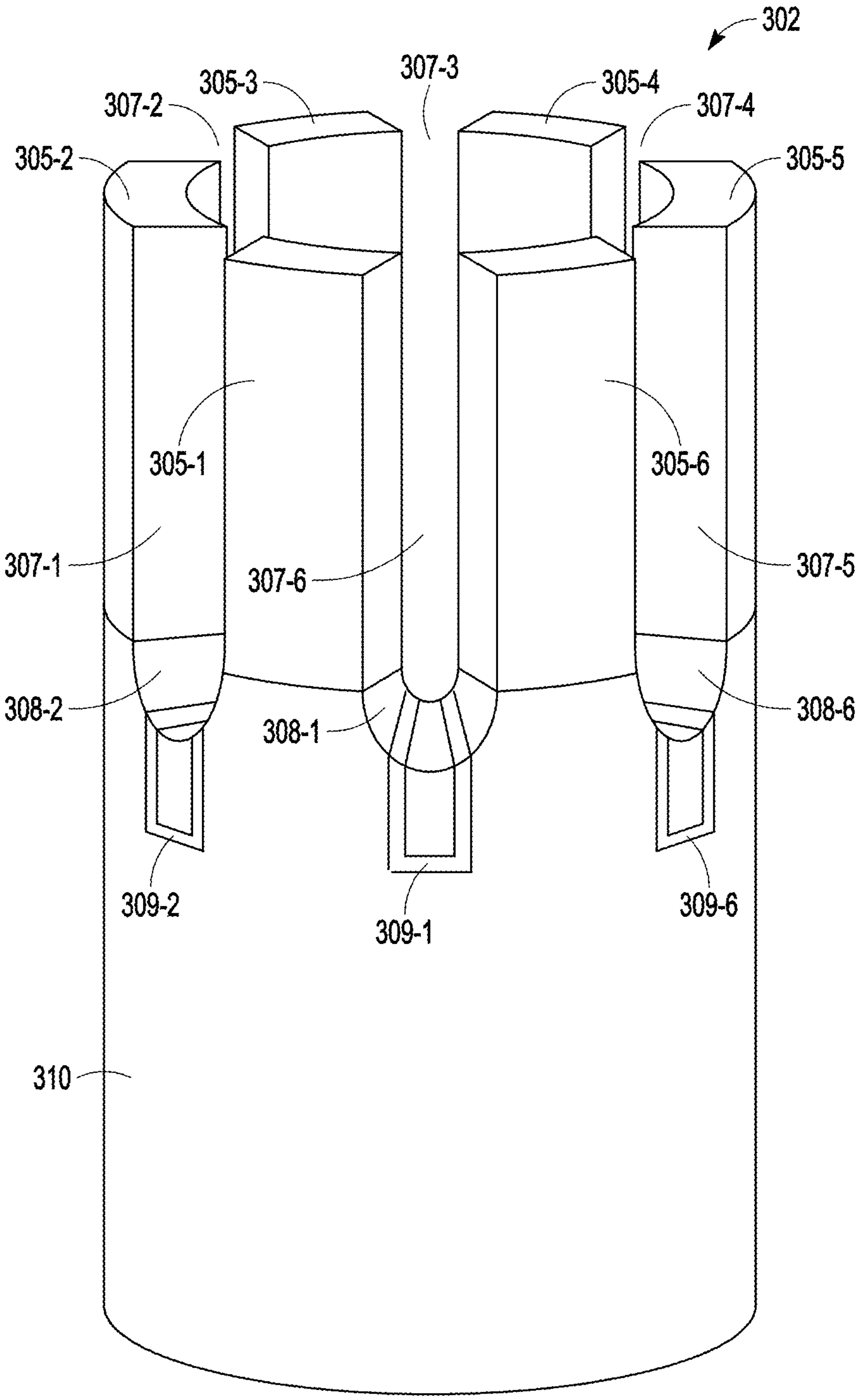

FIG. 3 shows a structure 302 forming part of a SGD transistor. Structure 302 has fins 305-1, 305-2, 305-3, 305-4, 305-5, and 305-6 and electrically non-conductive regions 307-1, 307-2, 307-3, 307-4, 307-5, and 307-6, with fins 305-1, 305-2, 305-3, 305-4, 305-5, and 305-6 and non-conductive regions 307-1, 307-2, 307-3, 307-4, 307-5, and 307-6 extending vertically from a channel structure 310 of structure 302. Though non-conductive regions 307-1, 307-2, 307-3, 307-4, 307-5, and 307-6 are shown as voids, these non-conductive regions can include dielectric material. The interface of non-conductive region 307-1 with the channel structure 310 has a rounding 308-2, which is a rounded border for the channel structure 310, from a lower end corner of the fin 305-1 to a lower end corner of the fin 305-2. The interface of non-conductive region 307-6 with the channel structure 310 has a rounding 308-1, which is a rounded border for the channel structure 310, from a lower end corner of fin 305-6 to a lower end corner of the fin 305-1. The interface of non-conductive region 307-5 with the channel structure 310 has a rounding 308-6, which is a rounded border for the channel structure 310, from a lower end corner of the fin 305-5 to a lower end corner of the fin 305-6. The interface of non-conductive region 307-2 with the channel structure 310 can also have a rounding as a rounded border for the channel structure 310 between fin 305-2 and fin 305-3. The interface of non-conductive region 307-3 with the channel structure 310 can also have a rounding as a rounded border for the channel structure 310 between fin 305-3 and fin 305-4. The interface of non-conductive region 307-4 with the channel structure 310 can also have a rounding as a rounded border for the channel structure 310 between fin 305-4 and fin 305-5.

An emitter 309-1 can be structured extending from rounding 308-1 into the channel structure 310. The emitter 309-1 can be located extending downward in the channel structure 310 from a location at about a center of rounding 308-1 and can have a width in size that is a portion of rounding 308-1 along rounding 308-1. An emitter 309-2 can be structured extending from rounding 308-2 into the channel structure 310. The emitter 309-2 can be located extending downward in the channel structure 310 from a location at about a center of rounding 308-2 and can have a width in size that is a portion of rounding 308-2 along rounding 308-2. An emitter 309-6 can be structured extending from rounding 308-6 into the channel structure 310. The emitter 309-6 can be located extending downward in the channel structure 310 from a location at about a center of rounding 308-6 and can have a width in size that is a portion of rounding 308-6 along rounding 308-6. Though not shown, other emitters can similarly be structured extending into the channel structure 310 from other roundings of structure 302 at interfaces of non-conductive regions with the channel structure 310. The emitters of structure 302 can be structured to be more heavily doped than the channel structure 310. For example, with the channel structure 310 doped as a n− structure, the emitters can be n+ emitters. Structure 302 of FIG. 3 differs from structure 202 of FIG. 2 in that the roundings of the channel structure 310 of structure 302 do not have added charge doping with respect to the channel structure 310 except at emitters. Implemented in a SGD transistor for a memory string of a memory array of a memory device, structure 302 can be structured around a dielectric region.

Figure 4:
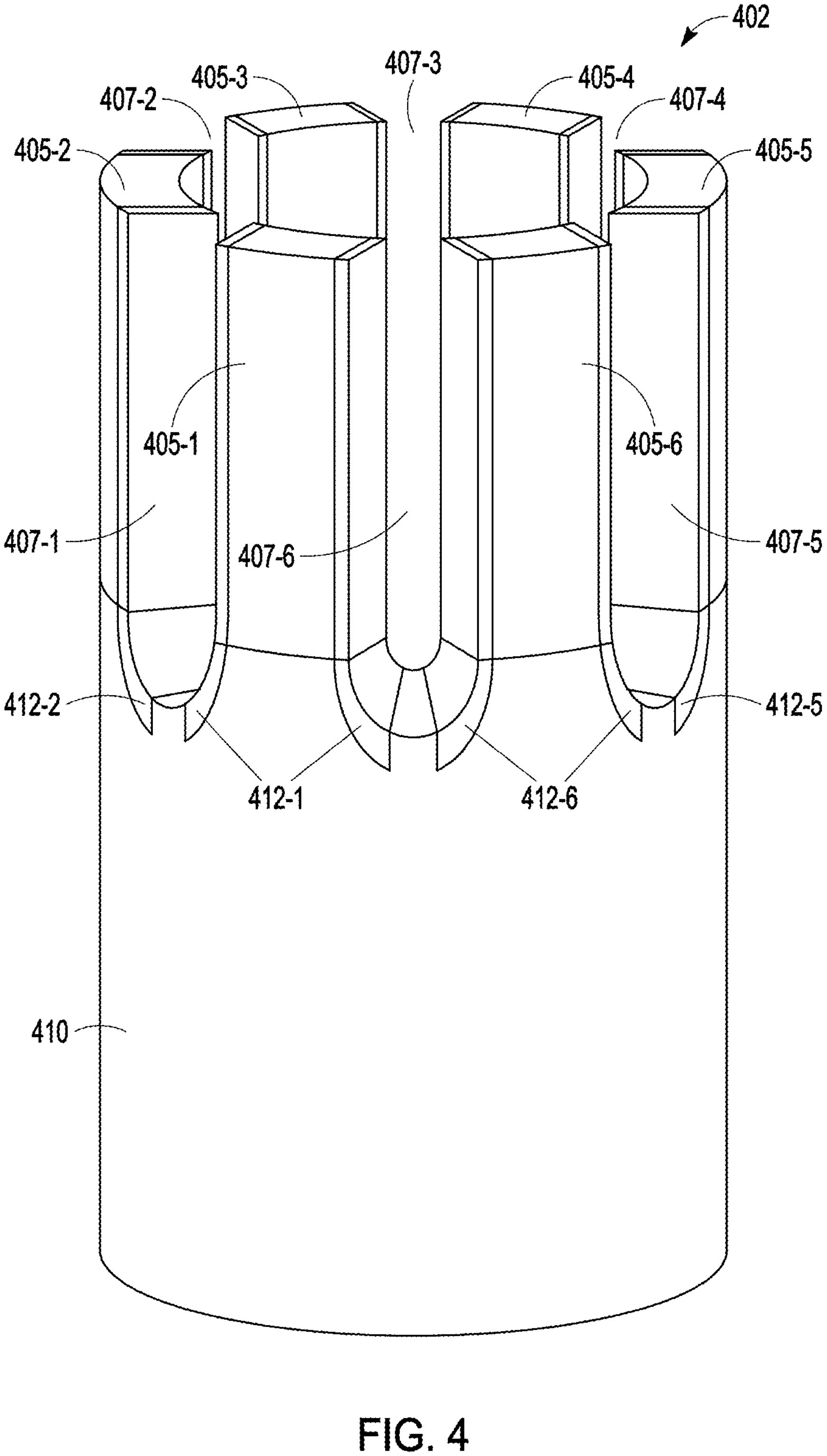

FIG. 4 shows a structure 402 forming part of a SGD transistor. Structure 402 has fins 405-1, 405-2, 405-3, 405-4, 405-5, and 405-6 and electrically non-conductive regions 407-1, 407-2, 407-3, 407-4, 407-5, and 407-6, with fins 405-1, 405-2, 405-3, 405-4, 405-5, and 405-6 and non-conductive regions 407-1, 407-2, 407-3, 407-4, 407-5, and 407-6 extending vertically from a channel structure 410 of structure 402. Though non-conductive regions 407-1, 407-2, 407-3, 407-4, 407-5, and 407-6 are shown as voids, these non-conductive regions can include dielectric material. The interface of each of non-conductive regions 407-1, 407-2, 407-3, 407-4, 407-5, and 407-6 can have a rounding between adjacent fins.

Portions of the rounding from non-conductive region 407-1 can be structured to be more heavily doped than channel structure 410 and can be structured as two fanged regions into the channel structure 410. One fanged region 412-2 extends from the lower end corner of the fin 405-2 towards the lower end corner of the fin 405-1. An other one of fanged region 412-2 is not shown. From fin 405-1, more heavily doped fanged regions 412-1 extend into channel structure 410. From fin 405-6, more heavily doped fanged regions 412-6 extend into channel structure 410. Portions of the rounding from non-conductive region 407-5 can be structured to be more heavily doped than channel structure 410 and can be structured as two fanged regions into the channel structure 410. One fanged region 412-5 extends from the lower end corner of the fin 405-5 towards the lower end corner of the fin 405-6. An other one of fanged region 412-5 is not shown. With the channel structure 410 doped as a n− structure, fangs of structure 402 can have n+ doping with the regions between fangs under a non-conductive region having a n− structure. Though not shown, each fin of structure 402 can be structured with two fanged regions extending into the channel structure 410 with each fanged region disposed along a portion of a corresponding rounding of the channel structure 410. Structure 402 of FIG. 4 differs from structure 102 of FIG. 1 in that the roundings of structure 402 between fins and under non-conductive regions have two fanged regions more heavily doped than the channel structure with the region between the fangs being part of the channel structure, while the roundings in structure 102 of FIG. 1 are more heavily doped completely from one fin to an adjacent fin. Implemented in a SGD transistor for a memory string of a memory array of a memory device, structure 402 can be structured around a dielectric region.

Figure 5:
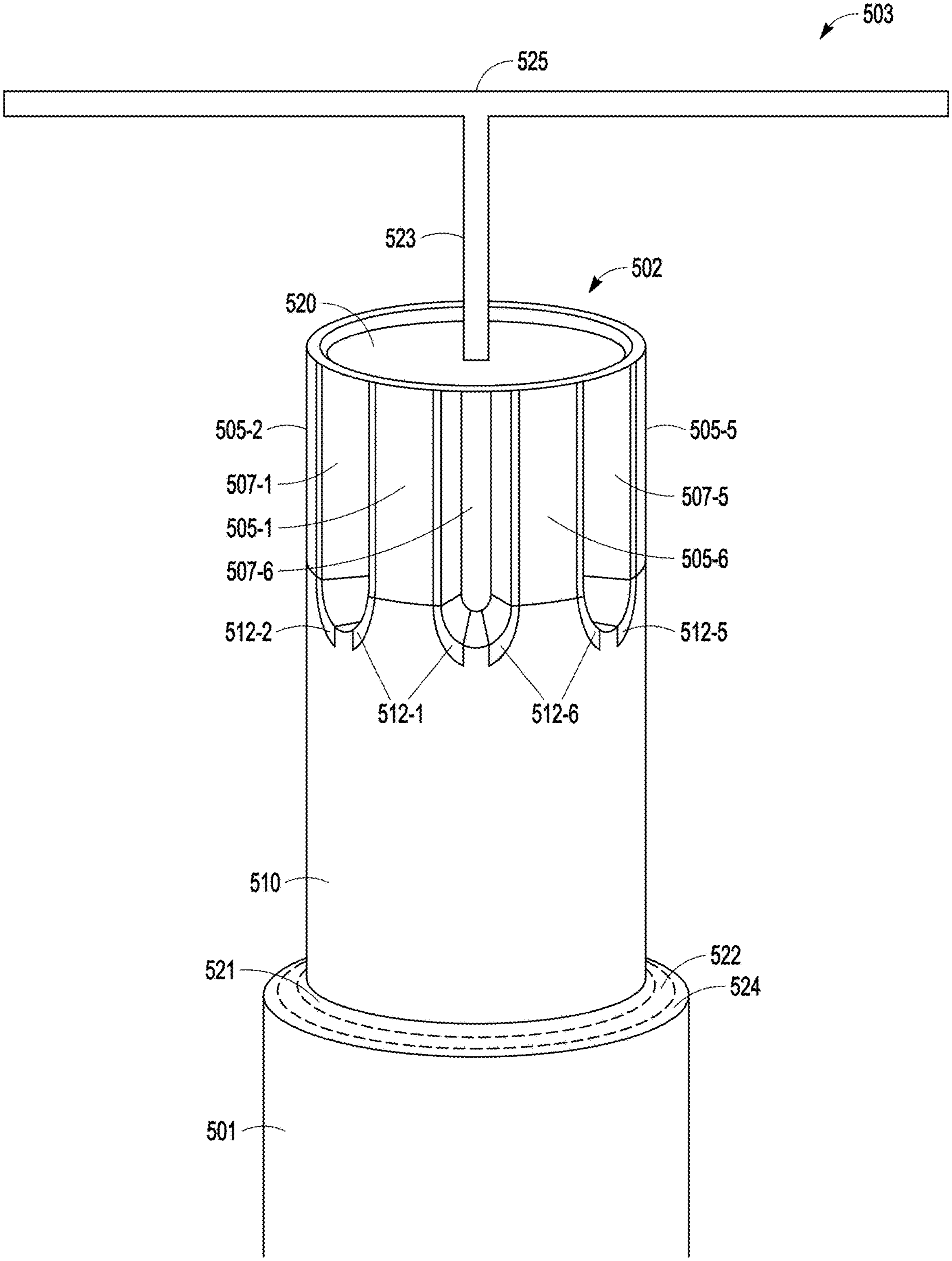
FIG. 5 illustrates an example segmented structure for a transistor arranged to couple a digit line to channel material of a vertical pillar of memory cells of a memory device, in accordance with various embodiments.

FIG. 5 illustrates features of an example arrangement 503 of a SGD transistor having a structure 502 with a segmented drain arranged to couple a digit line 525 to a channel structure of a vertical pillar 501 of memory cells of a memory device through a transistor channel structure 510 of the SGD transistor integrated with the channel structure of vertical pillar 501. With channel structure 510 of the SGD transistor integrated with the channel structure of vertical pillar 501 below channel structure 510, the channel structure of vertical pillar 501 is not shown in FIG. 5. Around the channel structure of vertical pillar 501 at levels below channel structure 510 are regions for memory cells in the pillar. The regions include a tunnel region 521, a charge storage region 522, and a blocking dielectric region 524, were these regions extend substantially through the length of vertical pillar 501.

Structure 502 for the SGD transistor can be structured with a segmented drain extending from channel structure 510 of the SGD transistor. To focus on the segmented drain, not all features of the SGD transistor or the pillar with which the SGD transistor is integrated are shown. The segmented drain can include six fins 505-1, 505-2 . . . 505-5, and 505-6 and six non-conductive regions 507-1 . . . 507-5, and 507-6, though fins 505-3 and 505-4 and non-conductive regions 507-2, 507-3, and 507-4 are not shown. Though a segmented drain is shown with six fins, a segmented drain can include more or fewer than six fins, which can be dependent on sizes of fins, non-conductive regions, and pillars to which fins and non-conductive regions are integrated. In structure 502, each of fins 505-1, 505-2 . . . 505-5, and 505-6 contact and extend vertically from the transistor channel structure 510 of structure 502. Each of non-conductive regions 507-1 . . . 507-5, and 507-6 contact and extend vertically from the transistor channel structure 510 of structure 502. The segmented drain can also include fanged regions 512-1, 512-2, . . . 512-6, though only fanged regions 512-1, 512-2, 515-5, and 512-6 are shown. Fanged regions 512-1, 512-2, . . . 512-6 extend from fins 505-1, 505-2 . . . 505-5, and 505-6 into the transistor channel structure 510 of structure 502. Structure 502 can be implemented similar or identical to structure 402 of FIG. 4.

Fins 505-1, 505-2 . . . 505-5, and 505-6 can extend from transistor channel structure 510 to a drain contact 520 for the transistor. Drain contact 520 can be coupled to digit line 525 by a conductive line contact 523 that is disposed on and contacts drain contact 520. Drain contact 520 can be a metal contact. The metal contact can include, but is not limited to, tungsten, titanium nitride, titanium, titanium silicide, a combination of two or more of tungsten, titanium nitride, titanium, titanium silicide, or other appropriate metal. Conductive line contact 523 can include, but is not limited to, tungsten, titanium nitride, titanium, titanium silicide, a combination of two or more of tungsten, titanium nitride, titanium, titanium silicide, or other appropriate metal. Drain contact 520 can include a titanium silicide contacting fins 505-1, 505-2 . . . 505-5, and 505-6 of the segmented drain. Conductive line contact 523 can act as an additional drain contact coupled to fins of structure 502, where conductive line contact 523 can have a width equal to or less than a width of digit line 525. Fins 505-1, 505-2 . . . 505-5, and 505-6, the fanged regions 512-1, 512-2, . . . 512-5, and 512-6, conductive line contact 523, and drain contact 520 can be heavily doped relative to doping of transistor channel structure 510. Transistor channel structure 510 can be doped n− and these other doped regions can be doped n+.

FIGS. 6-50 illustrate an example method of forming a memory device having an array of strings of memory cells with each string formed as a vertical pillar coupled to a SGD transistor for the string. A SGD transistor with segmented fins and fangs is formed with a thin low-capacitance drain contact built in situ with building of the segmented module. For the procedures discussed herein, the selection of processing materials can depend on the materials selected to form various components of and contacts to devices of the memory array. The processing materials can be selected to allow removal of one or more materials, while retaining one or more other materials. In addition, deposition techniques can be used that are typical for the material being formed, the dimensions of the material being formed, and the architecture in which the material is being formed.

FIGS. 6-50 illustrate an embodiment of an example method of forming a memory device having a memory array of strings of memory cells with each string formed as a vertical pillar coupled to a SGD transistor for the string. Features associated with stages of forming the SGD transistors coupled to the strings of memory cells are shown in these figures. The features are not to scale to focus on the architecture being provided. In these figures, a SGD transistor with a segmented drain having fins with fangs extending down from the fins is formed with a drain contact to the segmented drain built in situ with building the segmented drain. For the procedures discussed herein, the selection of processing materials can depend on the materials selected to form various components of and contacts to components of the memory array. The processing materials can be selected to allow removal of one or more materials, while retaining one or more other materials. Selective etching and conventional masking techniques can be used to remove selected regions in the processing. Etching procedures can include, but are not limited to, wet etching, dry etching, and atomic layer etching deposition, among others. In addition, deposition techniques can be used that are typical for the material being formed, the dimensions of the material being formed, and the architecture in which the material is being formed.

Figure 6:
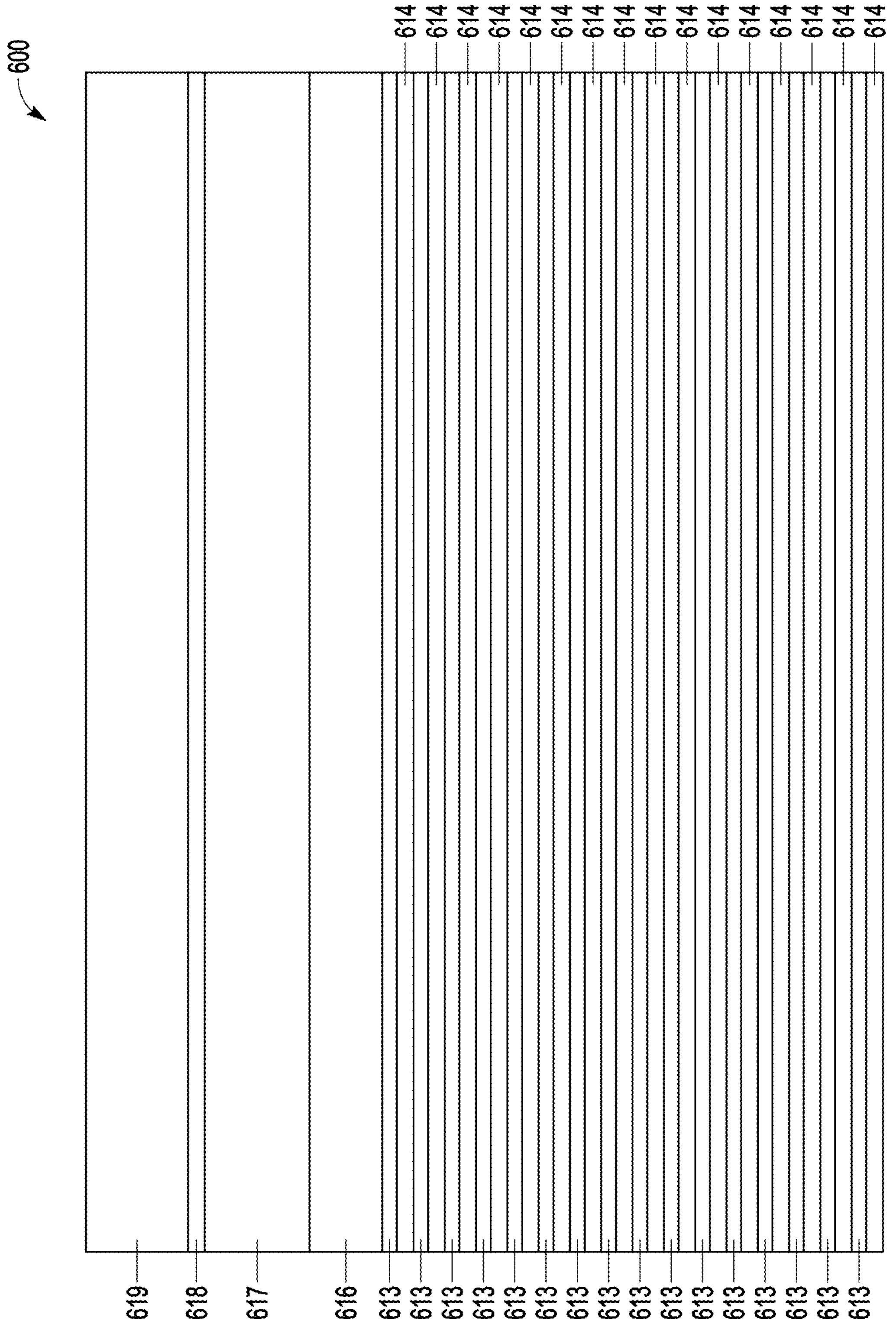
FIGS. 6-50 illustrate features of an example method of forming a memory device having an array of strings of memory cells with each string formed as a vertical pillar coupled to a drain-side select gate transistor for the string, in accordance with various embodiments.

FIG. 6 shows a cross-section of a vertical stack 600 of materials for forming portions of a memory device. Vertical stack 600 can be realized by layers of dielectric material. The layers of dielectric can include alternating layers of two dielectric materials 613 and 614. A dielectric material 616 can be formed on a layer of dielectric material 613. A layer of dielectric material 617 can be formed on the layer of dielectric material 616, with a layer of dielectric material 618 on the layer of dielectric material 617. A layer of dielectric material 619 can be formed on the layer of dielectric material 618. The layers of dielectric materials 613 and 614 can be used in forming vertical stacks of memory cells in formation of pillar structures for the memory array of the memory device. The layers of dielectric materials 613 and 614 can be sacrificial regions isolation dielectrics, with the sacrificial regions to be used to form gates of the memory cells in which each isolation dielectric separates adjacent tiers of memory cells. The number of dielectric materials 613 and 614 depends on the number of tiers of memory cells to be formed. The number of memory cells, hence the number of tiers, in a string can range from several to thousands or more. The layers of dielectric materials 616, 617, 618, and 619 can be used for forming SGD transistors integrated with the pillars of memory cells. Dielectric materials 613, 617, and 619 can have the same composition or same type of composition. Dielectric materials 613, 617, and 619 can be dielectric nitrides, for example, these nitrides can be, but are not limited to, a silicon nitride. Dielectric materials 614, 616, and 618 can have the same composition or same type of composition. Dielectric materials 614, 616, and 618 can be dielectric oxides, for example, these oxides can be, but are not limited to, a silicon oxide.

Figure 7:
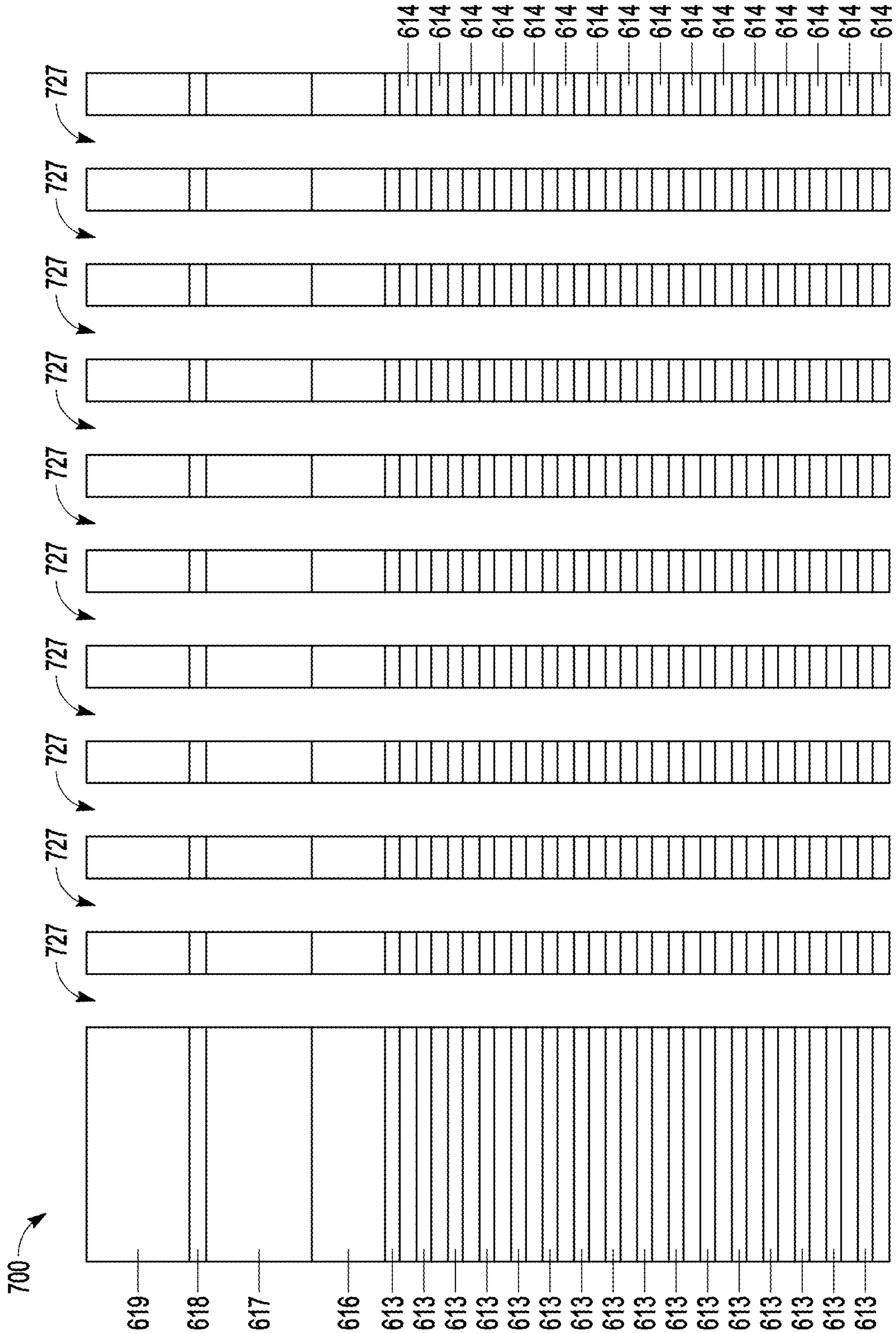

FIG. 7 shows a cross-section of a structure 700 after processing vertical stack 600 of FIG. 6. Openings 727 have been formed in the vertical stack 600. Openings 727 will be processed to provide pillars of memory cells with a SGD transistor integrated with the pillar.

Figure 8:
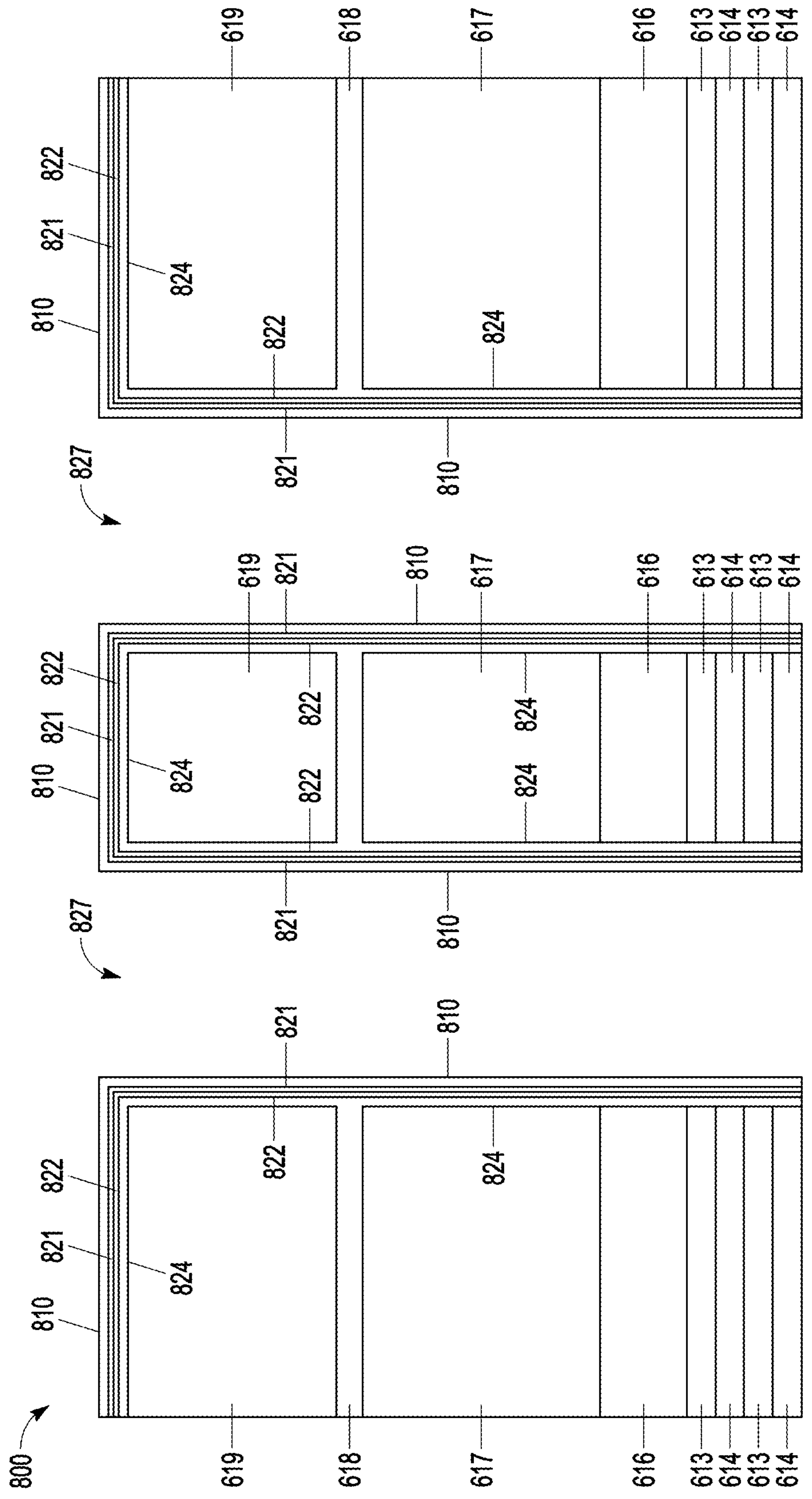

FIG. 8 shows a cross-section of a structure 800 after processing structure 700 of FIG. 7. Cell films including a channel structure have been formed. The formation can use appropriate deposition processes for the materials used. Appropriate deposition techniques can include, for example, chemical vapor deposition (CVD), atomic layer deposition (ALD), variations of CVD and ALD, or other techniques. Each opening 727 of FIG. 7 can be filled in the same manner forming similar or identical structures. Each cell formed in an opening 727 can include elements of a transistor to store charge. For example, each cell can include a channel structure in which current can flow in operation of the memory device, a tunnel region separating the channel structure from a charge trap region used to store charge, and a dielectric blocking region that separates a gate from the charge trap region. The gate can be formed in a later replacement gate procedure in which sacrifical layers are replaced by conductive gate material. Optionally, a dielectric barrier region, structured as a thin region, can be disposed between the dielectric blocking region and the gate that enables an enhanced tunneling barrier that prevents back-tunneling of electrons from the gate through the dielectric blocking region into the charge trap region. The material for the cell films formed in the openings 727 can include a blocking dielectric 824, a charge storage 822, a tunnel region 821, and a channel structure 810, reducing openings 727 to openings 827.

Blocking dielectric 824 can be formed on the surface of the openings 727 of FIG. 7 as shown in FIG. 8 or on dielectric barrier material after forming such dielectric barrier material on the surface of the openings 727 of FIG. 7. Blocking dielectric 824 can be a silicon oxide, a high-K dielectric, or a combination of silicon oxide or one or more high-k dielectric materials, where k is a dielectric constant. A high-K dielectric is a dielectric with a dielectric constant greater than the dielectric constant of silicon dioxide. When a dielectric barrier material is used, material of the blocking dielectric 824 that interfaces with the dielectric barrier material is selected to be different from material of the dielectric barrier material at the interface.

In an optional architecture in which a dielectric barrier is used, though not shown in FIG. 8, the dielectric barrier material can be deposited on surfaces for the opening 727 of FIG. 7. The dielectric barrier material can be realized as an aluminum oxide region or a dielectric region having a higher dielectric constant than aluminum oxide. For example, the dielectric barrier material can include one or more of aluminum oxide, hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-κ dielectrics can be used in the dielectric barrier material. The dielectric barrier material can be formed in a region as a nanolaminate of a number of different compounds in each sub-region of the region in which the nanolaminate is formed, with the formed region having a total thickness in the nanometer region. The term "nanolaminate" means a composite film of ultra thin layers of two or more materials in a layered stack, which can be layered in the horizontal direction for a vertical nanolaminate. Typically, each layer in a nanolaminate has a thickness of an order of magnitude in the nanometer range. Further, each individual material layer of the nanolaminate may have a thickness as low as a monolayer of the material or as high as 5 nanometers. The dielectric barrier material can be formed with a thickness from the wall of the openings 727 of FIG. 7 in the range of 10 to 50 angstroms. The transition from one layer of a nanolaminate to another layer of the nanolaminate for the dielectric barrier material provides further disruption to a tendency for an ordered structure in a nanolaminate stack, reducing or eliminating the occurrence of convenient back-tunneling paths.

Charge storage 822 can be formed on blocking dielectric 824 after forming blocking dielectric 824. Charge storage 822 can be structured from material that in operation can hold electrons received from the channel structure of the respective memory cell. For example, charge storage 822 can be a dielectric material that can store charge. The charge storage 822 can be a dielectric nitride region such as a region including dielectric silicon nitride. Other dielectric materials for charge storage 822 can be used to trap charge. Depending on the memory cell design, materials for operation as a floating-gate structure may be used for the charge storage 822.

Tunnel region 821 can be formed on charge storage 822 after forming charge storage 822. Tunnel region 821 can be constructed as an engineered region to meet a selected criterion, such as, for example but not limited to, an equivalent oxide thickness (EOT). The EOT quantifies the electrical properties of the tunnel region 821, such as capacitance, of a dielectric in terms of a representative physical thickness. For example, EOT can be defined as the thickness of a theoretical $SiO_2$ layer that would be required to have the same capacitance density as a given dielectric (tunnel region 821), ignoring leakage current and reliability considerations. Tunnel region 821 can include an oxynitride. Tunnel region 821 can include an oxide and a nitride. The tunnel region 821 can include a high-κ dielectric. The tunnel region 821 may include a set of dielectric regions. The tunnel region 821 can be a three region structure. Such a three region structure can be arranged as a region of dielectric oxide followed by a region of dielectric nitride followed by another region of dielectric oxide. The tunnel region 821 can be a two region tunnel region structure or a one region tunnel region structure. Further, the tunnel region 821 may have four or more regions, where the selection of material and thicknesses depends on the capability of the material with the given thicknesses to perform as a tunneling region in the trapping of charge.

Channel structure 810 can be formed on tunnel region 821 after forming tunnel region 821. Channel structure 810 can be structured as a pillar of semiconductor material arranged vertically from a source line for the array of strings of memory cells and arranged to couple with a SGD transistor to be formed. The channel structure 810 can be implemented as a polysilicon channel structure. Other semiconductor types and materials can be used for the channel structure 810.

Top surfaces of blocking dielectric 824, charge storage 822, tunnel region 821, and channel structure 810 that extend horizontally are to be removed in later processing, leaving blocking dielectric 824, charge storage 822, tunnel region 821, and channel structure 810 as vertical structures. For ease of presentation, blocking dielectric 824, charge storage 822, tunnel region 821, and channel structure 810 formed in openings 727 of FIG. 7 are shown for the top portion of structure 700 of FIG. 7. These cell films extend through openings 727 of FIG. 7.

Figure 9:
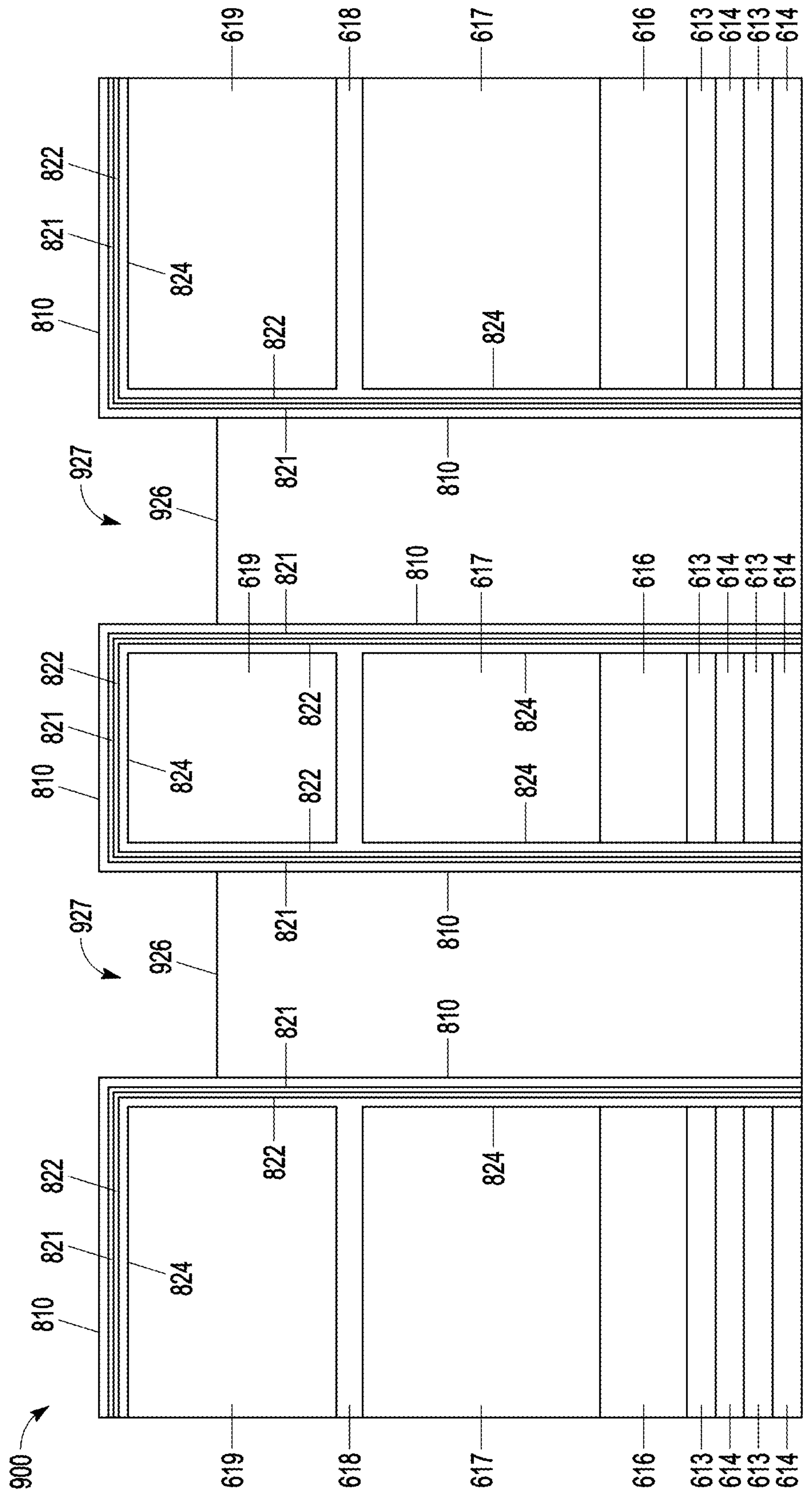

FIG. 9 shows a cross-section of a structure 900 after processing structure 800 of FIG. 8. A dielectric material 926 has been formed in openings 727. Dielectric material 926 can be a deposited oxide. To remove dielectric material 926 that has been deposited on a top surface of channel structure 810, a chemical mechanical planarization (CMP) procedure has been applied to remove dielectric material 926 off the top surface. Following its formation, dielectric material 926 has been recessed, which provides openings 927 for the formation of drains for the SGD transistors being formed.

Figure 10:
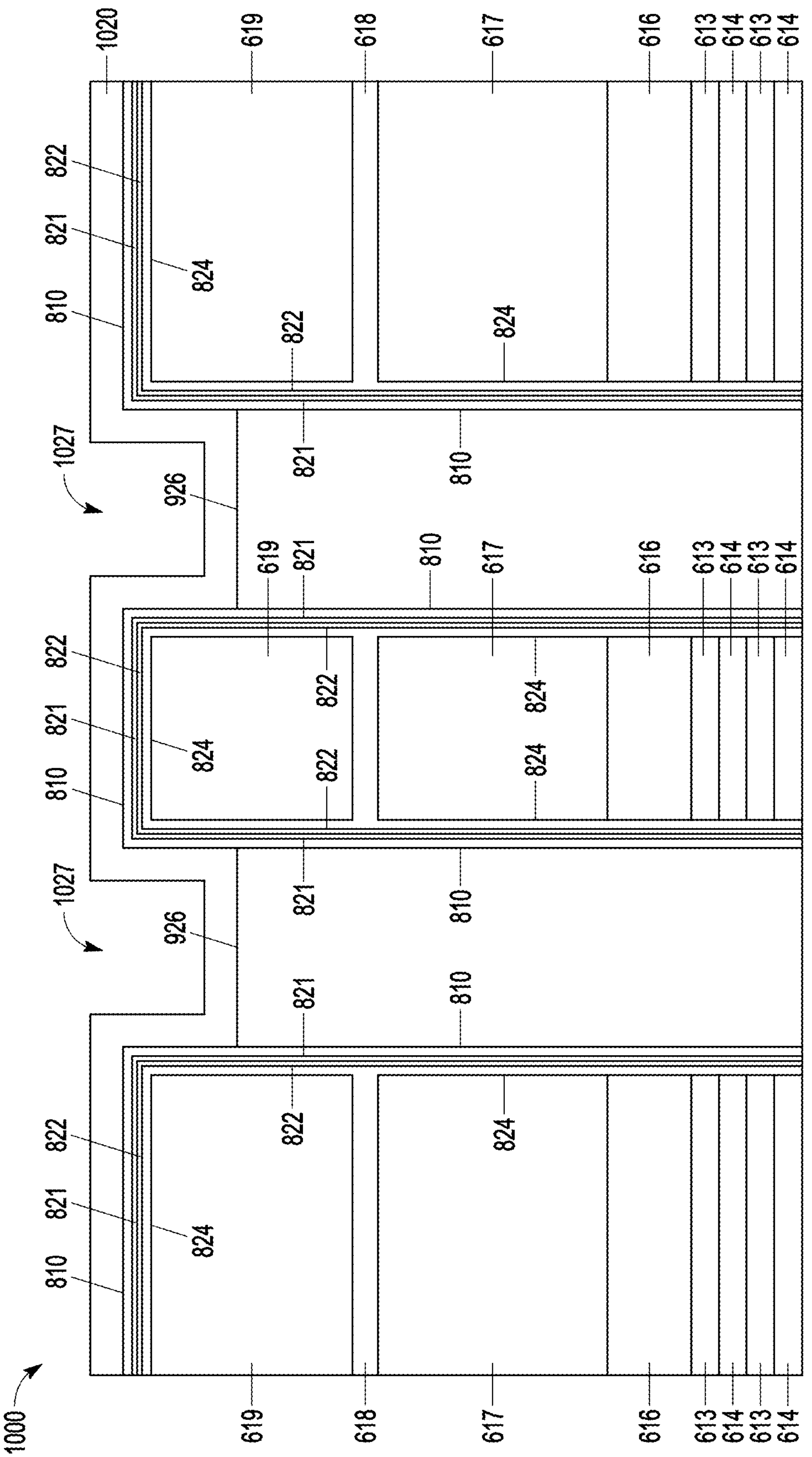

FIG. 10 shows a cross-section of a structure 1000 after processing structure 900 of FIG. 9. A Ti/TiN/W layer 1020 for a drain contact has been deposited on the exposed surfaces of structure 900. Ti of Ti/TiN/W layer 1020 is formed contacting the exposed surfaces with the TiN formed on the Ti and the W formed on the TIN. Opening 927 has been reduced to opening 1027.

Figure 11:
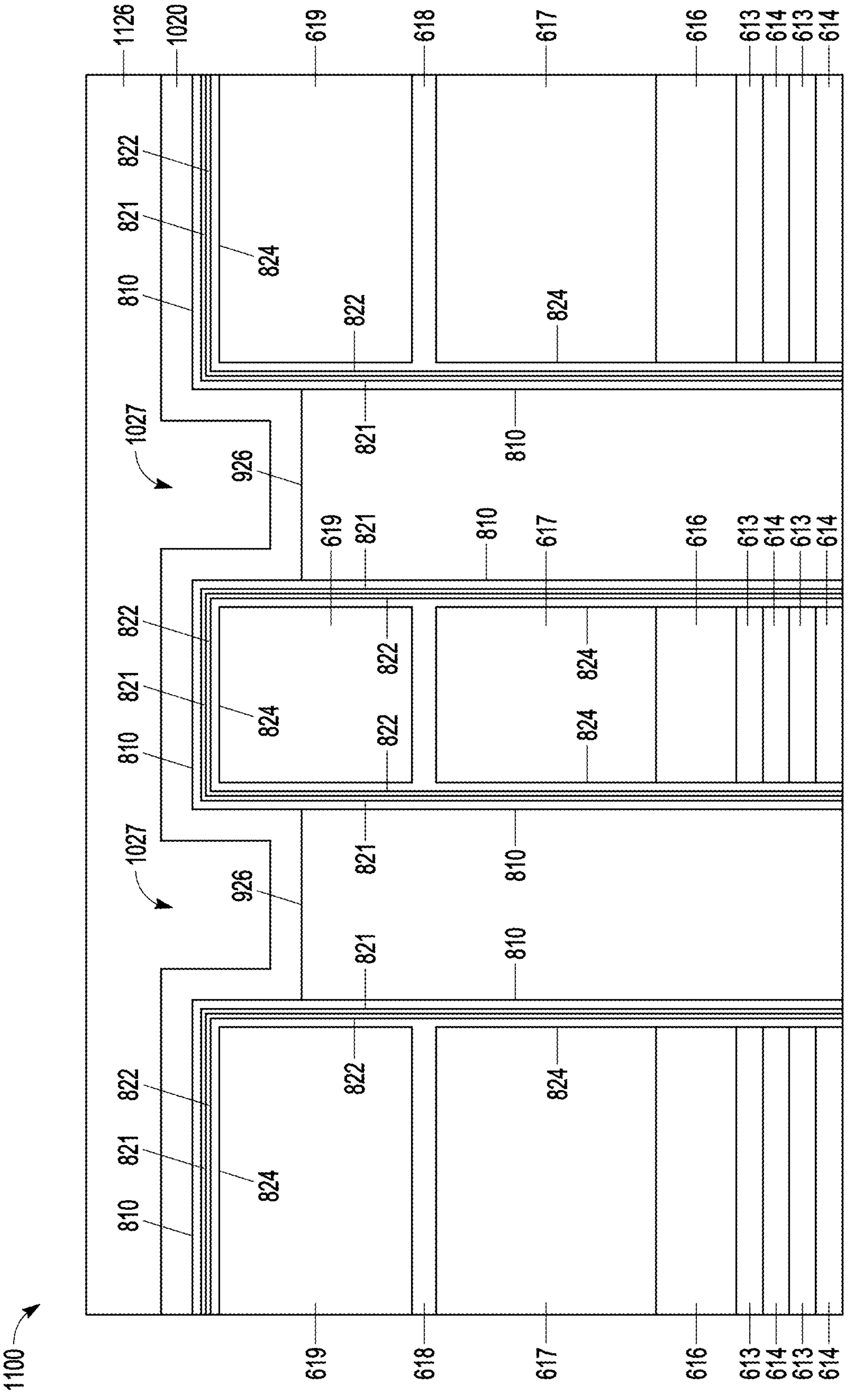

FIG. 11 shows a cross-section of a structure 1100 after processing structure 1000 of FIG. 10. A dielectric layer 1126 has been formed on Ti/TiN/W layer 1020. Formation of dielectric layer 1126 has been conducted filling opening 1027. Dielectric layer 1126 can be a deposited oxide filling the void above the region for the drain contact.

Figure 12:
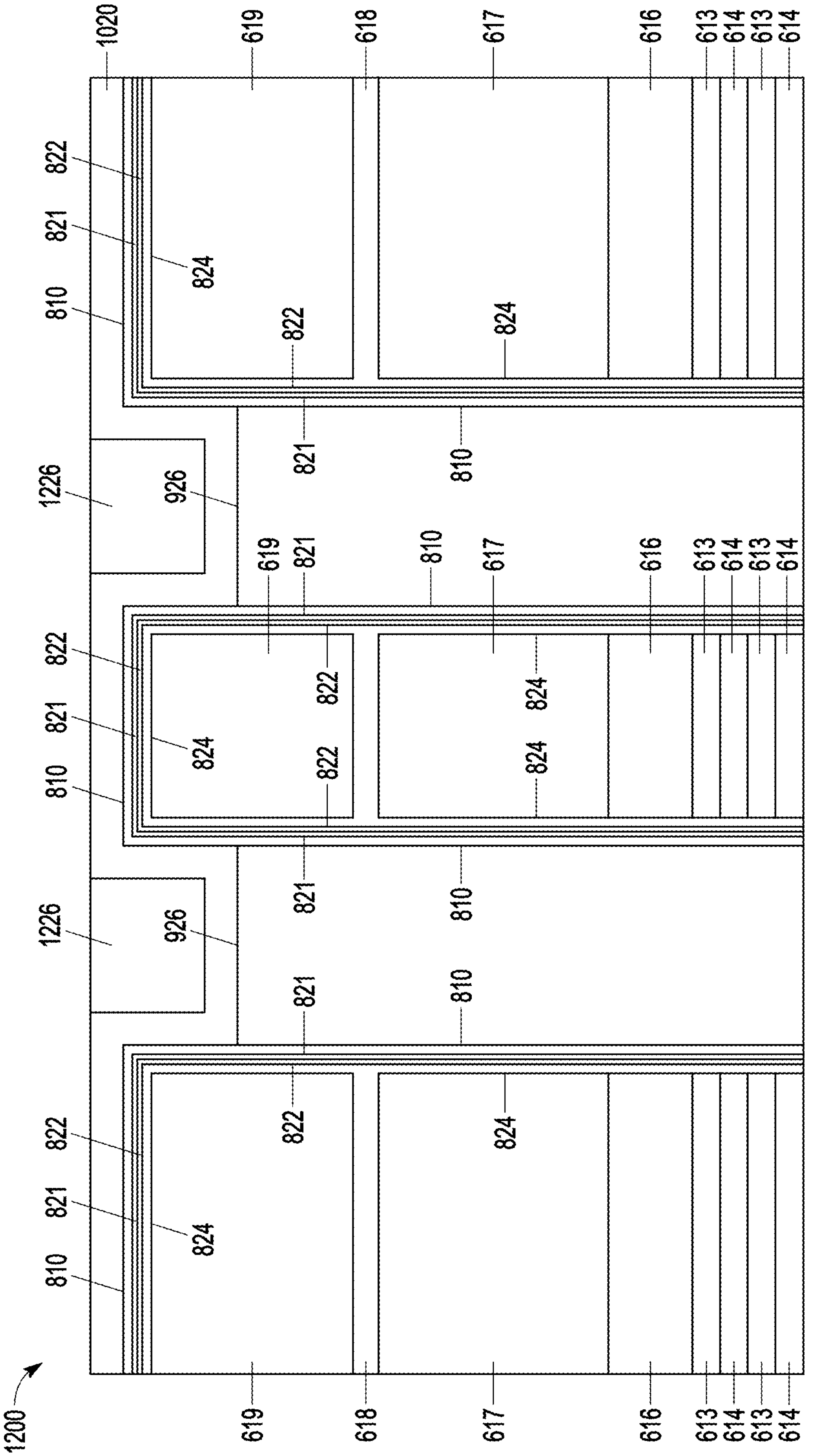

FIG. 12 shows a cross-section of a structure 1200 after processing structure 1100 of FIG. 11. Dielectric layer 1126 has been subjected to a CMP procedure, leaving a portion of dielectric layer 1126 as dielectric layer 1226 above the region for forming the drain contact. The CMP procedure has been stopped on the topmost surface of Ti/TiN/W layer 1020. The topmost surface of Ti/TiN/W layer 1020 can be W.

Figure 13:
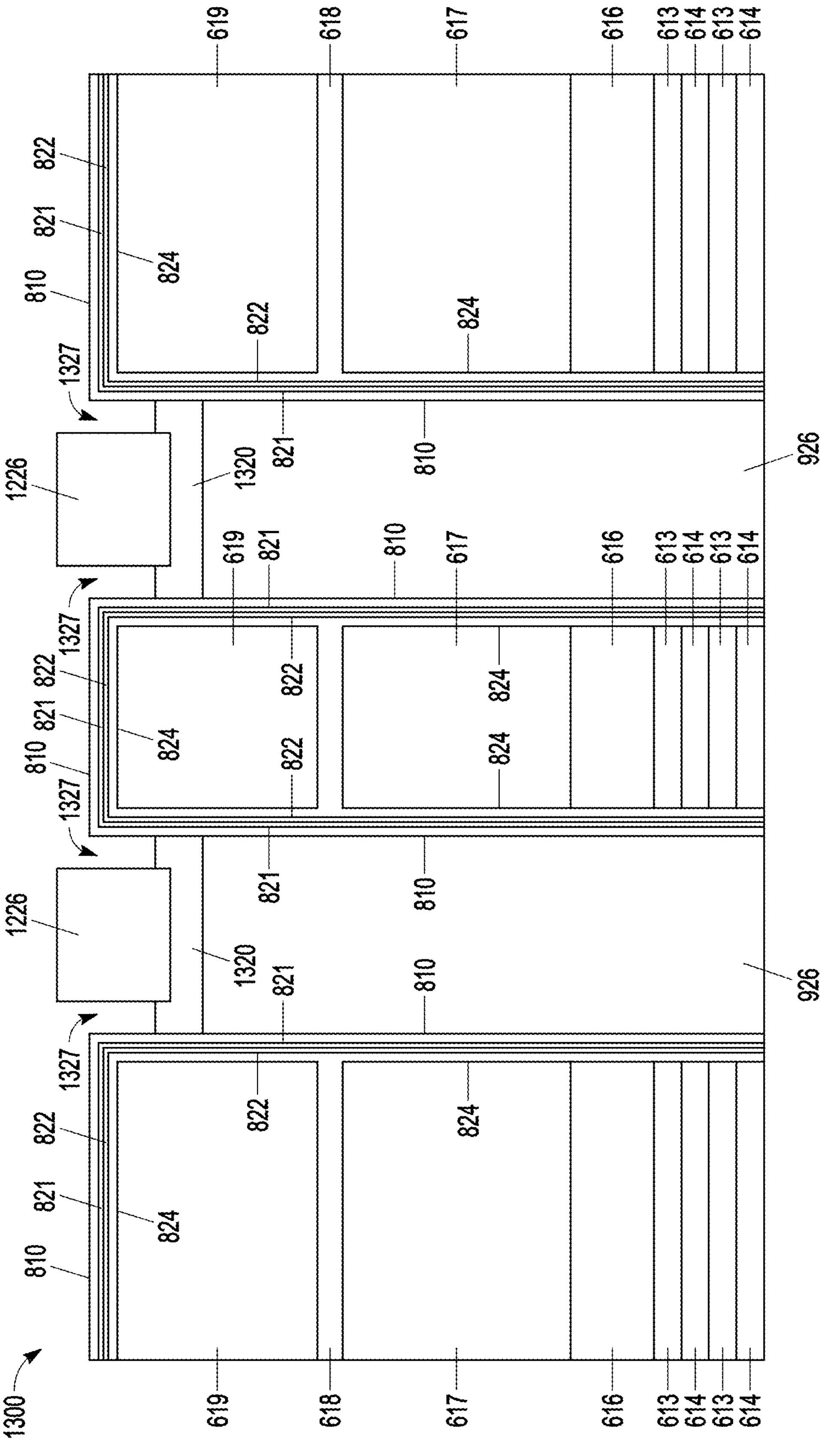

FIG. 13 shows a cross-section of a structure 1300 after processing structure 1200 of FIG. 12. Ti/TiN/W layer 1020 has been removed from the top surface of structure 1200, leaving channel structure 810 exposed. Portions of Ti/TiN/W layer 1020 around dielectric layer 1226 have been removed. The removal can be conducted by a wet etch of Ti/TiN/W layer 1020 to recess back around dielectric layer 1226 leaving portions of Ti/TiN/W layer 1020 to form drain contact 1320 integrated in the pillar of memory cells being formed. The wet etch has left an opening 1327 above drain contact 1320 and around dielectric layer 1226.

Figure 14:
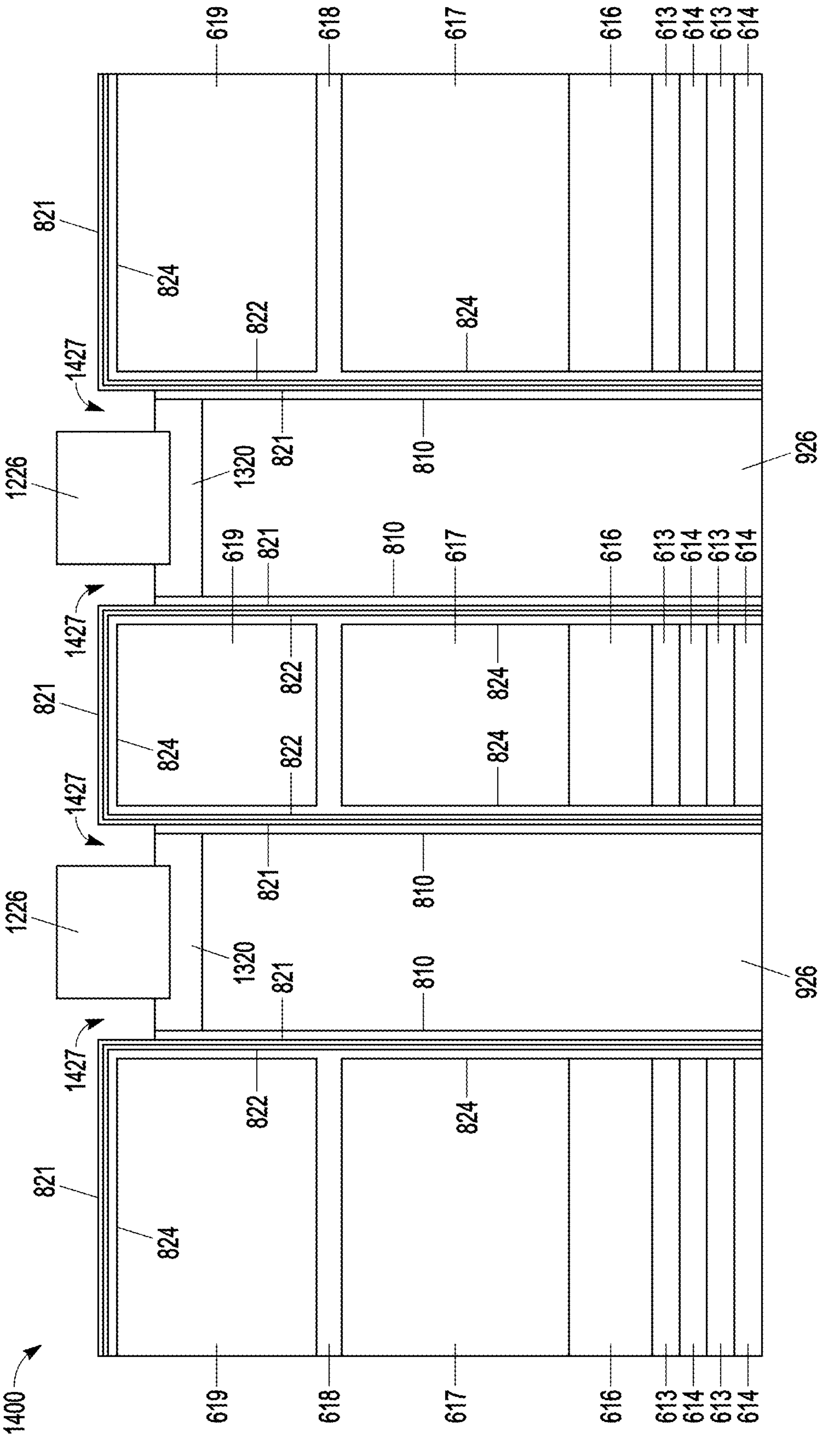

FIG. 14 shows a cross-section of a structure 1400 after processing structure 1300 of FIG. 13. The exposed channel structure 810 of structure 1300 has been removed, exposing tunnel region 821 that is positioned on charge storage 822. The exposed channel structure 810 can be removed by a wet etch or a vapor etch. Openings 1327 have been expanded to openings 1427.

Figure 15:
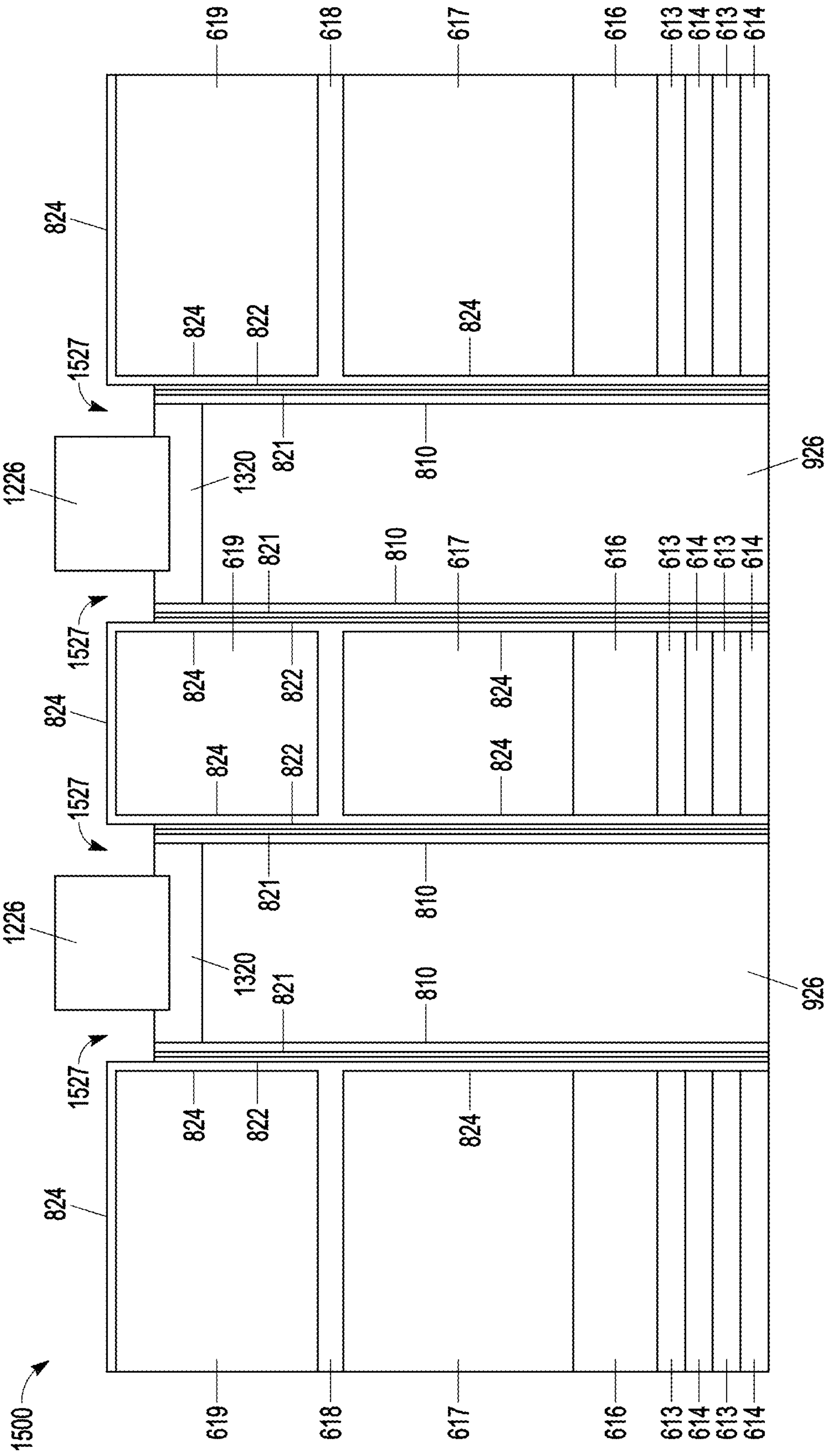

FIG. 15 shows a cross-section of a structure 1500 after processing structure 1400 of FIG. 14. Exposed tunnel region 821 and charge storage 822 have been removed, leaving blocking dielectric 824. Exposed tunnel region 821 and charge storage 822 can be removed by a wet etch or vapor etch. Opening 1427 has been extended to opening 1527.

Figure 16:
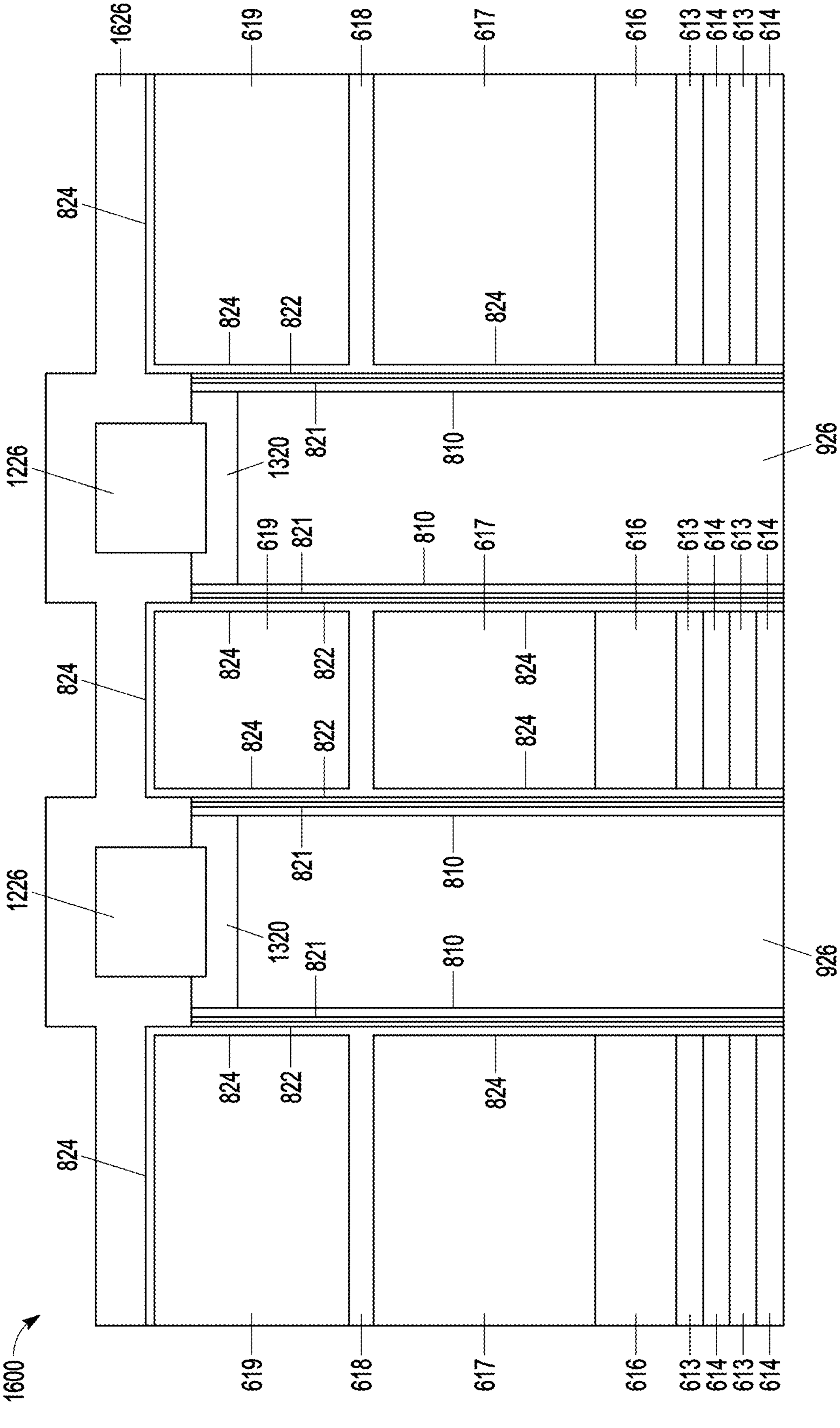

FIG. 16 shows a cross-section of a structure 1600 after processing structure 1500 of FIG. 15. A dielectric 1626 has been formed on the top surface of structure 1500. Dielectric 1626 can be a deposited oxide to fill opening 1527 above drain contact 1320, tunnel region 821 and charge storage 822 in opening 1527.

Figure 17:
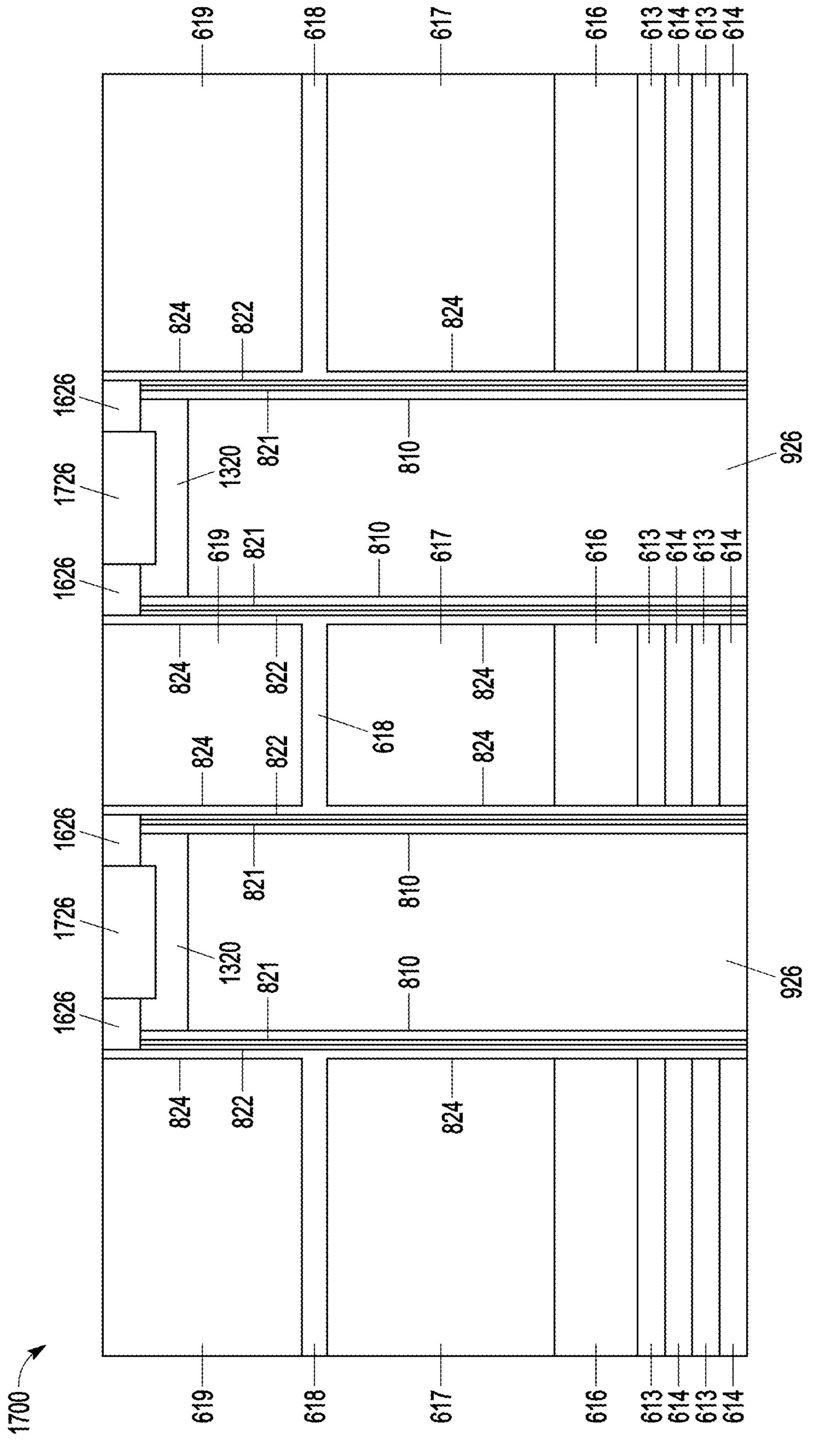

FIG. 17 shows a cross-section of a structure 1700 after processing structure 1600 of FIG. 16. The top surface of structure 1600 has been subjected to a CMP procedure. Dielectric 1626 has been removed with the CMP procedure down to a top surface of dielectric material 619. Dielectric layer 1226 has been reduced to dielectric 1726. Dielectric 1626 remains between blocking dielectric 824 and dielectric 1726. Portions of blocking dielectric 824 horizontal to the pillar have been removed. Blocking dielectric 824, dielectric 1626, and dielectric 1726 have been planarized with the top surface of dielectric material 619.

Figure 18:
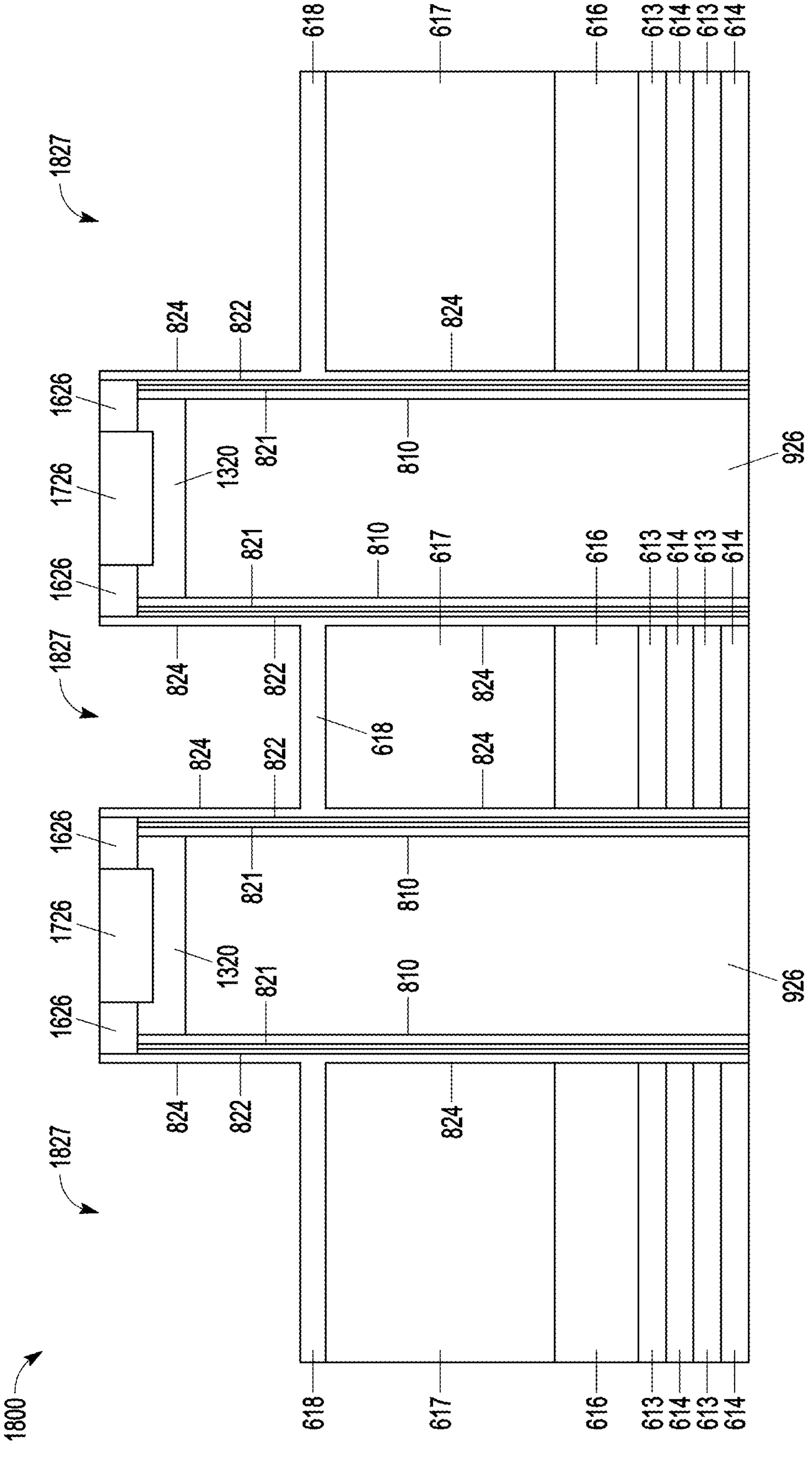

FIG. 18 shows a cross-section of a structure 1800 after processing structure 1700 of FIG. 17. Dielectric material 619 has been removed, exposing dielectric material 618 and blocking dielectric 824 in opening 1827. Dielectric material 619 can be removed by a wet etch.

Figure 19:
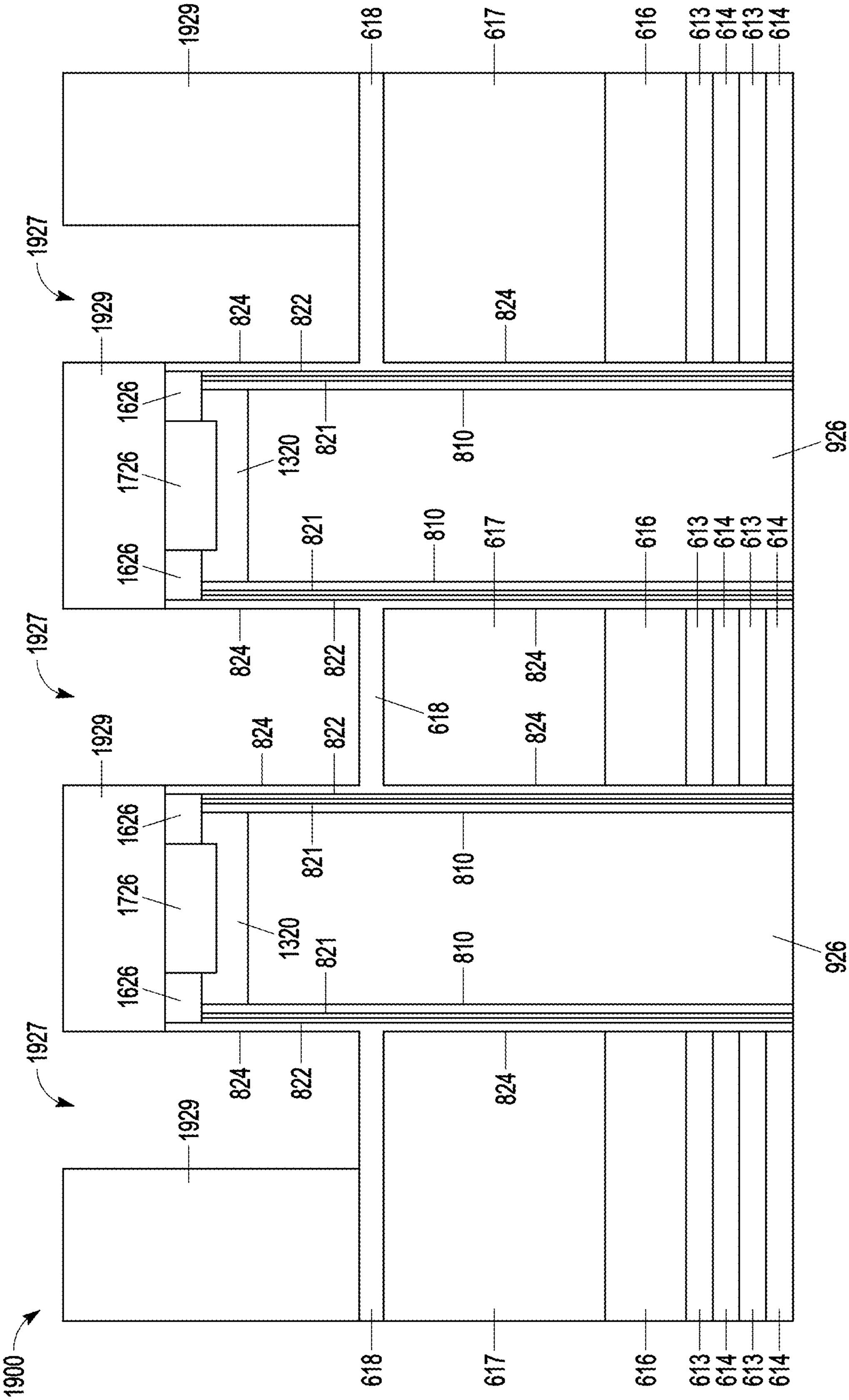

FIG. 19 shows a cross-section of a structure 1900 after processing structure 1800 of FIG. 18. A photoresist 1929 has been formed, which can be deposited by a spin-on process. Photoresist 1929 can include carbon. Photoresist 1929 can be patterned and dry etched to develop a segmentation pattern, as shown by photoresist openings 1927. Photoresist 1929 can be descumed to expose pillar sidewalls at pattern edges.

Figure 20:
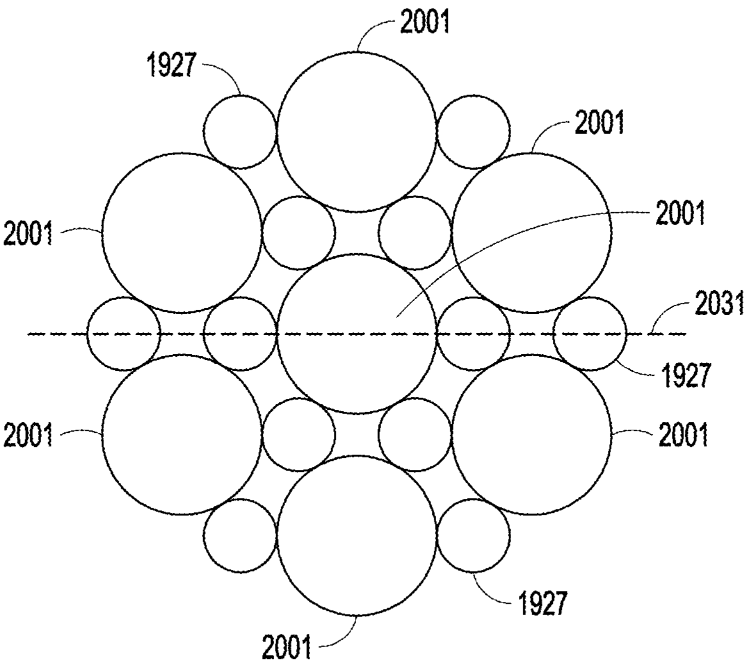

FIG. 20 shows a top view of structure 1900. The top view shows six pillars 2001 around a center pillar 2001. Photoresist openings 1927 are between the pillars 2001. Six photoresist openings are positioned around center pillar 2001. A direction 2031 is shown through the center of center pillar 2001 and centers of photoresist openings 1927. In subsequent processing, non-conductive regions for a segmented drain are formed by processsing in direction 2031. With six photoresist openings around center pillar 2001, a segmented drain having six conductive fins and six non-conductive regions can be formed.

Figure 21:
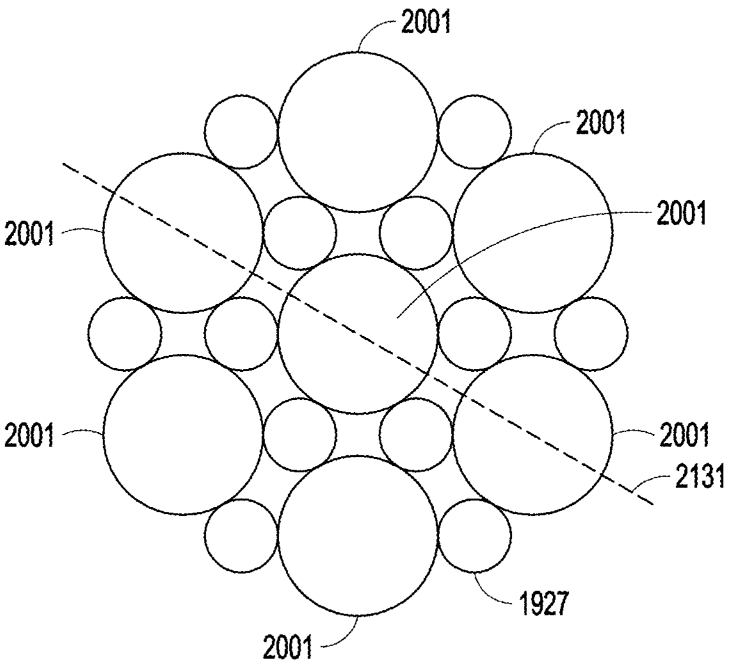

FIG. 21 shows the top view of FIG. 20 with a direction 2131. Direction 2131 is through the center pillar 2001 and through the centers of pillars 2001 adjacent to center pillar 2001. In subsequent processing, conductive regions for fins of the segmented drain are formed by processing in direction 2131.

Figure 22:
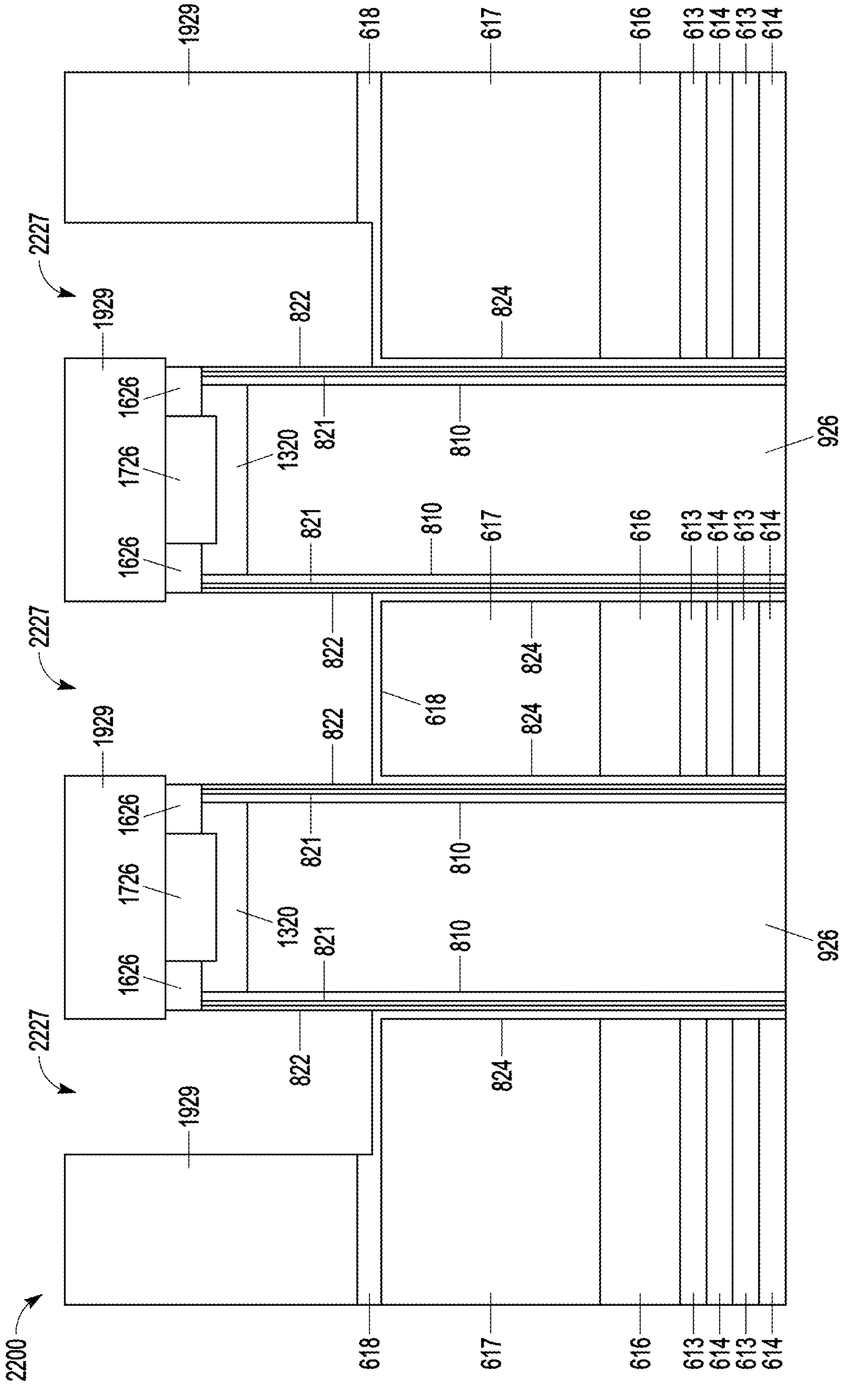

FIG. 22 shows a cross-section of a structure 2200 processed along direction 2031 of FIG. 20 after processing structure 1900 of FIG. 19. Vertical blocking dielectric 824 in opening 1927 has been removed. Opening 1927 has been increased to opening 2227. Charge storage 822 has been exposed in opening 2227. Vertical blocking dielectric 824 of opening 1927 can be removed using a wet etch.

Figure 23:
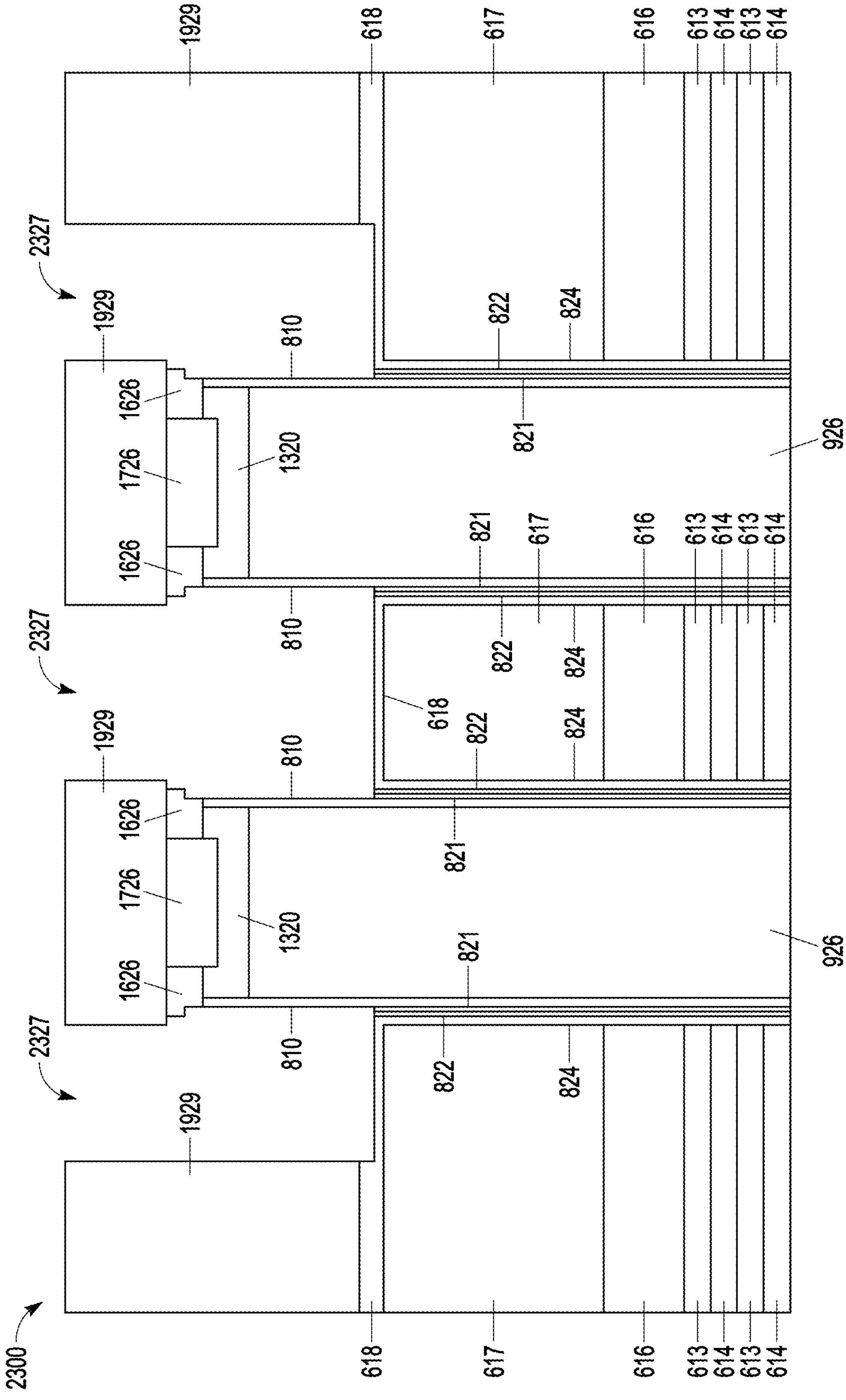

FIG. 23 shows a cross-section of a structure 2300 processed along direction 2031 of FIG. 20 after processing structure 2200 of FIG. 22. Portions of charge storage 822 and tunnel region 821 have been removed. Opening 2227 has been increased to opening 2327. Channel structure 810 has been exposed. Charge storage 822 and tunnel region 821 can be removed using a wet etch.

Figure 24:
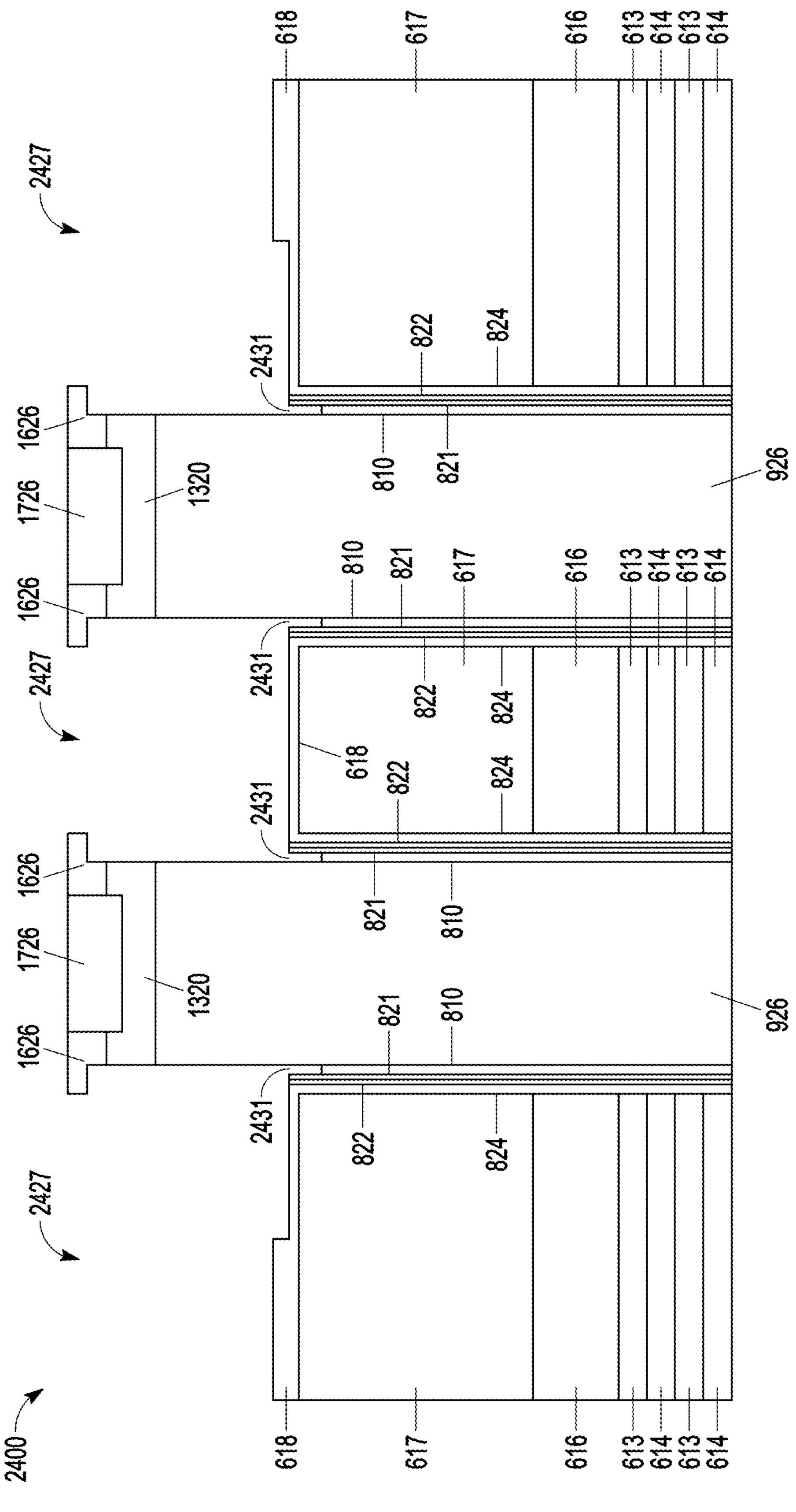

FIG. 24 shows a cross-section of a structure 2400 processed along direction 2031 of FIG. 20 after processing structure 2300 of FIG. 23. Exposed channel structure 810 forming a sidewall of opening 2327 has been removed. Opening 2327 has been increased to opening 2427. Channel structure 810 has been recessed to a level below a top surface of dielectric material 617, creating a recess opening 2431. Recess opening 2431 will be used to create a n+ fang region under a non-conductive portion of a segmented drain. Exposed channel structure 810 can be removed using a wet etch. Photoresist 1929 has been removed.

Figure 25:
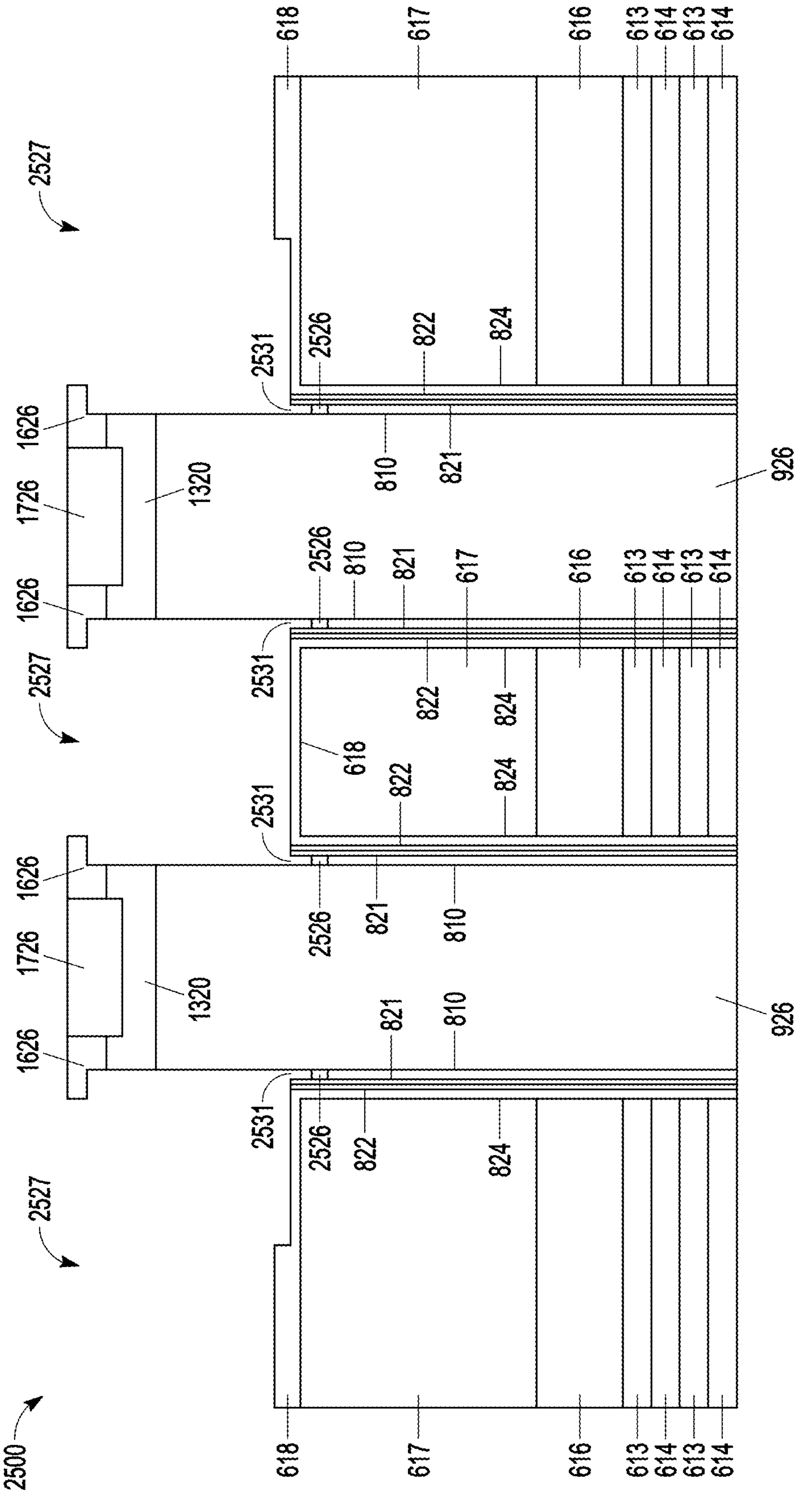

FIG. 25 shows a cross-section of a structure 2500 processed along direction 2031 of FIG. 20 after processing structure 2400 of FIG. 24. A dielectric 2526 has been deposited on structure 2400 of FIG. 24, including in recess opening 2431, reducing recess opening 2431 to opening 2531. Dielectric 2526 can be a deposited thin oxide layer to subsequently create n+ fang region. Dielectric 2526 has removed except for dielectric 2526 oxide left in the n+ fang region, changing opening 2427 to opening 2527. A wet etch can be conducted in the removal of dielectric 2526. The removal of dielectric 2526 can include removing blocking dielectric 824 from regions between etched channel structure 810 on fins for the segmented drain, not shown in this view.

Figure 26:
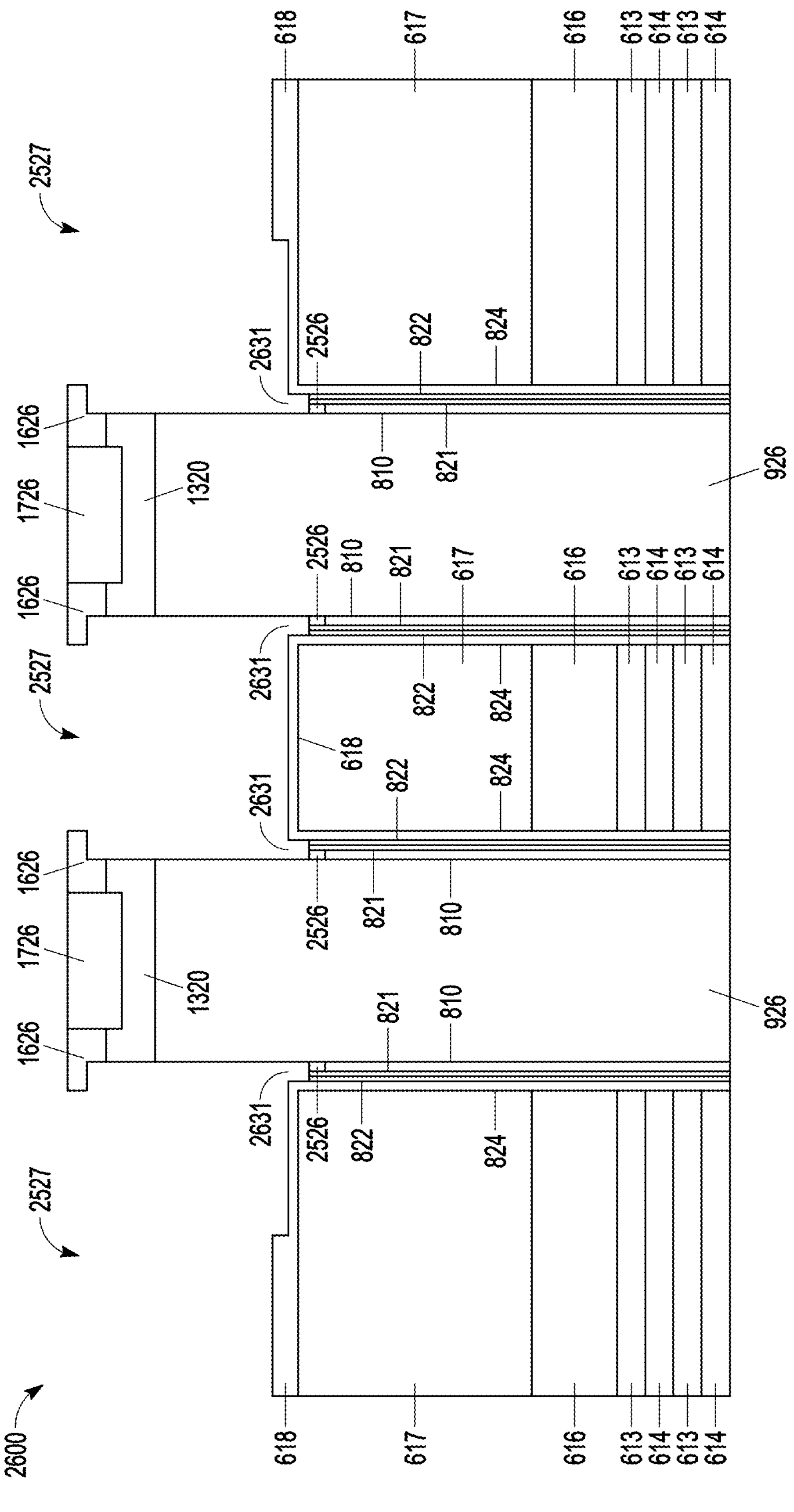

FIG. 26 shows a cross-section of a structure 2600 processed along direction 2031 of FIG. 20 after processing structure 2500 of FIG. 25. Tunnel region 821 and charge storage 822, adjacent opening 2531 of structure 2500, have been removed down to the top level of dielectric 2526. Opening 2531 has been expanded to opening 2631. Tunnel region 821 and charge storage 822 can be removed using a wet etch.

Figure 27:
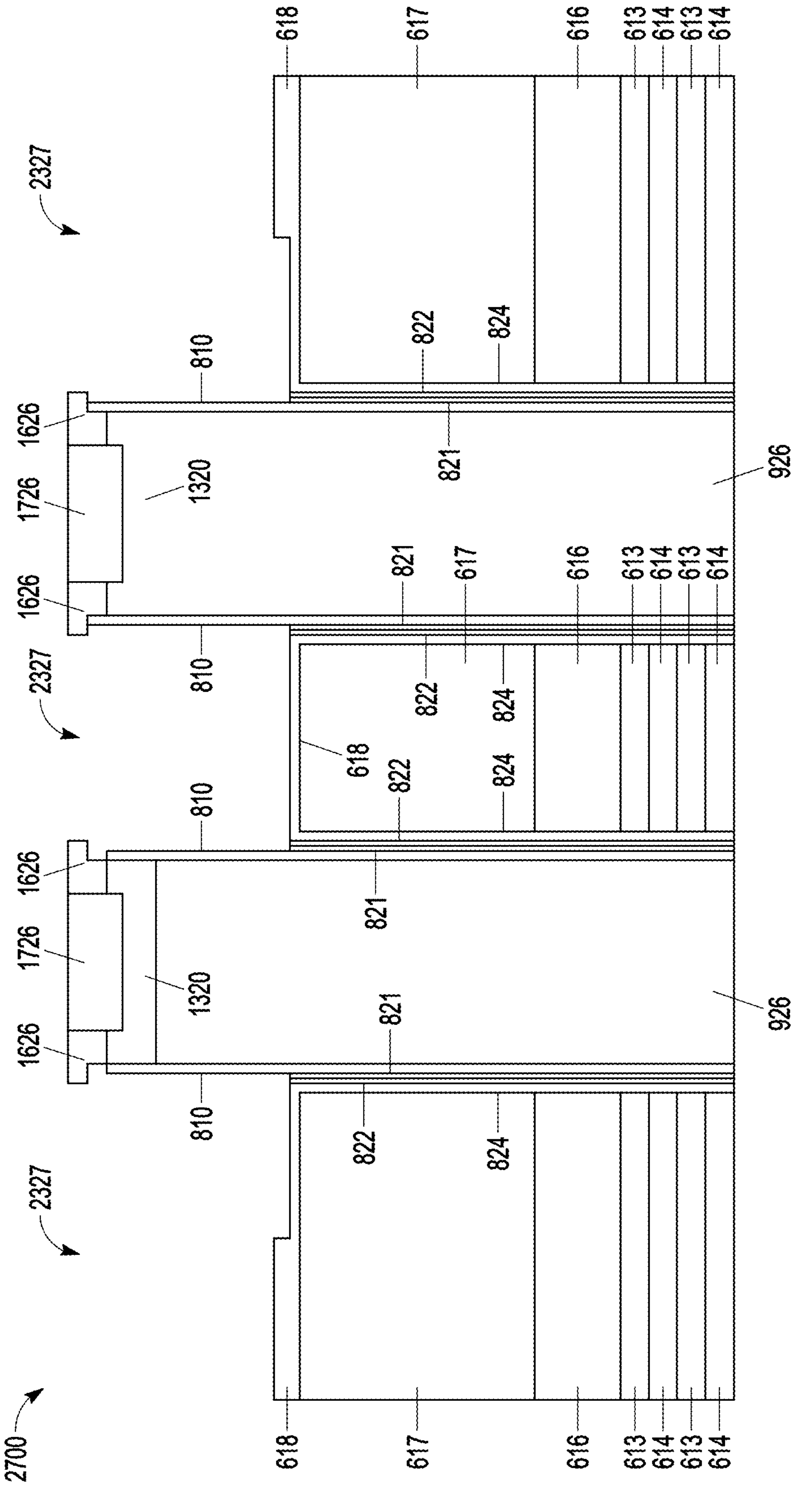

FIG. 27 shows a cross-section of a structure 2700 processed along direction 2131 of FIG. 21 after processing structure 2600 of FIG. 26. This view shows channel structure 810 after tunnel region 821 and charge storage 822 have been removed above dielectric material 618. Tunnel region 821 and charge storage 822 can be removed by a wet etch. This removal of tunnel region 821 and charge storage 822 is performed in preparation of generating conductive fins for a segmented drain.

Figure 28:
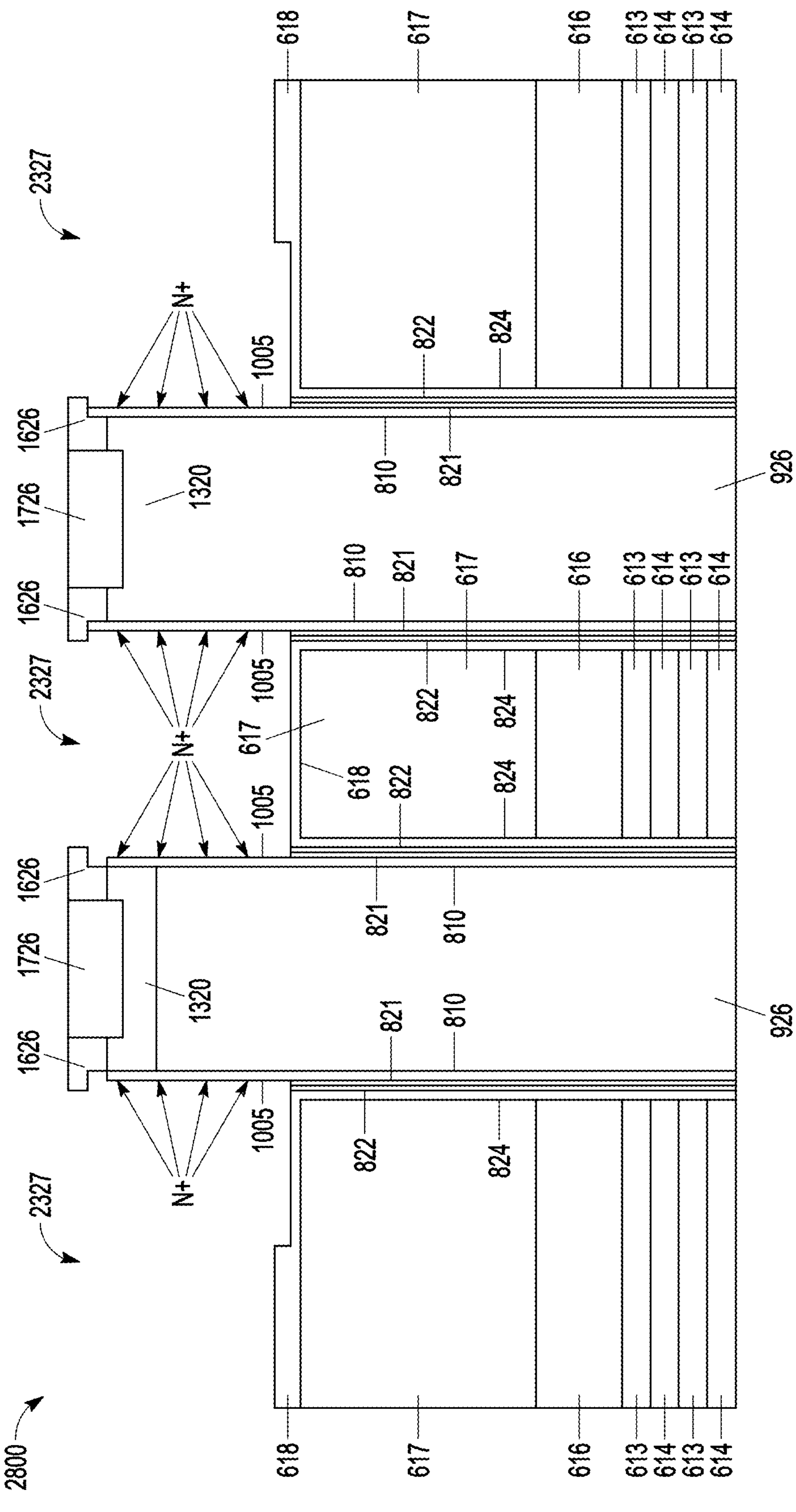

FIG. 28 shows a cross-section of a structure 2800 processed along direction 2131 of FIG. 21 after processing structure 2700 of FIG. 27. Channel structure 810 above dielectric material 618 is converted to a conductive fin 1005 by n+ doping channel structure 810 above dielectric material 618. Since channel structure 810 runs vertically through the pillars as the channel structures of the memory cells being formed in the pillars, n+ fins 1005 of a segmented drain are integrated with the pillar of memory cells.

Figure 29:
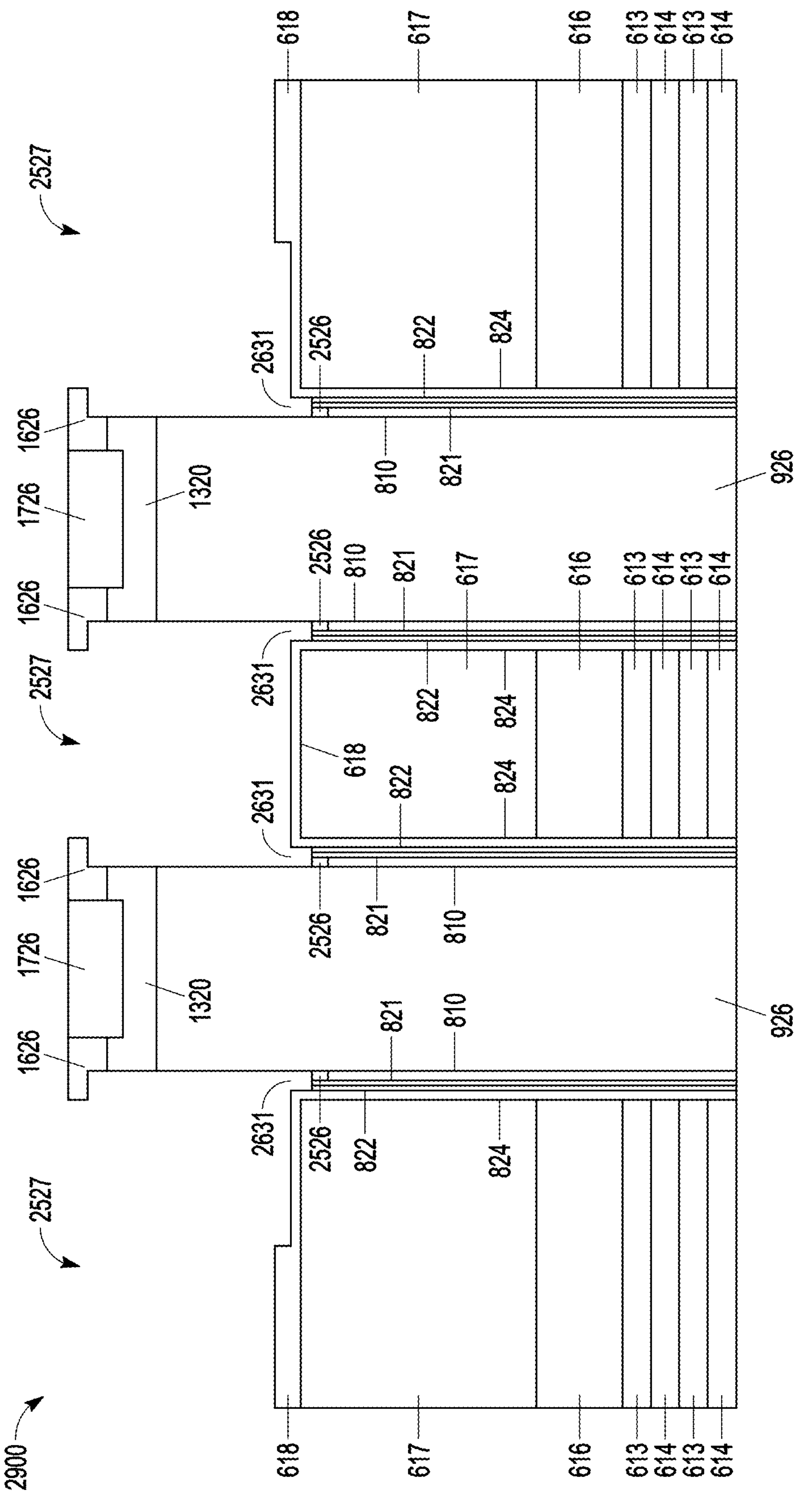

FIG. 29 shows a cross-section of a structure 2900 processed along direction 2031 of FIG. 20 after processing structure 2800 of FIG. 28. Structure 2900 along direction 2031 maintains the architecture of structure 2600 after n+ doping of fins along direction 2131. Dielectric 2526 has prevented channel structure 810 below the top level of dielectric material 617 from being doped during the formation of conductive fin 1005.

Figure 30:
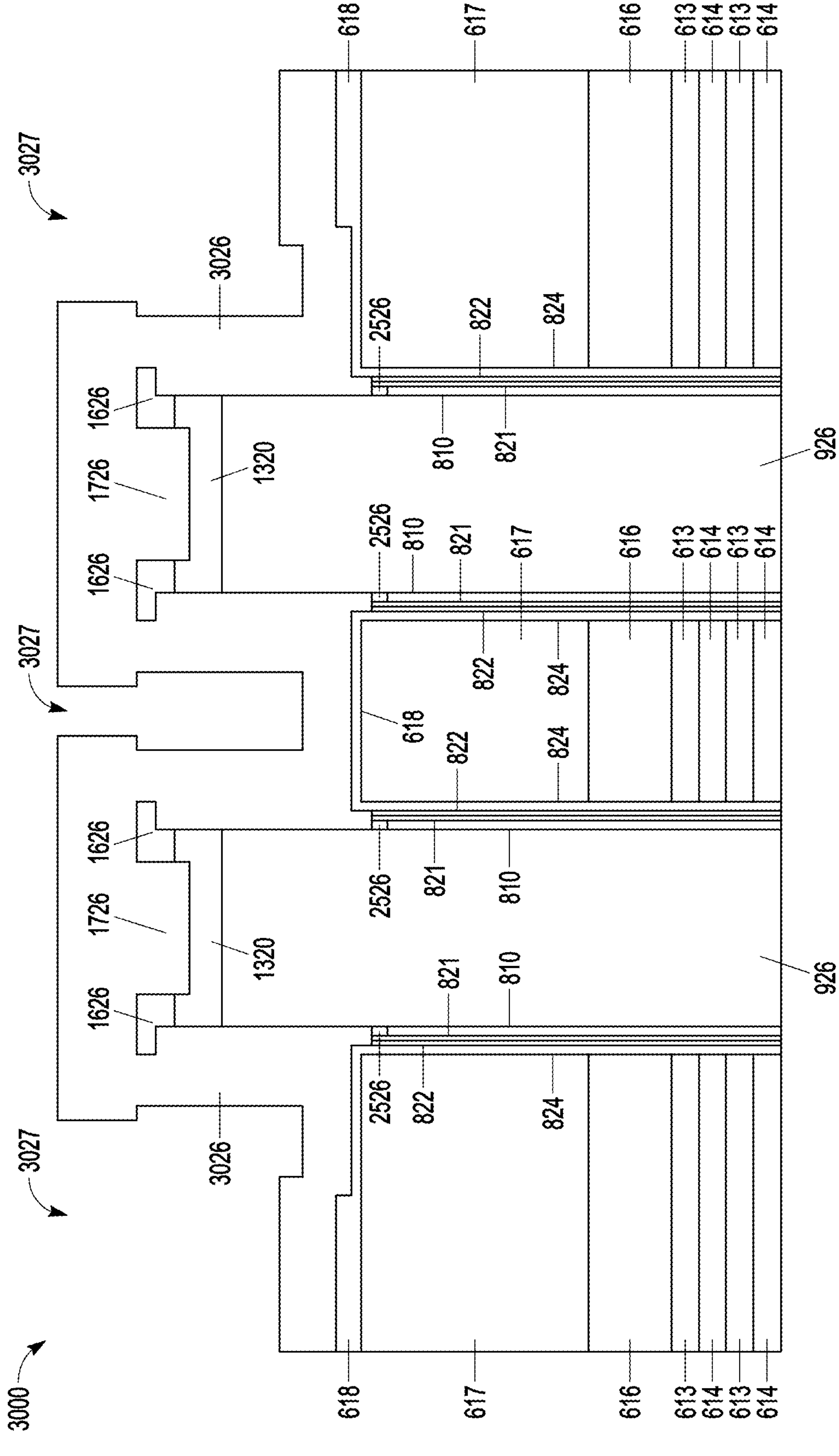

FIG. 30 shows a cross-section of a structure 3000 processed along direction 2031 of FIG. 20 after processing structure 2900 of FIG. 29. Dielectric spacer 3026 has been formed on the top surface of structure 2900. Openings 2527 have been reduced to openings 3027. Dielectric spacer 3026 can be a deposited oxide spacer. Dielectric spacer 3026 covers dielectrics 1626 and dielectric 1726. Dielectric spacer 3026 can provide protection to conductive fin 1005 during further processing.

Figure 31:
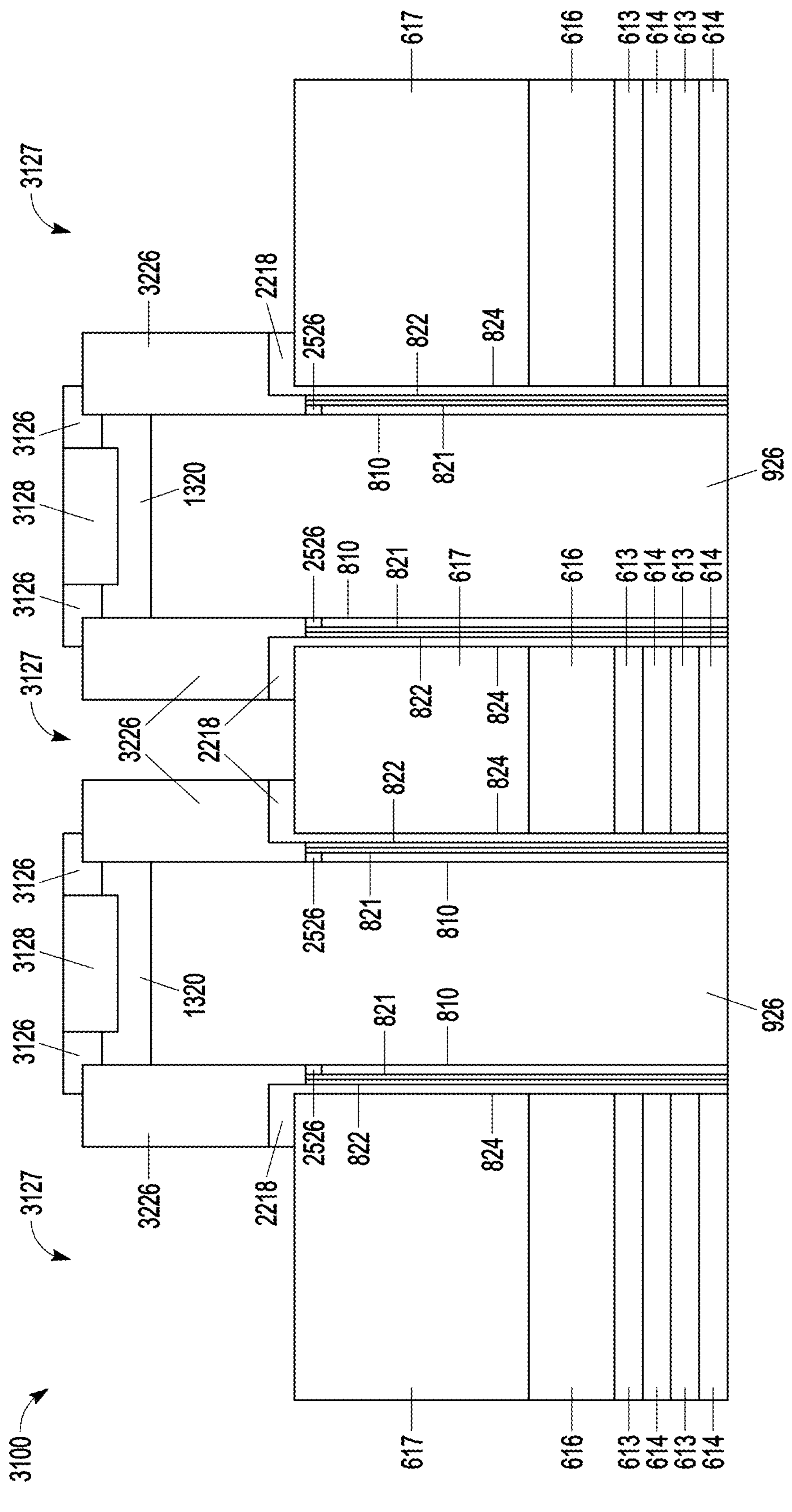

FIG. 31 shows a cross-section of a structure 3100 processed along direction 2031 of FIG. 20 after processing structure 3000 of FIG. 30. Dielectric spacer 3026 has been subjected to a spacer etch. The spacer etch has removed portions of dielectric spacer 3026 leaving dielectric spacer 3226 and has removed portions of dielectric material 618 leaving dielectric 2218. Dielectrics 1626 and dielectric 1726 can be reduced to dielectrics 3126 and dielectric 3128 due to the spacer etch. Openings 3027 have been changed to openings 3127.

Figure 32:
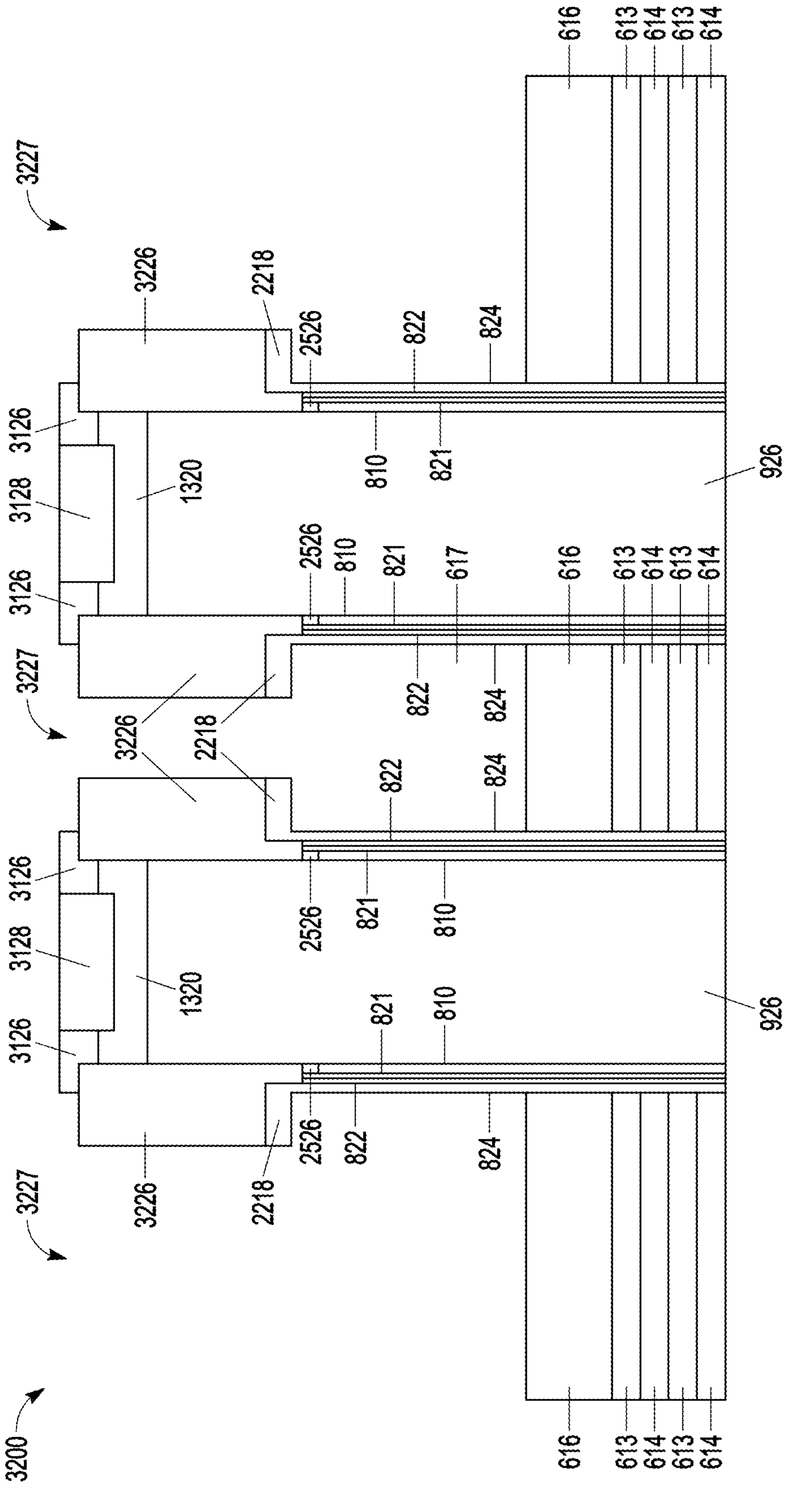

FIG. 32 shows a cross-section of a structure 3200 processed along direction 2031 of FIG. 20 after processing structure 3100 of FIG. 31. Dielectric material 617 has been removed, exposing blocking dielectric 824 above dielectric material 616 and further exposing dielectric 2218. Openings 3127 have been increased to openings 3227. Dielectric material 617 can be removed using a wet etch.

Figure 33:
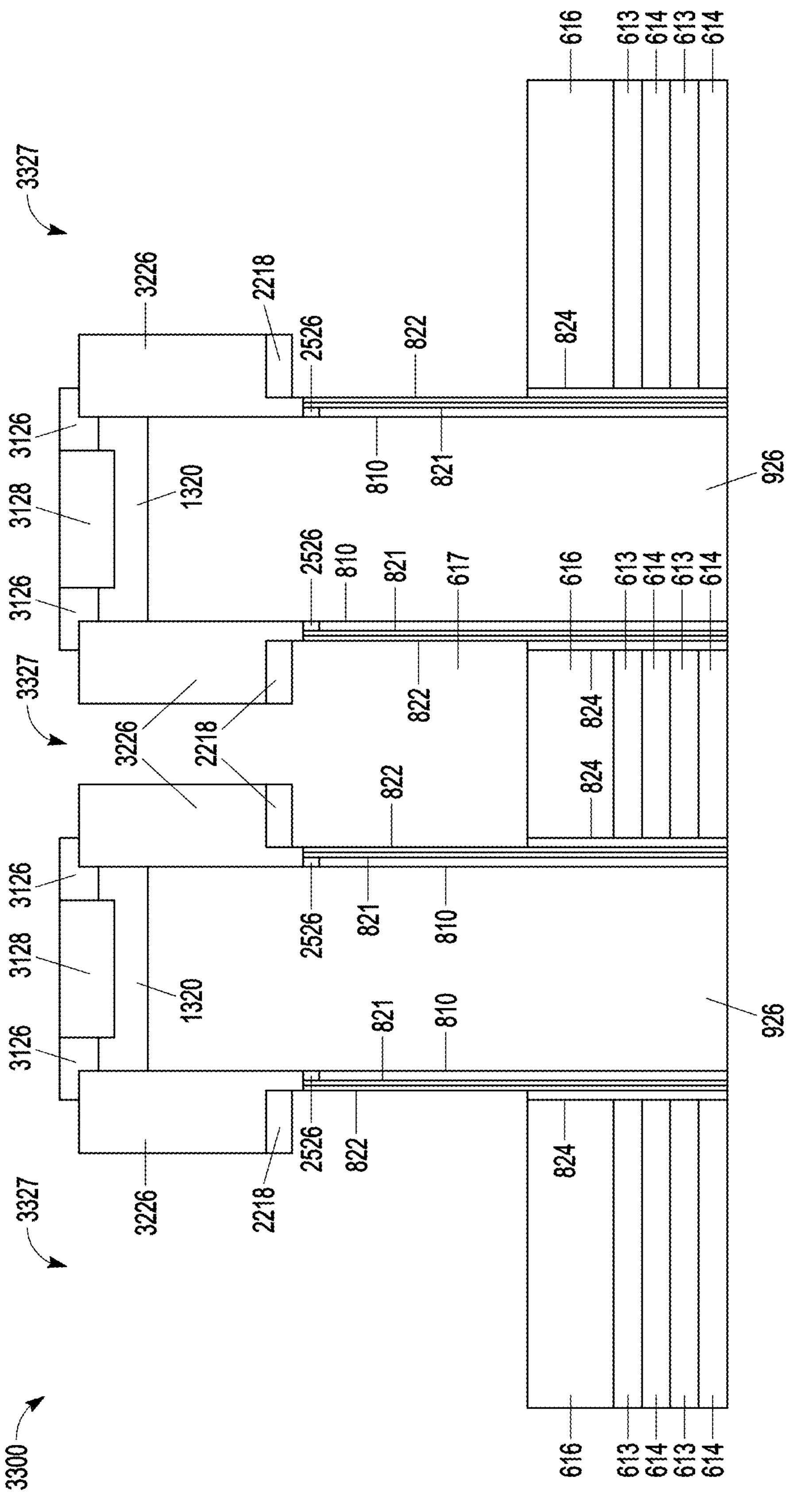

FIG. 33 shows a cross-section of a structure 3300 processed along direction 2031 of FIG. 20 after processing structure 3200 of FIG. 32. Blocking dielectric 824 has been removed and openings 3227 have been increased to openings 3327. Blocking dielectric 824 can be removed using a wet etch. Charge storage 822 has been exposed above dielectric material 616.

Figure 34:
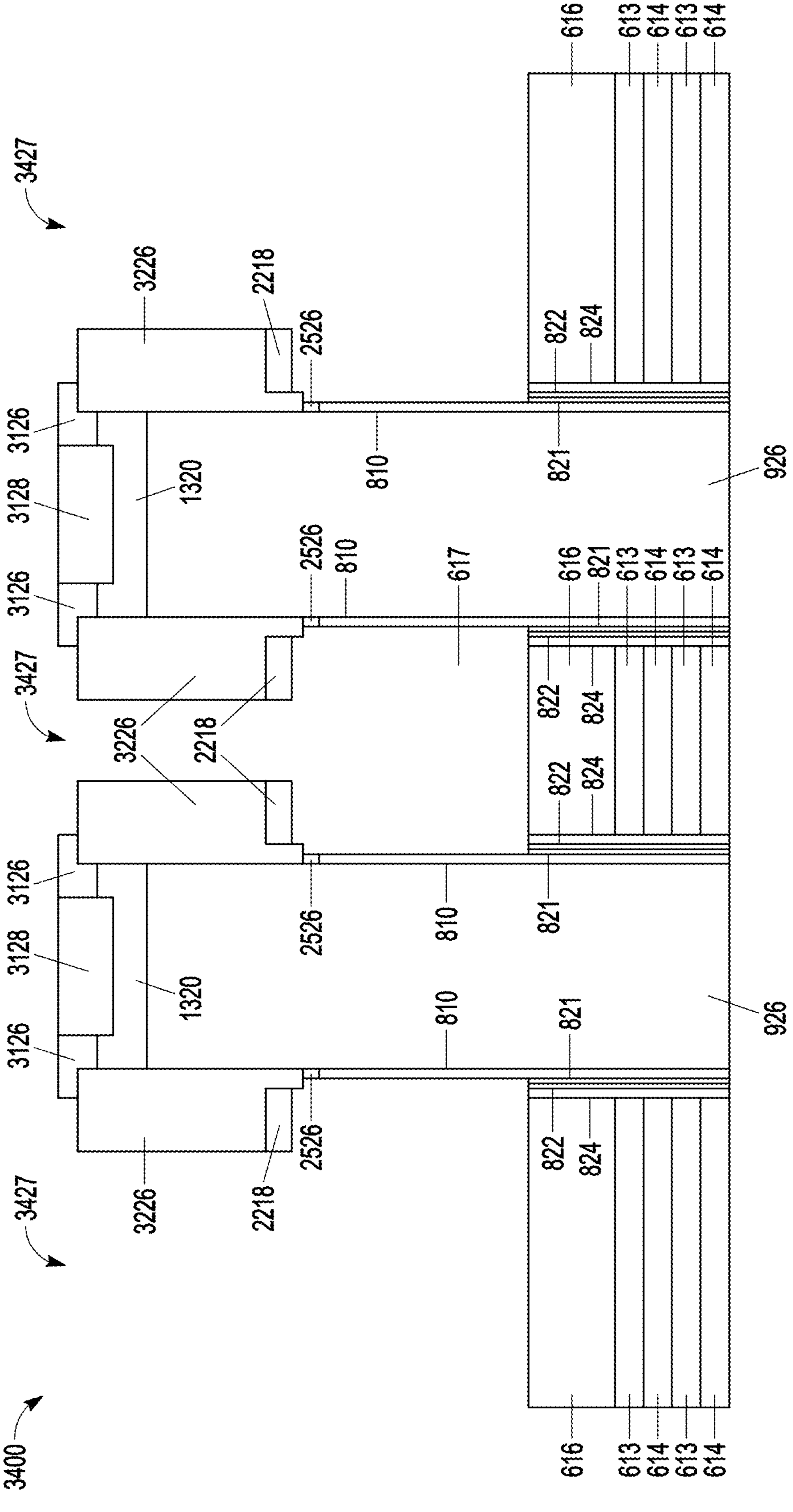

FIG. 34 shows a cross-section of a structure 3400 processed along direction 2031 of FIG. 20 after processing structure 3300 of FIG. 33. Charge storage 822 and tunnel region 821 have been removed and openings 3327 have been increased to openings 3427. Charge storage 822 and tunnel region 821 can be removed using a wet etch. Channel structure 810 has been exposed above dielectric material 616.

Figure 35:
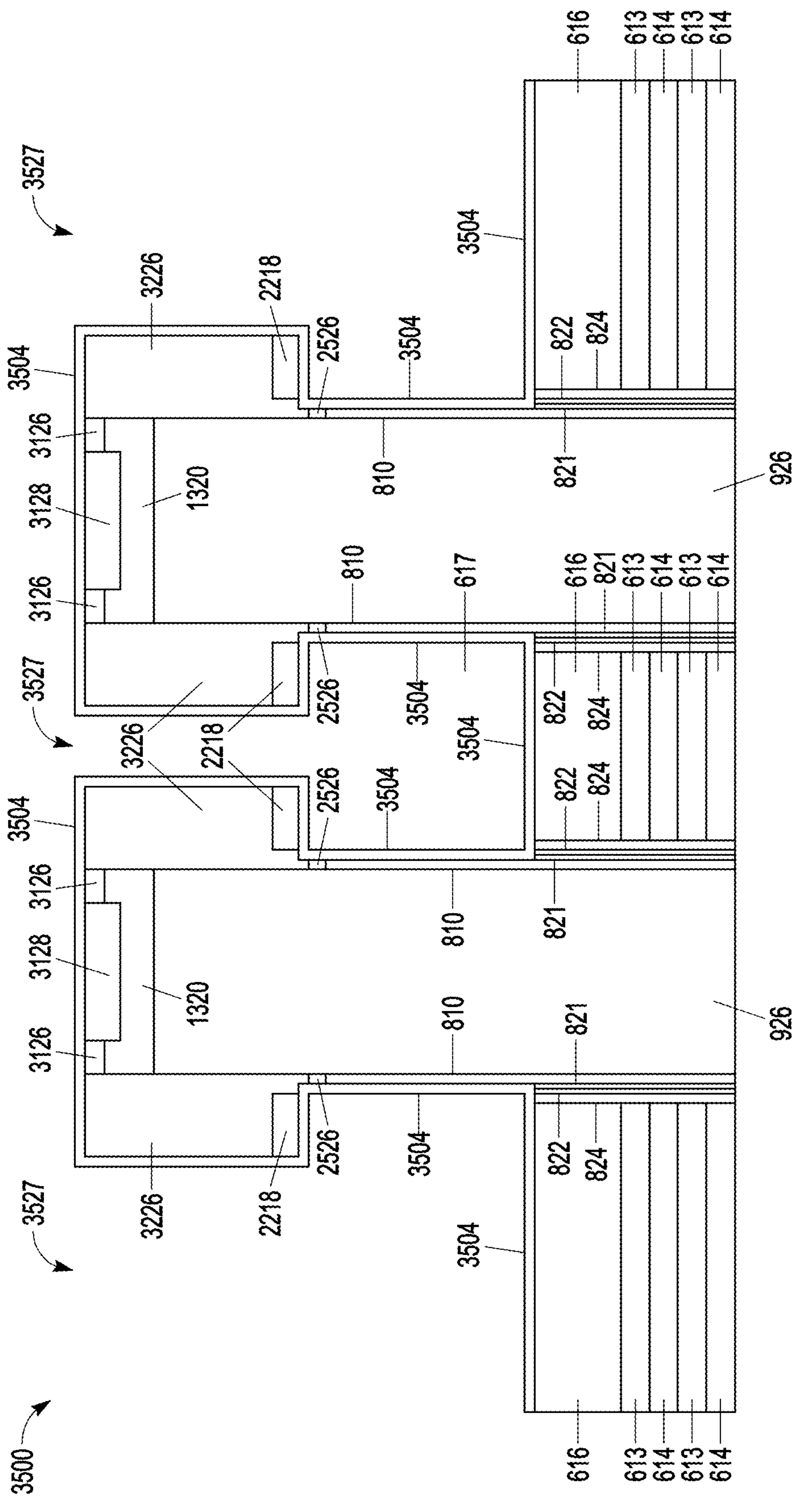

FIG. 35 shows a cross-section of a structure 3500 processed along direction 2031 of FIG. 20 after processing structure 3400 of FIG. 34. A gate dielectric 3504 has been formed on the top surface of structure 3400. Gate dielectric 3504 can be implemented as one or more dielectrics. Gate dielectric 3504 can be a deposited gate oxide. Openings 3427 have been increased to openings 3527.

Figure 36:
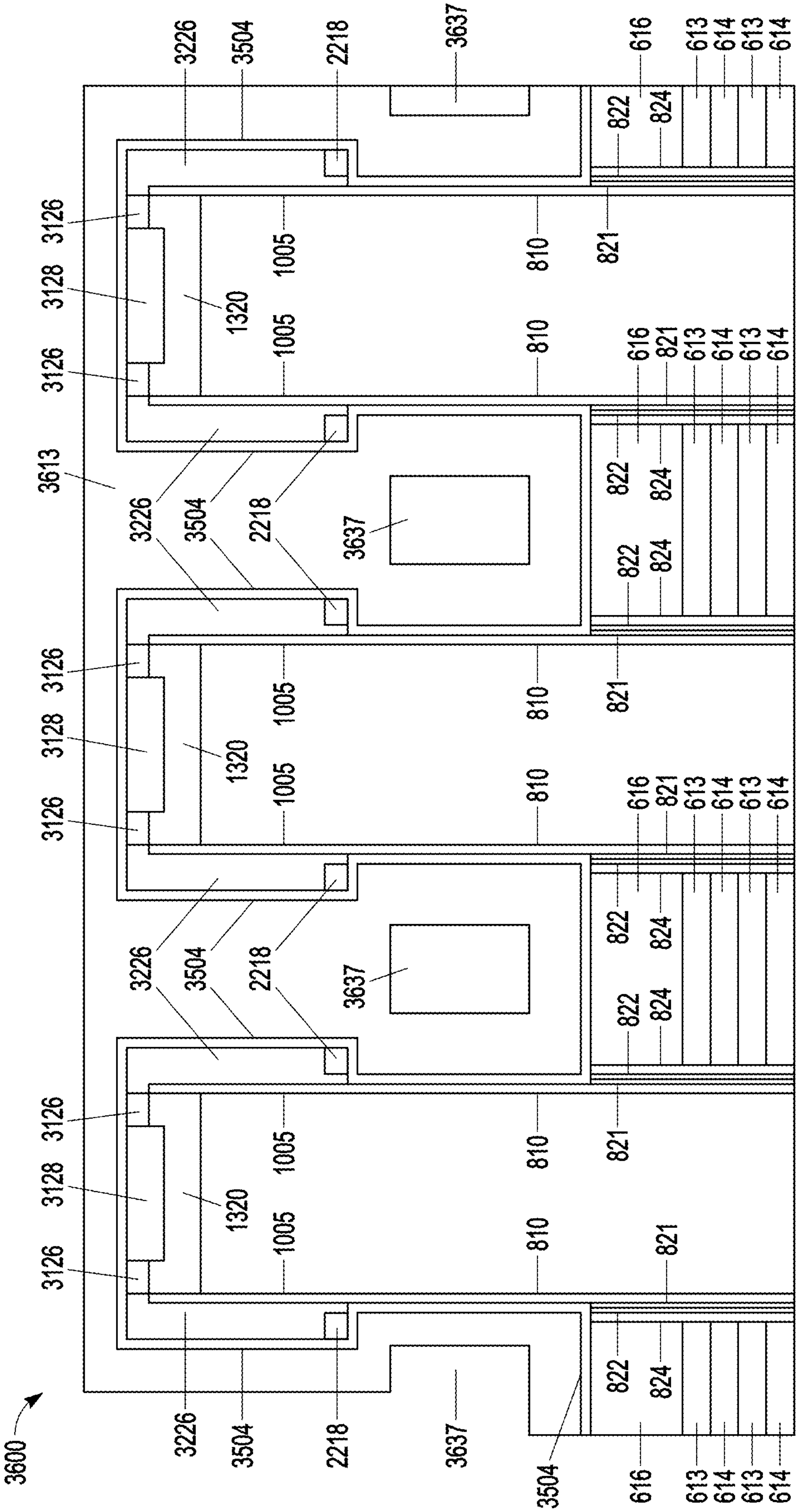

FIG. 36 shows a cross-section of a structure 3600 processed along direction 2131 of FIG. 21 after processing structure 3500 of FIG. 35. A dielectric spacer 3613 has been formed on the surfaces of structure 3500 including at least partially filling openings 3527. Void regions 3637 can be formed as by-products of forming dielectric spacer 3613. Void regions 3637 can be air. Dielectric spacer 3613 can be a deposited nitride spacer. Note that pillars and spaces between pillars are not to scale. Spaces are scaled up and pillars are scaled down.

Figure 37:
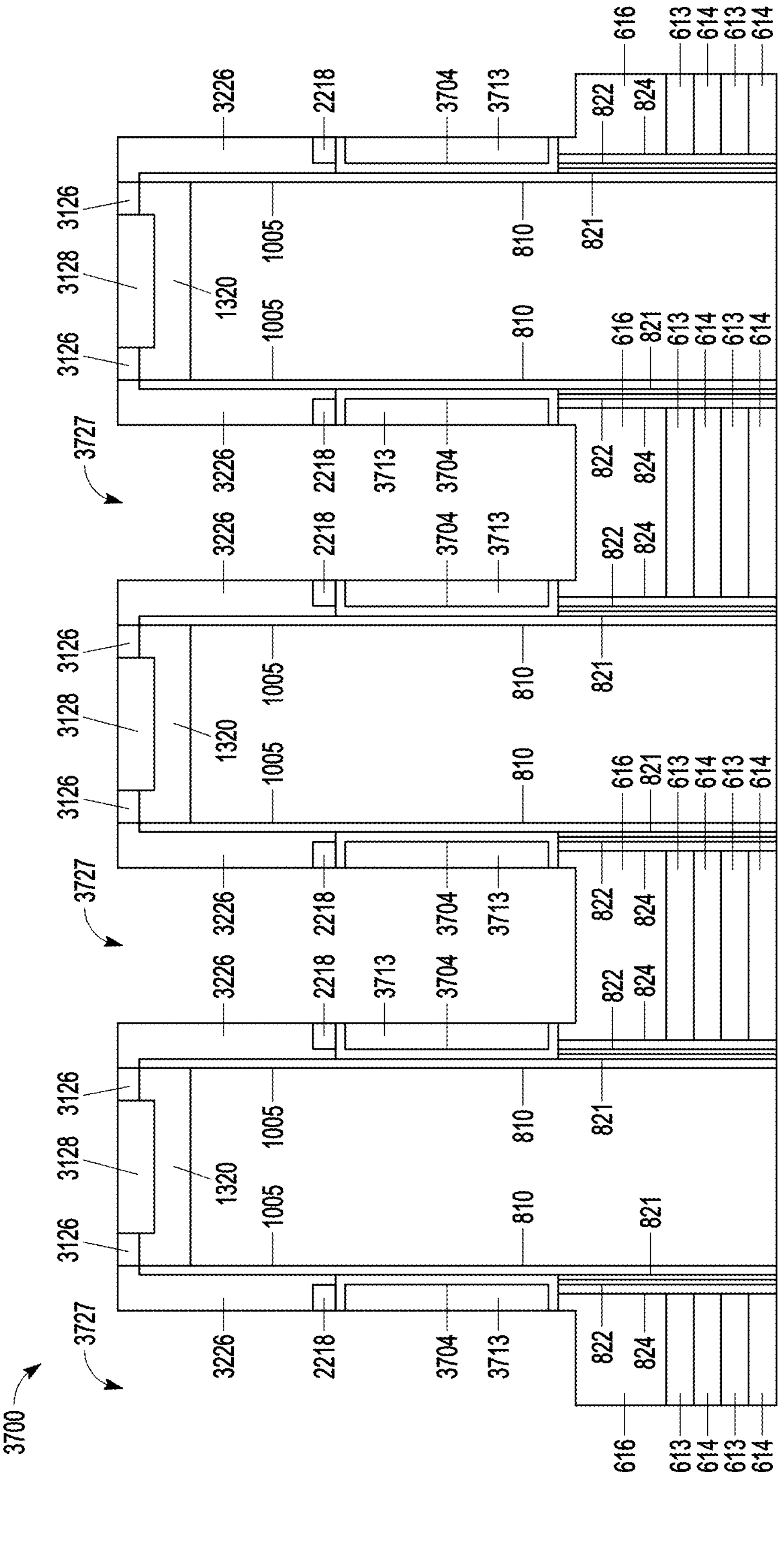

FIG. 37 shows a cross-section of a structure 3700 processed along direction 2131 of FIG. 21 after processing structure 3600 of FIG. 36. Dielectric spacer 3613 can be selectively etched. The selective etch can result in gate dielectric 3504 substantially removed leaving a gate dielectric 3704 enclosing dielectric spacer 3713 that is a remaining portion of dielectric spacer 3613. Openings 3727 are formed from the selective etch.

Figure 38:
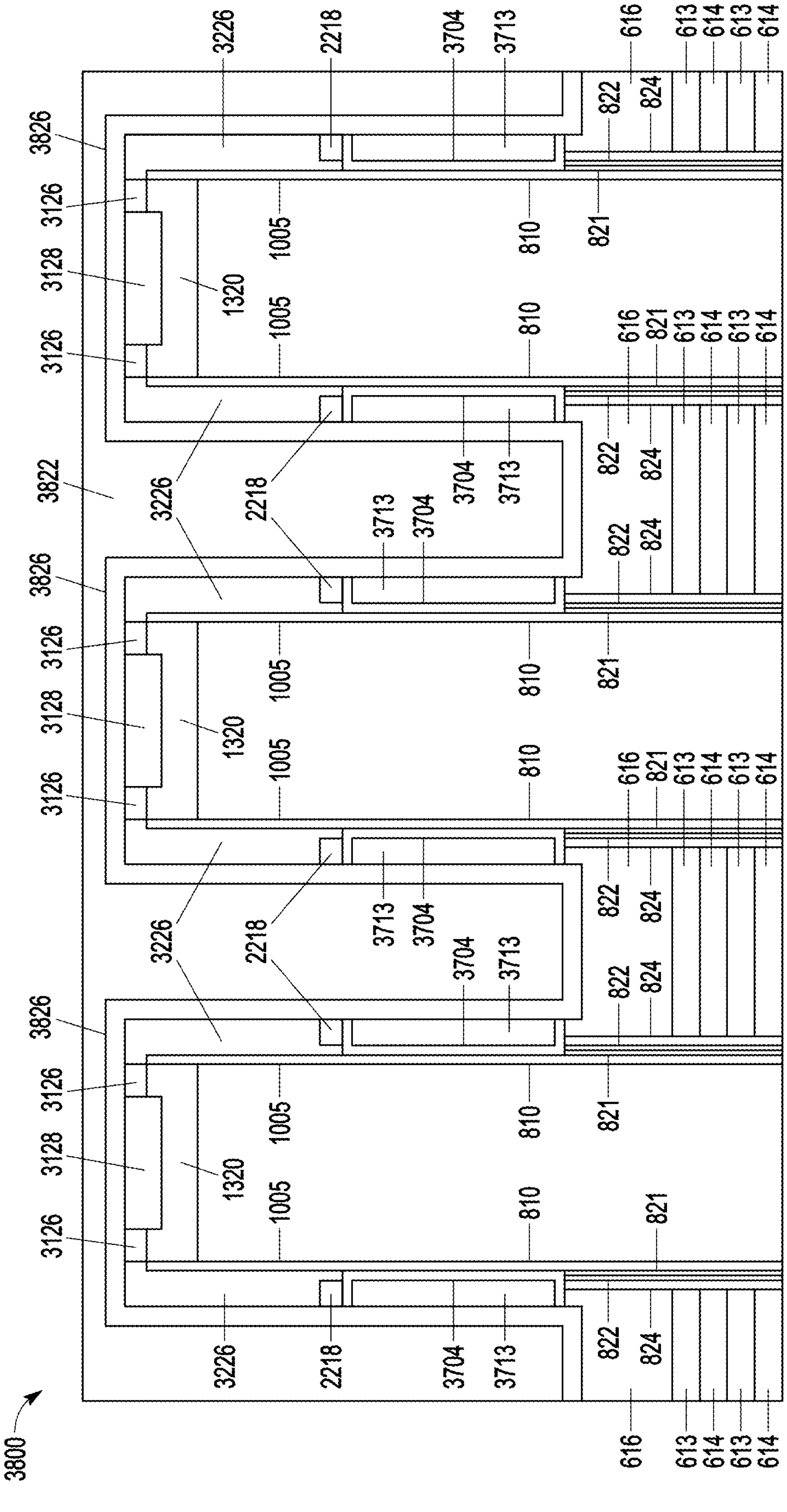

FIG. 38 shows a cross-section of a structure 3800 processed along direction 2131 of FIG. 21 after processing structure 3700 of FIG. 37. A dielectric 3826 has been formed on the surface of structure 3700. Dielectric 3826 can be a deposited oxide layer. A polysilicon 3822 has been formed on dielectric 3826.

Figure 39:
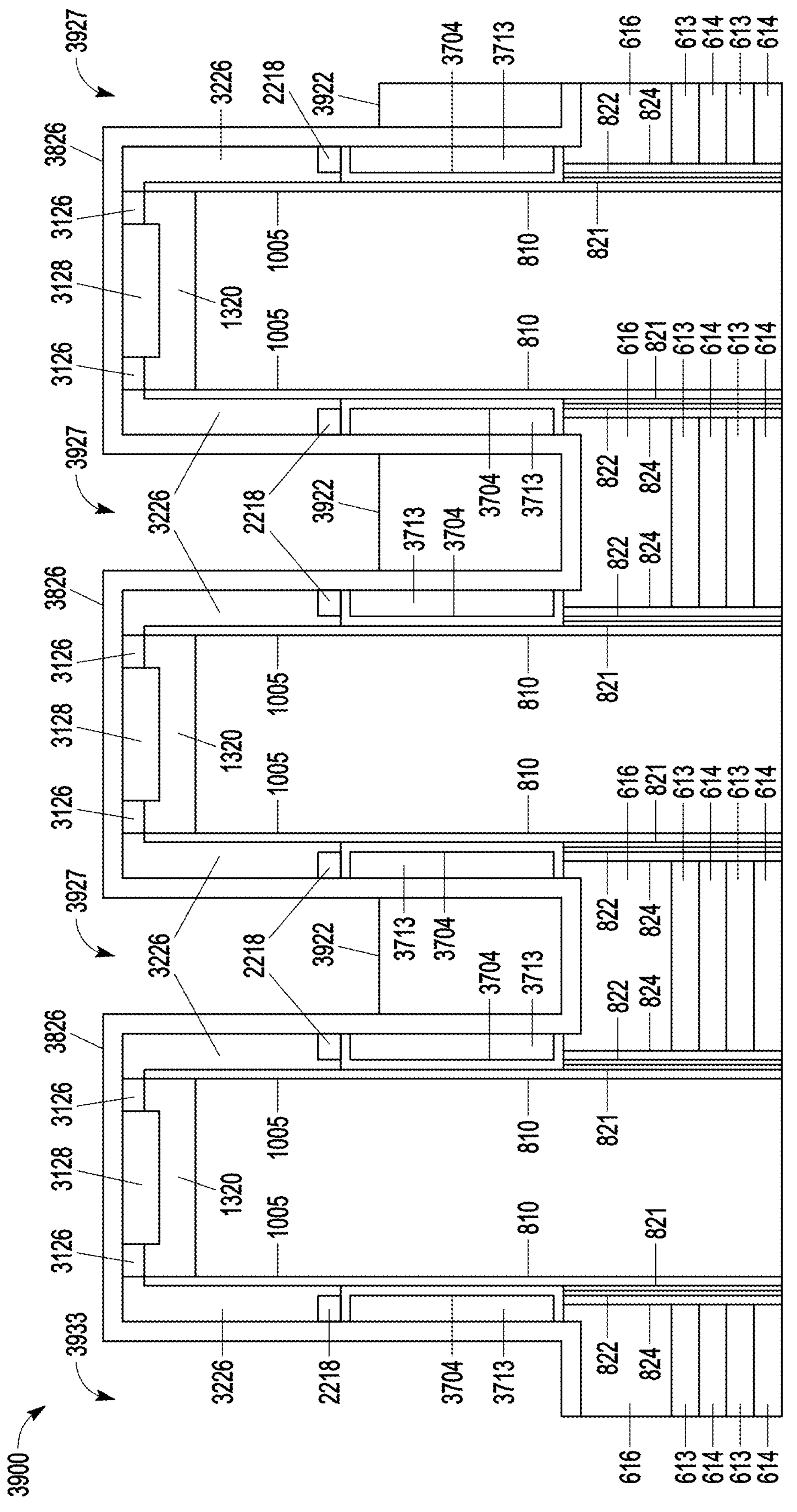

FIG. 39 shows a cross-section of a structure 3900 processed along direction 2131 of FIG. 21 after processing structure 3800 of FIG. 38. Portions of polysilicon 3822 have been removed such that polysilicon 3922 remains at or below tops of dielectric spacer 3713 around channel structure 810 and gate dielectric 3704. Wet etching can be used to recess back polysilicon 3822. Polysilicon at edges of the memory array at slit regions 3933 have been removed. Openings 3927 have been formed above polysilicon 3922.

Figure 40:
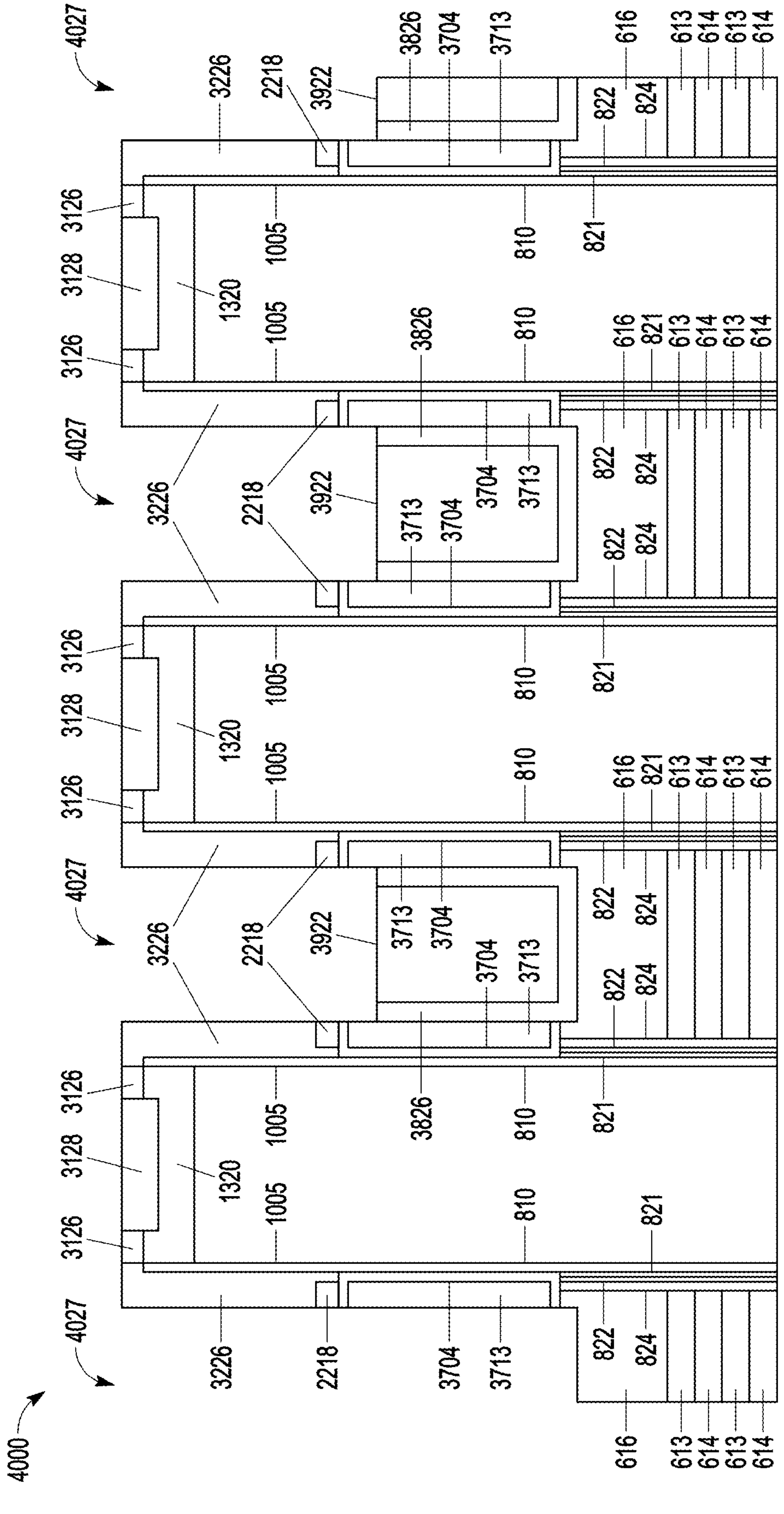

FIG. 40 shows a cross-section of a structure 4000 processed along direction 2131 of FIG. 21 after processing structure 3900 of FIG. 39. Dielectric 3826 has been removed or significantly reduced, exposing ends of dielectric spacer 3713. Removal of dielectric 3826 can be conducted by a wet etch back of dielectric 3826. Openings 3927 have been increased to openings 4027.

Figure 41:
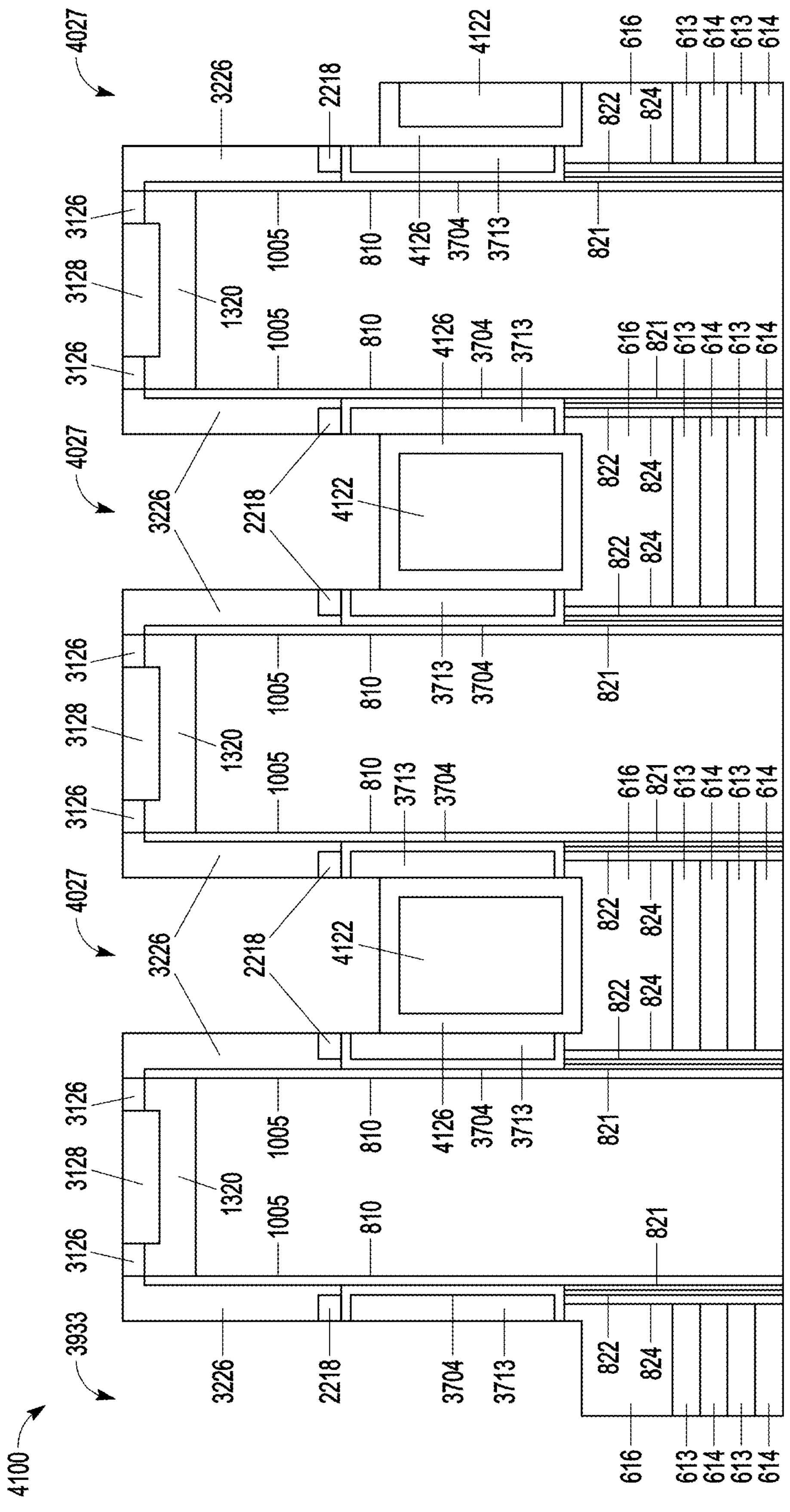

FIG. 41 shows a cross-section of a structure 4100 processed along direction 2131 of FIG. 21 after processing structure 4000 of FIG. 40. A top portion of polysilicon 3922 has been oxidized, forming oxide 4126. Polysilicon 4122 remains below oxide 4126.

Figure 42:
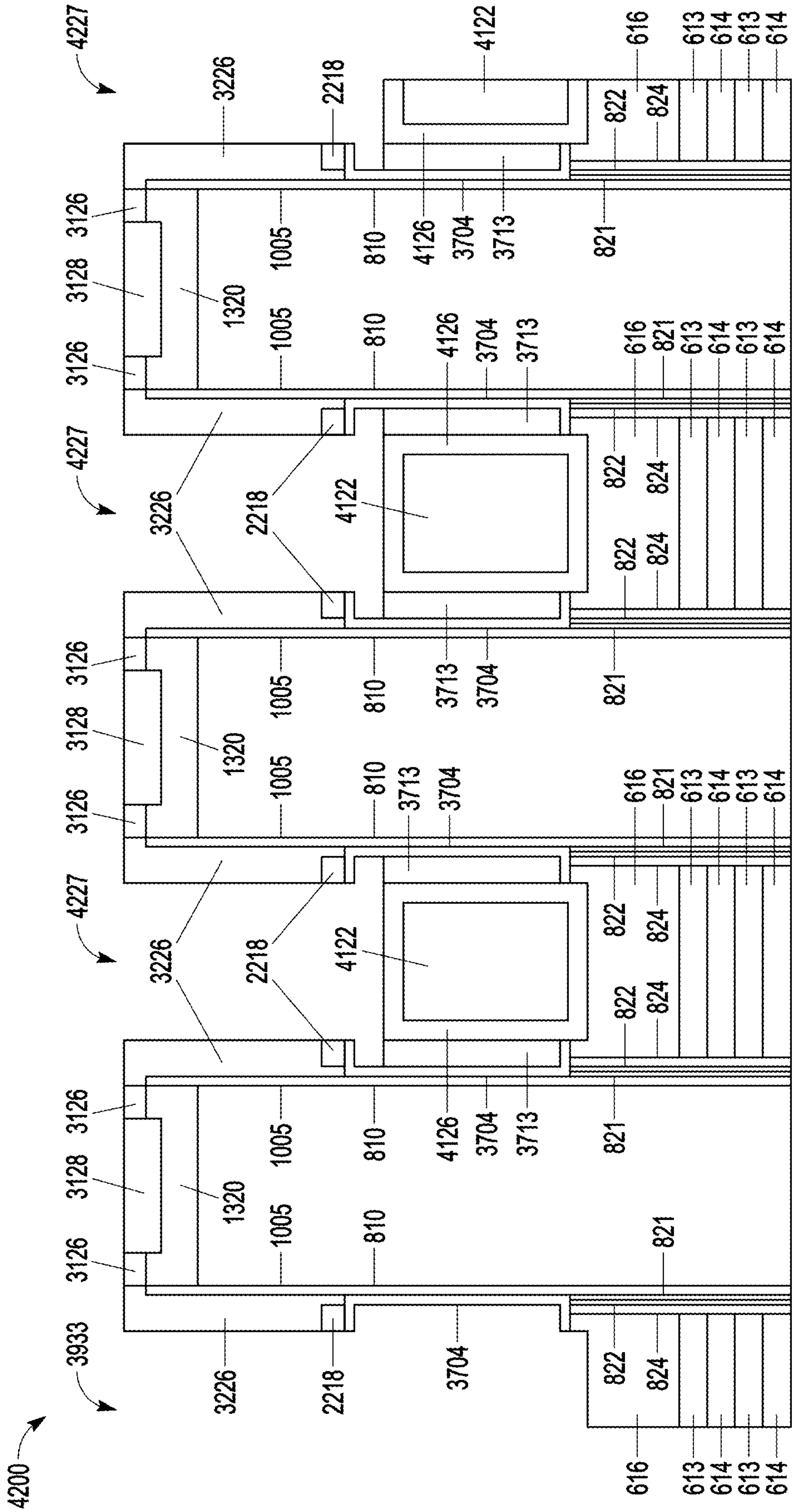

FIG. 42 shows a cross-section of a structure 4200 processed along direction 2131 of FIG. 21 after processing structure 4100 of FIG. 41. Exposed dielectric spacer 3713 above the top of oxide 4126 has been removed. A decap and wet etch can be applied to recess exposed dielectric spacer 3713. Decap is a process of removing residual material at a surface formed of different elements such as dielectric spacer 3713 with oxide 4126. Dielectric spacer 3713 has been removed from slit regions 3933. Openings 4027 have been increased to openings 4227.

Figure 43:
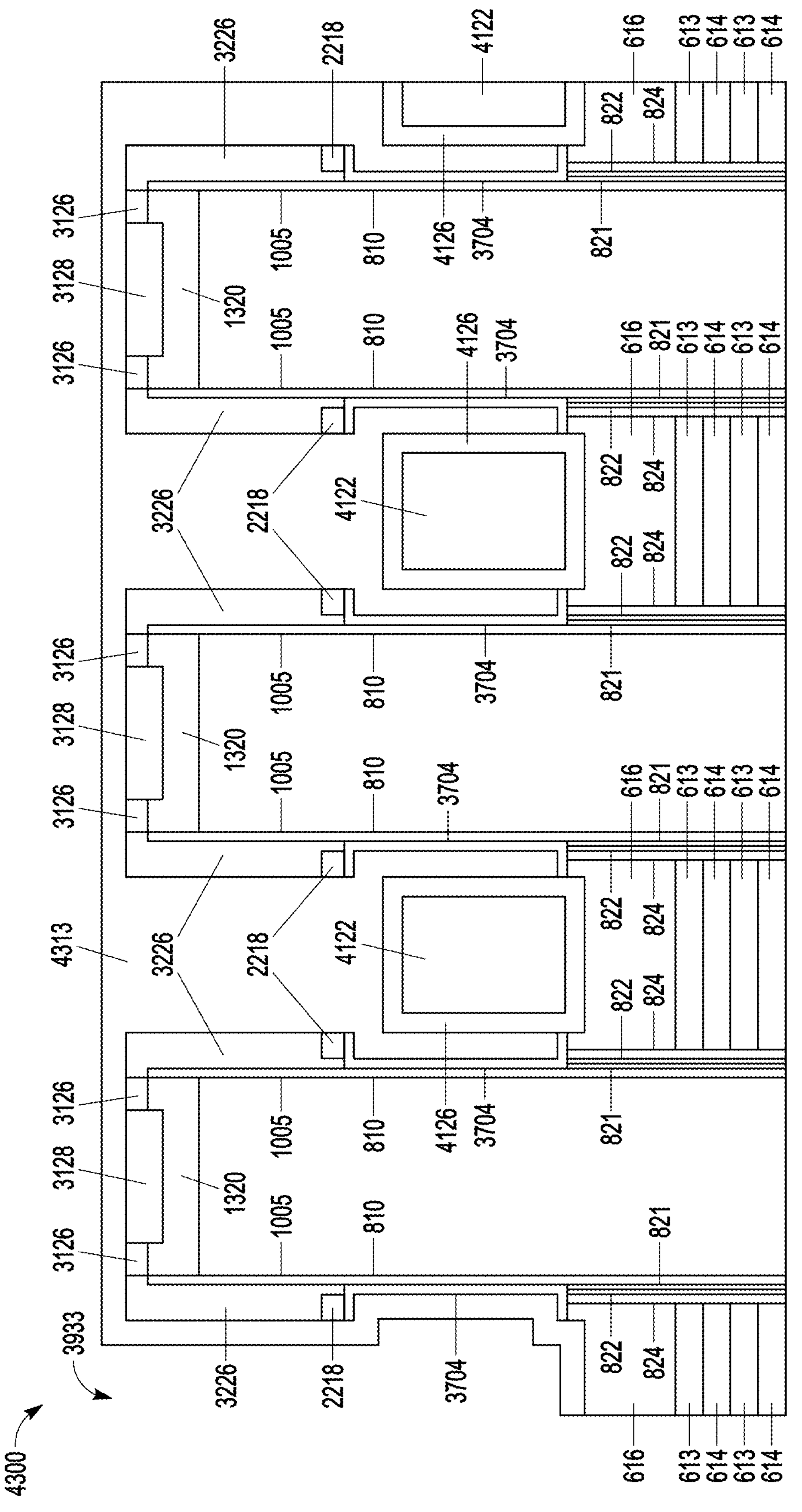

FIG. 43 shows a cross-section of a structure 4300 processed along direction 2131 of FIG. 21 after processing structure 4200 of FIG. 42. Dielectric 4313 has been formed on structure 4200 for performing a replacement gate process for the SGD transistor being formed having a segmented drain. Dielectric 4313 can be a deposited nitride. Spaces between pillars can be near one to two thicknesses of dielectric materials 613.

Figure 44:
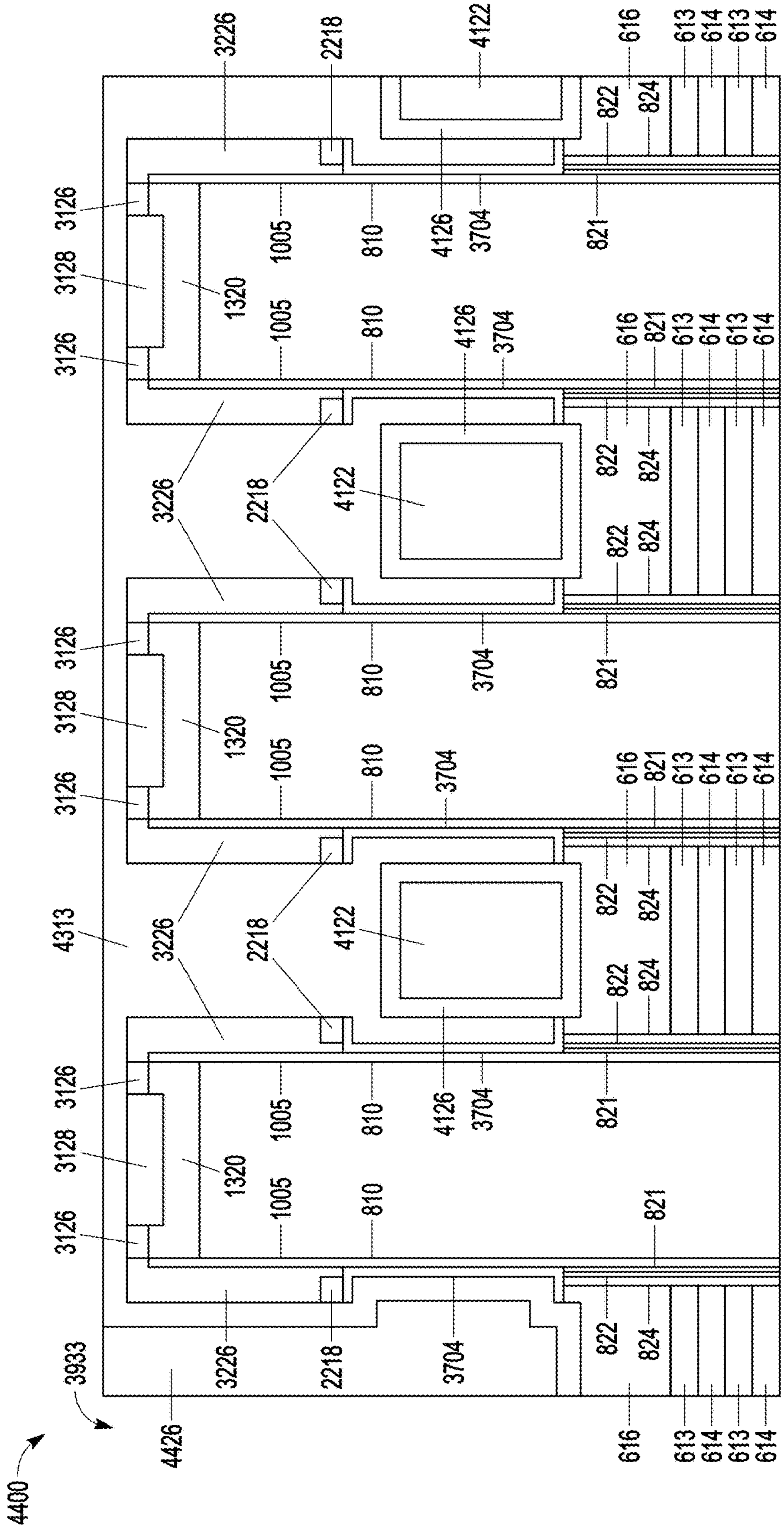

FIG. 44 shows a cross-section of a structure 4400 processed along direction 2131 of FIG. 21 after processing structure 4300 of FIG. 43. A dielectric 4426 has been formed in slit regions 3933 and subjected to a CMP process to planarize dielectric 4426 with dielectric 4313. Dielectric 4426 can be a deposited oxide.

Figure 45:
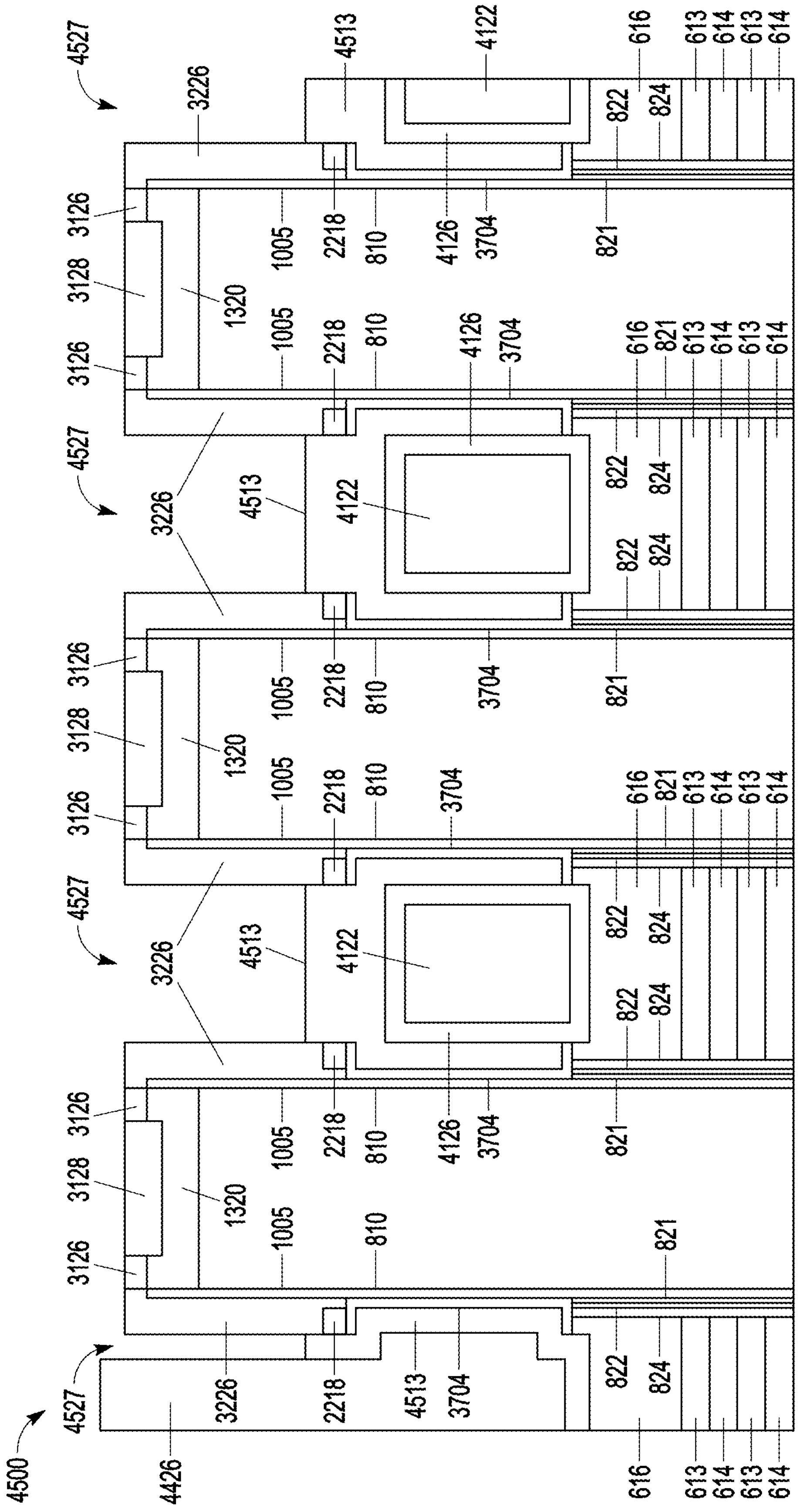

FIG. 45 shows a cross-section of a structure 4500 processed along direction 2131 of FIG. 21 after processing structure 4400 of FIG. 44. Dielectric 4313 has been recessed down to levels near the tops of oxide 4126, forming dielectric 4513 leaving enough of dielectric 4313 for a bridge for replacement gate. Dielectric 4513 can be a nitride. Openings 4527 have been formed.

Figure 46:
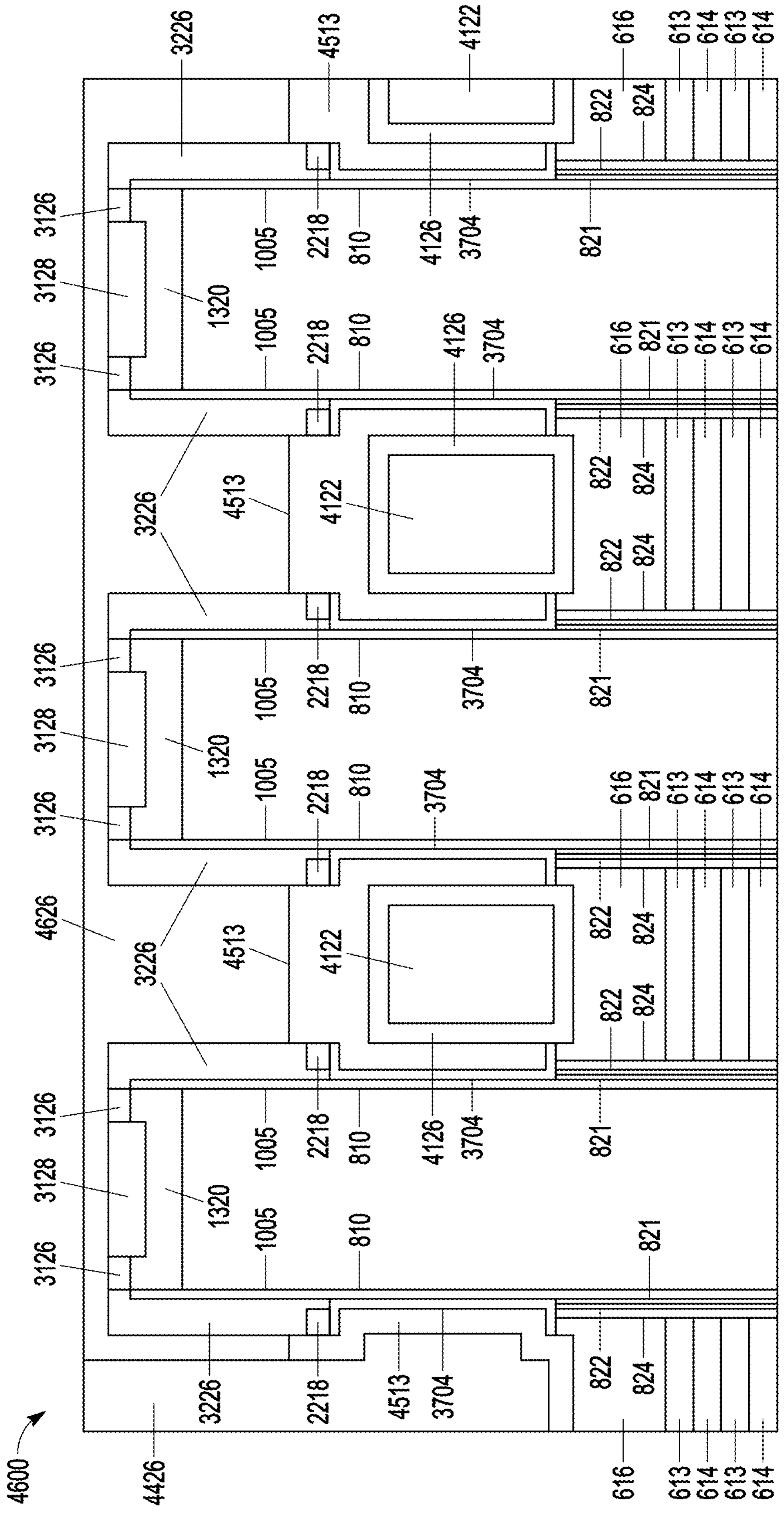

FIG. 46 shows a cross-section of a structure 4600 processed along direction 2131 of FIG. 21 after processing structure 4500 of FIG. 45. Dielectric 4626 has been formed on structure 4500, filling openings 4527. Dielectric 4626 can be an oxide. After forming dielectric 4626, dielectric 4626 has been planarized.

Figure 47:
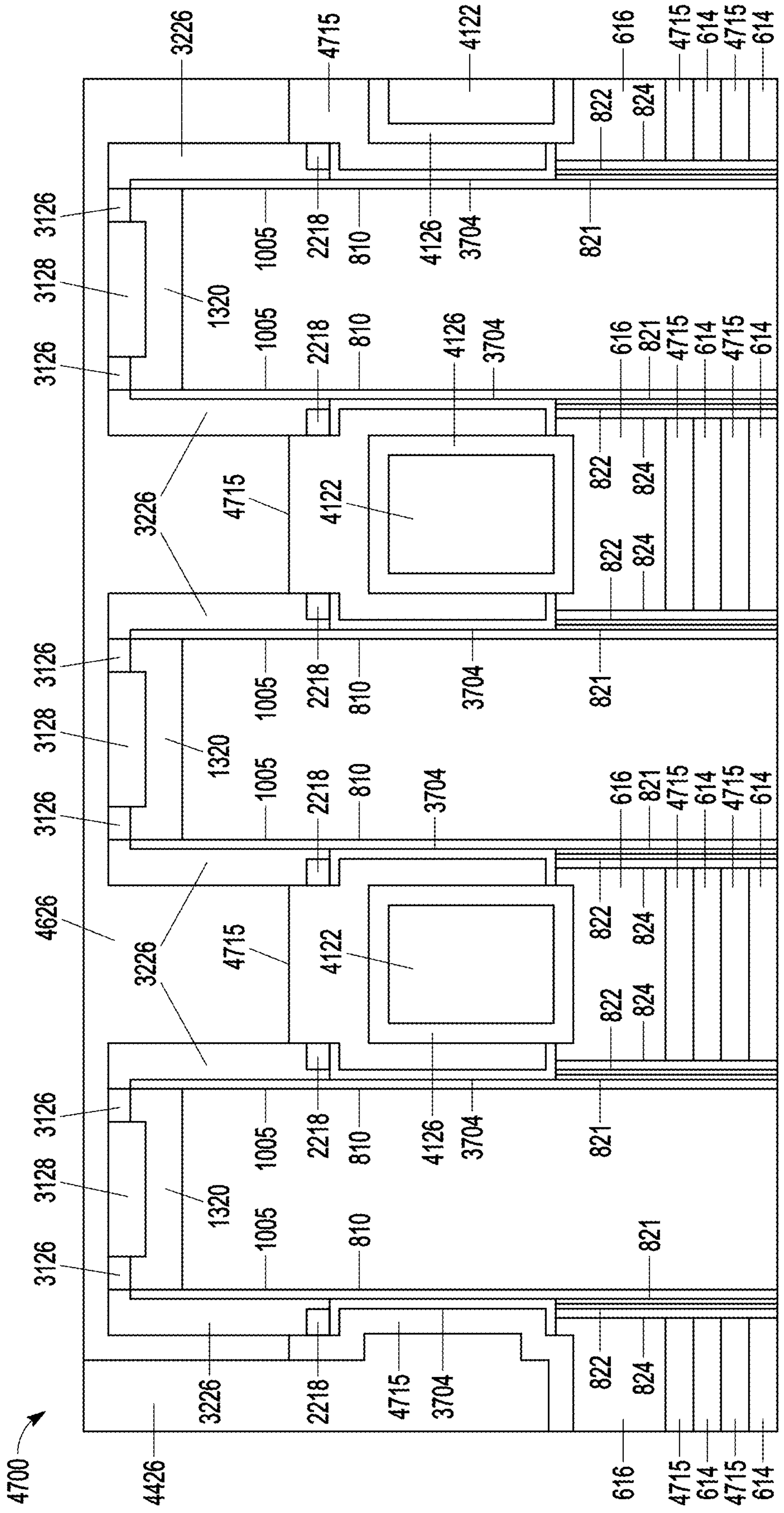

FIG. 47 shows a cross-section of a structure 4700 processed along direction 2131 of FIG. 21 after processing structure 4600 of FIG. 46. Slit and contact etches have been performed in the pillars to remove sacrificial dielectrics and replace the removed dielectrics with conductive materials for the gates 4715 of the SGD transistors and gates 4715 for the memory cells of the respective pillars. The conductive materials are formed by filling the slits. Forming the conductive material for gates 4715 can include forming titanium nitride followed by forming tungsten on the titanium nitride. Before forming the titanium nitride, aluminum oxide can be formed on blocking dielectric 824 for the memory cells of the pillars.

Figure 48:
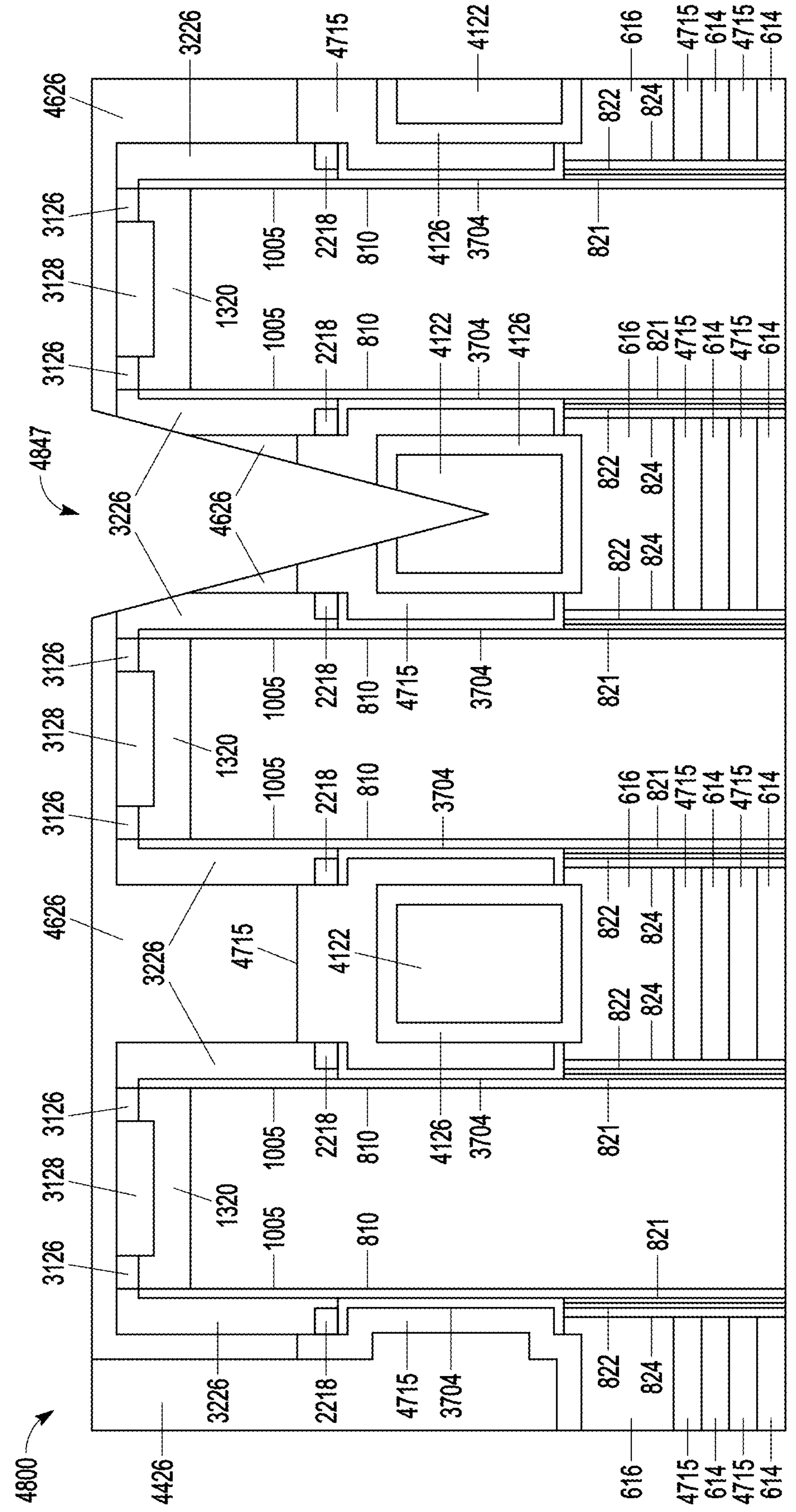

FIG. 48 shows a cross-section of a structure 4800 processed along direction 2131 of FIG. 21 after processing structure 4700 of FIG. 47. To isolate SGD transistors from SGD transistors of other sub-blocks for the memory array, positions for the isolation have been patterned and dielectric 4626 and conductive material 4715 have been etched to form a trench 4847 to isolate the SGDs of sub-block(s).

Figure 49:
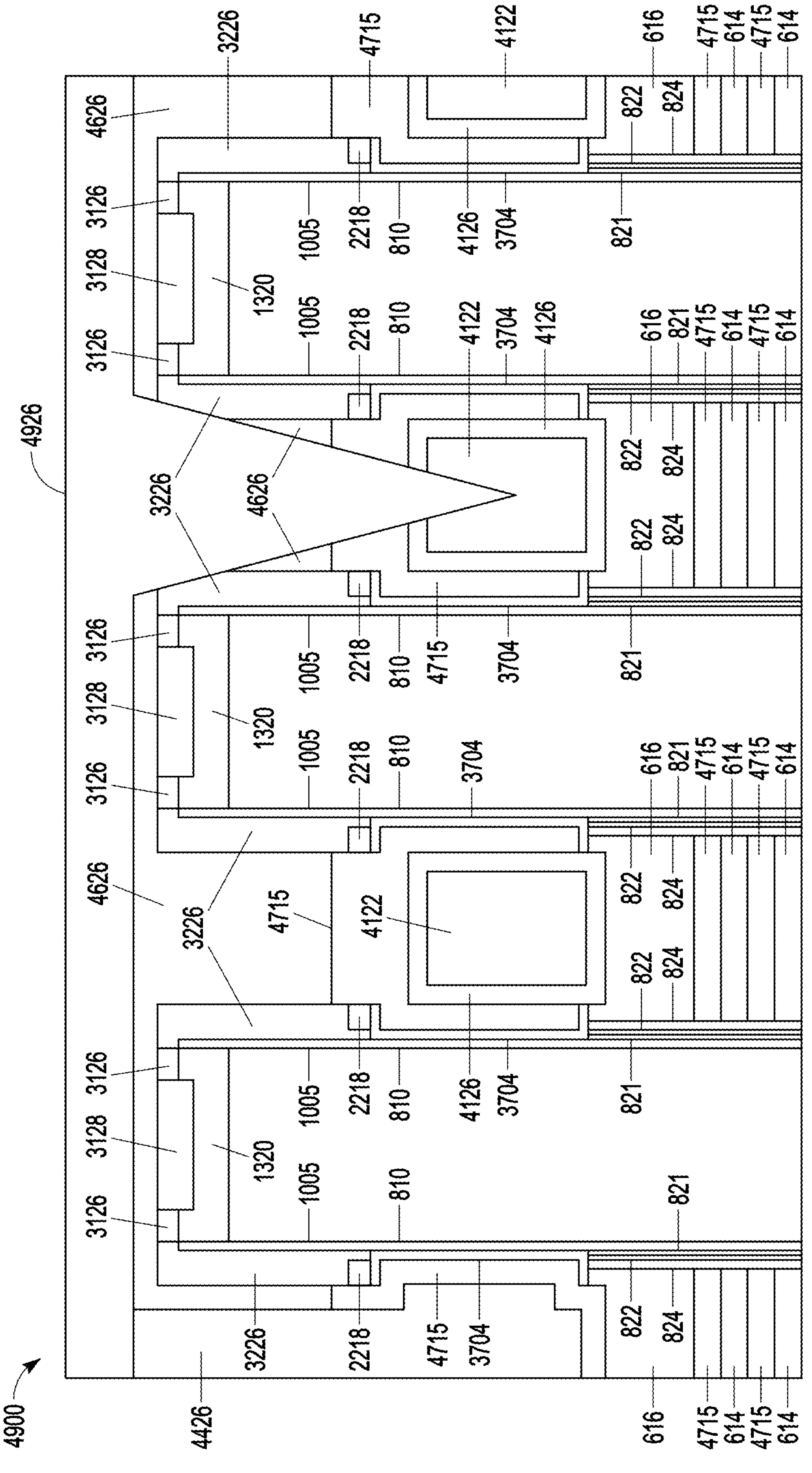

FIG. 49 shows a cross-section of a structure 4900 processed along direction 2131 of FIG. 21 after processing structure 4800 of FIG. 48. A dielectric 4926 has been formed on the surface of structure 4800 and filling trench 4847. Dielectric 4926 has been planarized. Dielectric 4926 can be an oxide, such as, but not limited to, silicon oxide. Staircase contacts can be made to the gates of the SGD transistors and the gates of the memory cells of the pillars of the memory array.

Figure 50:
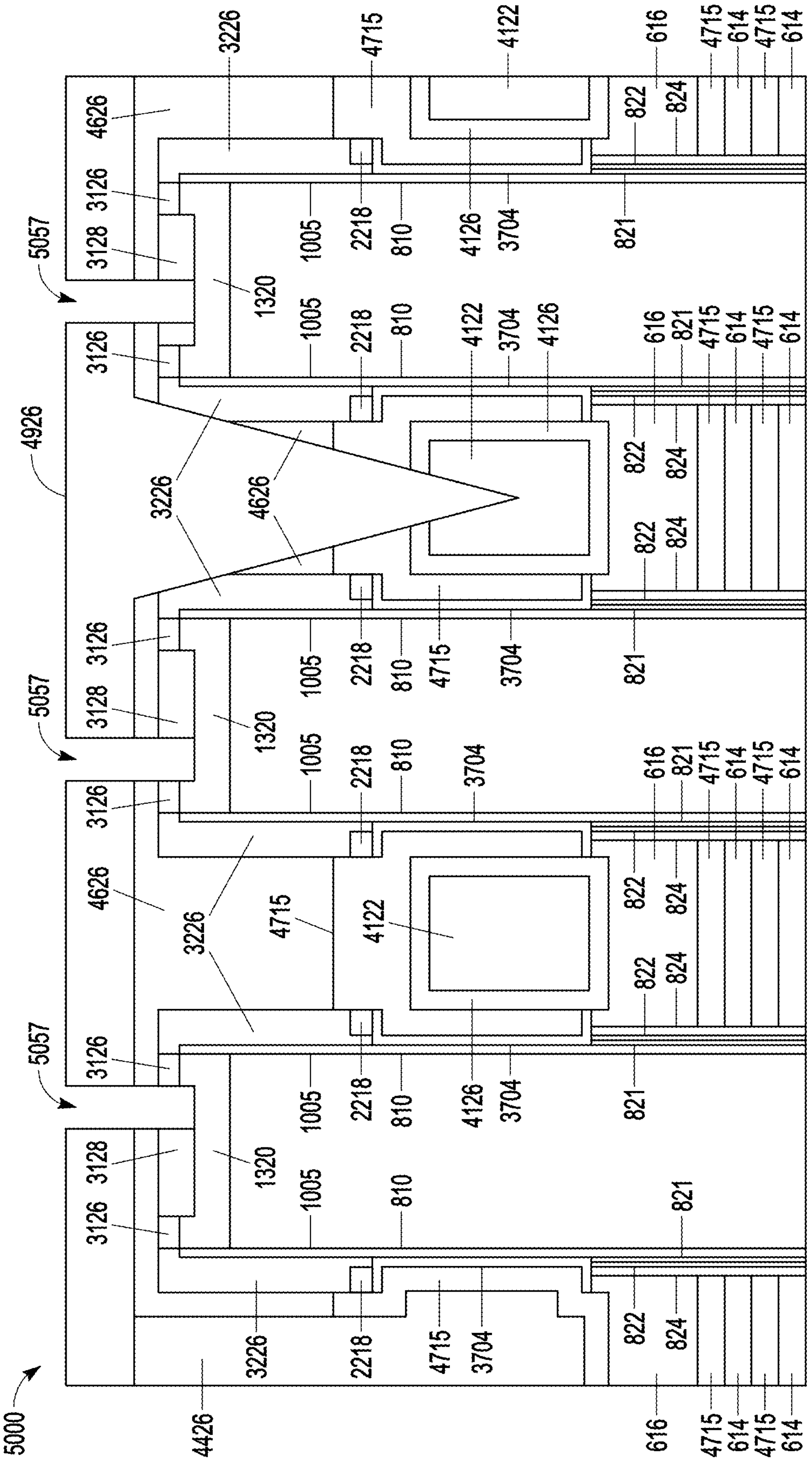

FIG. 50 shows a cross-section of a structure 5000 processed along direction 2131 of FIG. 21 after processing structure 4900 of FIG. 49. Openings 5057 for line contacts from drain contacts 1320 of pillars to digit lines for the memory cells of the pillars have been patterned and etched. Forming a memory device can continue with back end of line (BEOL) processing.

Figure 51:
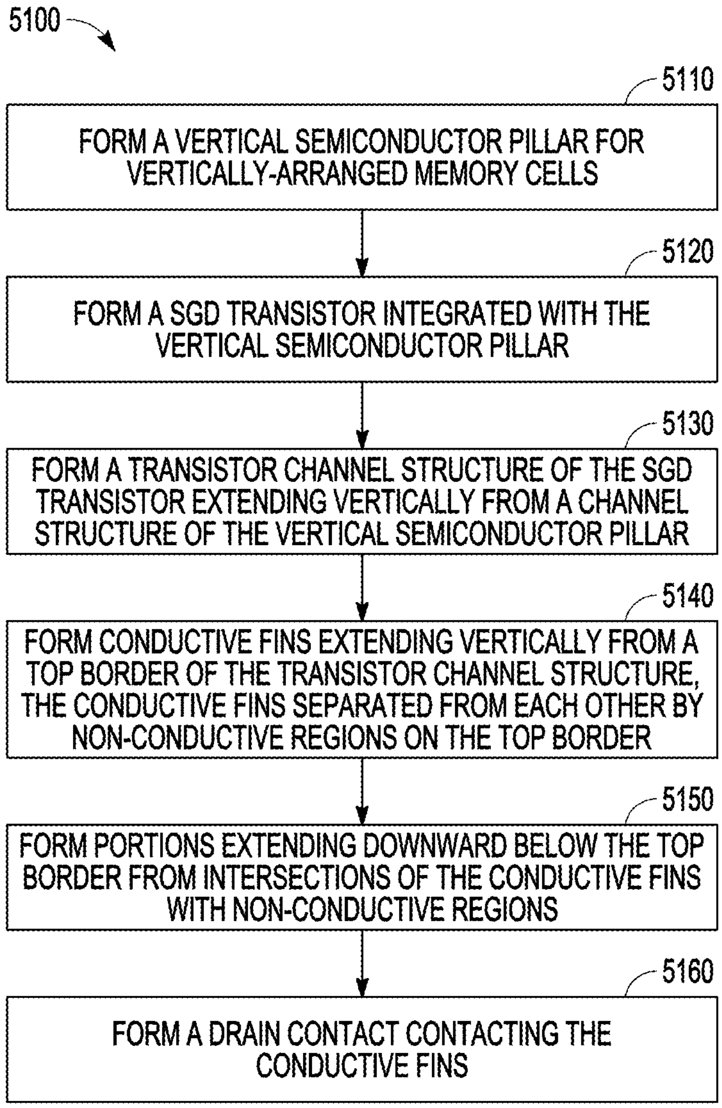
FIG. 51 is a flow diagram of features of an example method of forming a memory device having a drain-side select gate coupling a string of memory cells to a digit line, in accordance with various embodiments.

FIG. 51 is a flow diagram of an embodiment of an example method 5100 of forming a memory device. At 5110, a vertical semiconductor pillar is formed for vertically-arranged memory cells of a memory array. At 5120, a SGD transistor is formed integrated with the vertical semiconductor pillar. At 5130, in forming the SGD transistor, a transistor channel structure of the SGD transistor is formed extending vertically from a channel structure of the vertical semiconductor pillar. At 5140, in forming the SGD transistor, conductive fins are formed extending vertically from a top border of the transistor channel structure. The conductive fins are separated from each other by non-conductive regions on the top border. The conductive fins and non-conductive regions are structured as a segmented drain of the SGD transistor. At 5150, in forming the SGD transistor, portions of the segmented drain are formed extending downward below the top border from intersections of the conductive fins with the non-conductive regions. At 5160, in forming the SGD transistor, a drain contact is formed contacting the conductive fins. The drain contact includes titanium at the conductive fins.

Variations of method 5100 or methods similar to method 5100 can include a number of different embodiments that may be combined depending on the application of such methods and/or the architecture of memory devices in which such memory devices are implemented. Such methods can include forming the conductive fins and the portions of the segmented drain as n+ regions and forming the transistor channel structure as a n region or a n+ region. The transistor channel structure and the channel structure of the vertical pillar can be formed as n-type polysilicon channel structures.

Variations of method 5100 or methods similar to method 5100 can include forming the drain contact with titanium nitride formed between the titanium and a tungsten region. Variations can include forming a vertical conductive contact coupling the drain to a digit line.

Variations of method 5100 or methods similar to method 5100 can include forming a gate of the SGD transistor and gates of the memory cells using a single replacement gate metallization. Variations of method 5100 or methods similar to method 5100 can include etching through a single tier thickness of a conductive access line to isolate the SGD transistor formed in a sub-block of the memory array from a SGD transistor of another sub-block of the memory array.

In various embodiments, a first memory device can include a vertical semiconductor pillar coupled to memory cells, a digit line, and a transistor to couple the digit line to the vertical semiconductor pillar. The vertical semiconductor pillar can have a channel structure arranged as channel portions of the memory cells. The transistor can include a gate, a gate dielectric, a transistor channel structure separated from the gate by the gate dielectric, with the transistor channel structure vertically integrated with the channel structure of the memory cells of the vertical semiconductor pillar. The transistor can also include a segmented drain having conductive fins integrated with the transistor channel structure and extending vertically from a top border of the transistor channel structure. The segmented drain includes the conductive fins separated from each other by non-conductive regions on the top border. The segmented drain also includes portions extending downward below the top border from intersections of the conductive fins with the non-conductive regions. A drain contact contacts the conductive fins, where the drain contact includes titanium at the conductive fins.

Variations of such a first memory device or similar memory devices can include a number of different embodiments that may be combined depending on the application of such memory devices and/or the architecture in which such memory devices are implemented. Such memory devices can include the conductive fins doped more heavily than the transistor channel structure. The transistor channel structure and the channel structure of the vertical pillar can include n-type polysilicon. Variations of the first memory device can include a drain contact having titanium nitride and tungsten. The drain contact can include the titanium nitride arranged between the titanium and the tungsten. The drain contact can be coupled to the digit line by a vertical conductive contact. The vertical conductive contact can include tungsten. Variations can include the segmented drain having six fins.

In various embodiments, a second memory device can comprise a digit line, a vertical semiconductor pillar coupled to memory cells of a memory array, and a SGD transistor. The vertical semiconductor pillar can have a polysilicon channel structure arranged as channel portions of the memory cells. The SGD transistor can include a polysilicon transistor channel structure and a segmented drain. The polysilicon transistor channel structure can be integrated with the polysilicon channel structure. The segmented drain can have conductive fins integrated with the polysilicon transistor channel structure, where the conductive fins extend vertically from a top border of the polysilicon transistor channel structure. The conductive fins are separated from each other by non-conductive regions of the segmented drain on the top border. The segmented drain can include portions extending downward below the top border from intersections of the conductive fins with the non-conductive regions. A drain contact can contact the conductive fins, where the drain contact can include titanium at the conductive fins. A memory controller of the second memory device can include processing circuitry. The memory controller can be structured to perform an erase operation on the memory cells of the vertical semiconductor pillar with application of an erase voltage to a gate of the SGD transistor electrically coupling the vertical semiconductor pillar to the digit line.

Variations of such a second memory device or similar memory devices can include a number of different embodiments that may be combined depending on the application of such memory devices and/or the architecture in which such memory devices are implemented. Such memory devices can include the memory array structured as multiple sub-blocks, where each sub-block includes one or more vertical semiconductor pillars coupled to multiple memory cells. The SGD transistor can be positioned in a first sub-block of the multiple sub-blocks and can be isolated from a SGD transistor of an adjacent sub-block by a dielectric region having a thickness of a tier of an access line conductor.

Variations of such a second memory device or similar memory devices can include the conductive fins structured as n+ fins and the titanium at the n+ fins can be in a titanium silicide composition. Variations can include the drain contact coupled to the digit line by a vertical tungsten contact. Features of the first memory device can be implemented in the second memory device and features of the second memory device can be implemented in the first memory device. The first memory device, the second memory device, and variations thereof can include one or more other features as taught herein.

Although the method of FIGS. 6-50 illustrate forming a SGD transistor with a segmented drain similar to structure 402 of FIG. 4, other channel structures can be formed using variations of these methods. For example, teachings of these methods can be implemented to form structures similar to structures 102, 202, and 302 of FIGS. 1, 2, and 3.

Figure 52:
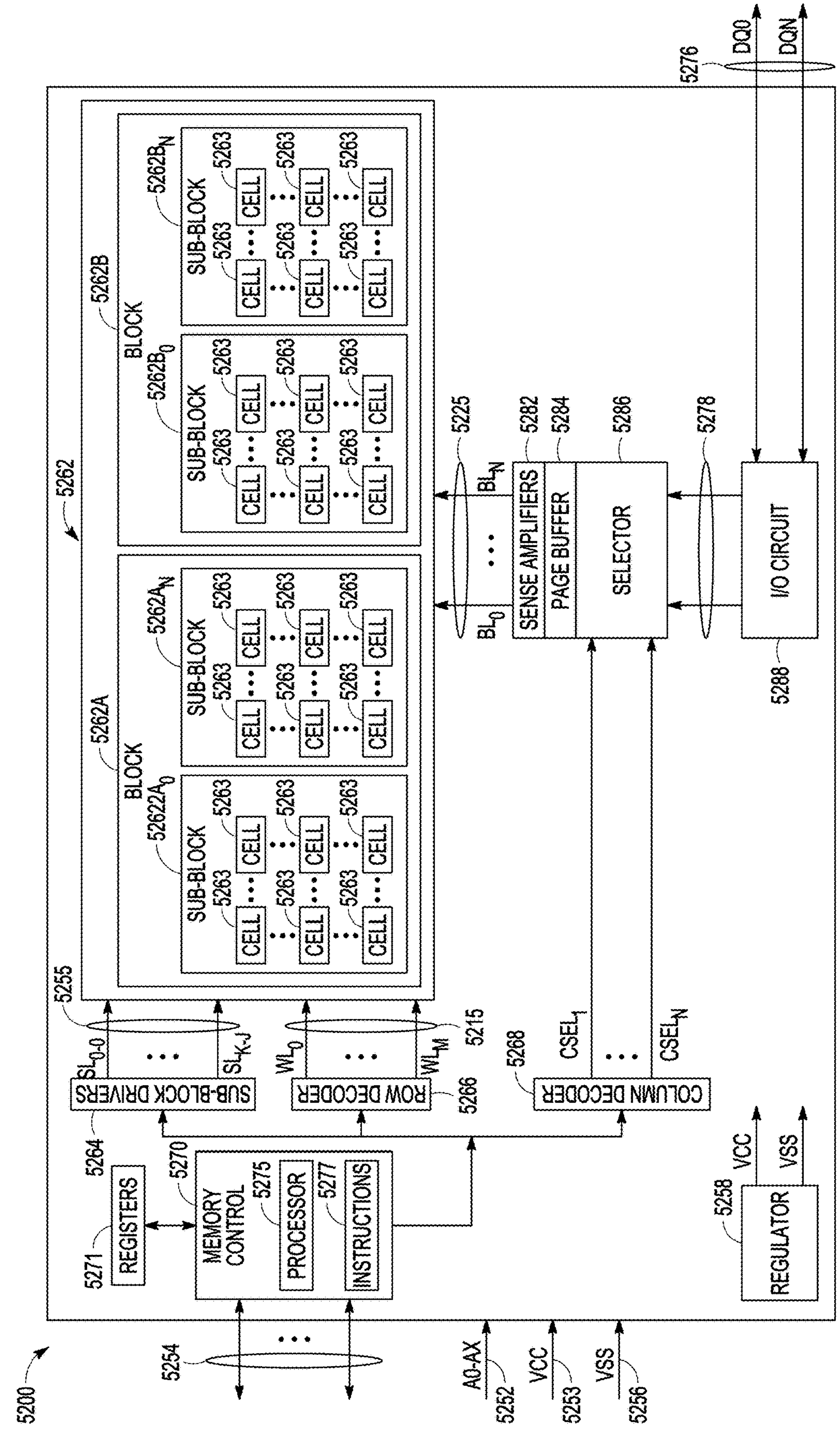
FIG. 52 illustrates a block diagram of features of an example memory device including a memory array having a plurality of memory cells, and one or more circuits or components to provide communication with, or perform one or more memory operations on, the memory array, in accordance with various embodiments.

FIG. 52 illustrates a block diagram of an example memory device 5200 including a memory array 5262 having a plurality of memory cells 5263, and one or more circuits or components to provide communication with, or perform one or more memory operations on, memory array 5262. Memory device 5200 can be a memory die, for example but not limited to, a NAND memory die. Memory device 5200 can include a row decoder 5266, a column decoder 5268, sub-block drivers 5264, sense amplifiers 5282, a page buffer 5284, a selector 5286, an input/output (I/O) circuit 5288, and a memory controller 5270. Memory controller 5270 can include processing circuitry, including one or more processors 5275, and can be configured to perform operations of memory device 5200 by executing instructions 5277. Memory controller 5270 can be coupled to registers 5271 that can contain parameter data for memory controller 5270. For purposes of the present example, instructions 5277 may be performed by memory within or dedicated to memory controller 5270. In other examples, at least some portion of the instructions executed by memory controller 5270 may be stored in other memory structures and loaded, for example into local (memory controller) memory for execution by memory controller 5270. The operations can include an erase algorithm using SGD transistors coupling strings of memory cells to digit lines, with each SGD transistor having a segmented drain with one or more fins separated by one or more non-conductive regions, where the fins and the non-conductive regions extend vertically from a transistor channel region of the given SGD transistor, as taught herein. The segmented drain and transistor channel region of each SGD transistor can be implemented by one of structures 102, 202, 302, 402, and 502 of FIGS. 1, 2, 3, 4, and 5, respectively, or similar structure defined by segmenting a drain.

Memory cells 5263 of memory array 5262 can be arranged in blocks, such as first and second blocks 5262A, 5262B. Each block can include sub-blocks. For example, first block 5262A can include first and second sub-blocks 5262$A_0$, 5262$A_N$, and second block 5262B can include first and second sub-blocks 5262$B_0$, 5262$B_N$. Each sub-block can include a number of physical pages, with each page including a number of memory cells 5263. Although illustrated herein as having two blocks, with each block having two sub-blocks, and each sub-block having a number of memory cells 5263, in other examples, memory array 5262 can include more or fewer blocks, sub-blocks, memory cells, etc. In other examples, memory cells 5263 can be arranged in a number of rows, columns, pages, sub-blocks, blocks, etc., and accessed using, for example, access lines 5215, digit lines 5225, or one or more select gates, source lines, etc.

Memory controller 5270 can control memory operations of memory device 5200 according to one or more signals or instructions received on control lines 5254, including, for example, one or more clock signals or control signals that indicate a desired operation (e.g., write, read, erase, etc.), or address signals (A0-AX) received on one or more address lines 5252. One or more devices external to memory device 5200 can control the values of the control signals on control lines 5254 or the address signals on address line 5252. Examples of devices external to memory device 5200 can include, but are not limited to, a host, an external memory controller, a processor, or one or more circuits or components not illustrated in FIG. 52.

Memory device 5200 can use access lines 5215 and digit lines 5225 to transfer data to (e.g., write or erase) or from (e.g., read) one or more of memory cells 5263. Row decoder 5266 and column decoder 5268 can receive and decode the address signals (A0-AX) from address lines 5252, can determine which of memory cells 5263 are to be accessed, and can provide signals to one or more of access lines 5215 (e.g., one or more of a plurality of access lines ($WL_0$-$WL_M$)) or digit lines 5225 (e.g., one or more of a plurality of digit lines (BL0-BLN)).

Memory device 5200 can include sense circuitry, such as sense amplifiers 5282, configured to determine the values of data on (e.g., read), or to determine the values of data to be written to, memory cells 5263 using digit lines 5225. For example, in a selected string of memory cells 5263, one or more of sense amplifiers 5282 can read a logic level in selected memory cell 5263 in response to a read current flowing in memory array 5262 through the selected string associated with digit lines 5225.

One or more devices external to memory device 5200 can communicate with memory device 5200 using I/O lines (DQ0-DQN) 5276, address lines 5252 (A0-AX), or control lines 5254. I/O circuit 5288 can transfer values of data in or out of memory device 5200, such as in or out of page buffer 5284 or memory array 5262, using I/O lines 5276, according to, for example, control lines 5254 and address lines 5252. Page buffer 5284 can store data received from the one or more devices external to memory device 5200 before the data is programmed into relevant portions of memory array 5262, or can store data read from memory array 5262 before the data is transmitted to the one or more devices external to memory device 5200.

Column decoder 5268 can receive and decode address signals (A0-AX) into one or more column select signals ($CSEL_1$-$CSEL_N$). Selector 5286 (e.g., a select circuit) can receive the column select signals ($CSEL_1$-$CSEL_N$) and select data in page buffer 5284 representing values of data to be read from or to be programmed into memory cells 5263. Selected data can be transferred between page buffer 5284 and I/O circuit 5288 using second digit lines 5278.

Memory controller 5270 can receive positive and negative supply signals, such as a supply voltage (Vcc) 5253 and a negative supply (Vss) 5256 (e.g., a ground potential) with respect to Vcc, from an external source or supply (e.g., an internal or external battery, an AC-to-DC converter, etc.). Memory controller 5270 can include a regulator 5258 to internally provide positive or negative supply signals.

To program or write data to a memory cell, a programming voltage (VPGM) (e.g., one or more programming pulses, etc.) can be applied to selected access lines (e.g., $WL_i$), and, thus, to a control gate of each memory cell coupled to the selected access lines. Programming pulses can begin, for example, at or near 15V, and, in certain examples, can increase in magnitude during each programming pulse application. While the program voltage is applied to the selected access lines, a potential, such as a ground potential (e.g., Vss), can be applied to the digit lines and substrates (and thus the channel structures between the sources and drains) of the memory cells targeted for programming, resulting in a charge transfer (e.g., direct injection or Fowler-Nordheim (FN) tunneling, etc.) from the channel structures to the floating gates of the targeted memory cells.

A Vpass can be applied to one or more access lines having memory cells that are not targeted for programming, or an inhibit voltage (e.g., Vcc) can be applied to digit lines having memory cells that are not targeted for programming, for example, to inhibit charge from being transferred from the channel structures to the floating gates of such non-targeted memory cells. The pass voltage can be variable, depending, for example, on the proximity of the applied pass voltages to an access line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or similar voltage) is applied to a specific access line, such as WL4, a pass voltage of 10V (lower than the programming voltage) can be applied to one or more other access lines, such as WL3, WL5, etc., to inhibit programming of non-targeted memory cells, or to retain the values stored on such memory cells not targeted for programming. As the distance between an applied program voltage and the non-targeted memory cells increases, the pass voltage to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of access lines, etc., can be higher or lower, or more or less.

Between applications of one or more programming pulses (e.g., VPGM), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically VPGM) can be applied to the substrates (and thus the channel structures, between the sources and drains) of the memory cells targeted for erasure (e.g., using one or more digit lines, select gates, etc.), while the access lines of the targeted memory cells are kept at a potential, such as a ground potential (e.g., Vss), resulting in a charge transfer (e.g., direct injection or FN tunneling, etc.) from the floating gates of the targeted memory cells to the channel structures.

When a host, which is a user device, sends an address to memory device 5200, it typically can have an identification of a block, a page, and a column. The identification of the block is used to select the block of interest in the operation. The identification of the page is used to select the WL on which the page resides, and it also is used to select one particular sub-block, as the WL is shared among the sub-blocks of the block. The sub-block on which the page resides is decoded and that sub-block is selected. The address provided by the user device is used to turn on and off the selector device and access memory cells. In typical operations, one sub-block only is selected such that SGDs of one sub-block are active.

Based on the address provided by the user device, memory controller 5270 can select any one sub-block or all sub-blocks. Memory controller 5270 can generate the sub-block address to sub-block drivers 5264 and select any one sub-block or all sub-blocks. Memory controller 5270 can send the WL information to row decoder 5266 and a column address to column decoder 5268.

Sub-block drivers 5264 can include a number of independent drivers that generate signals to select lines 5255 $SL_{0\text{-}0} \ldots SL_{K\text{-}J}$. These select lines 5255 can be coupled to different SGD transistors and different SGS transistors in different blocks. Multiple input signals can be assigned to each individual driver, depending on the different voltages designed for operation of the respective driver during erase operations, program operations, and read operations. From sub-block drivers 5264, appropriate operational signals can be sent to memory array 5262 via select lines 5255 ($SL_{(sub\text{-}block\ \#)\text{-}(SGD\ \#or\ SGS\ \#)}$) $SL_{0\text{-}0} \ldots SL_{K\text{-}J}$.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IOT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., a NVM device such as flash memory, ROM, an SSD, a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

The following are example devices and methods, in accordance with the teachings herein.

An example memory device 1 can comprise a vertical semiconductor pillar coupled to memory cells, the vertical semiconductor pillar having a channel structure arranged as channel portions of the memory cells; a digit line; and a transistor to couple the digit line to the vertical semiconductor pillar, the transistor including: a gate and a gate dielectric; a transistor channel structure separated from the gate by the gate dielectric, the transistor channel structure vertically integrated with the channel structure of the memory cells of the vertical semiconductor pillar; a segmented drain having conductive fins integrated with the transistor channel structure and extending vertically from a top border of the transistor channel structure, the conductive fins separated from each other by non-conductive regions on the top border, the segmented drain including portions extending downward below the top border from intersections of the conductive fins with the non-conductive regions; and a drain contact contacting the conductive fins, the drain contact including titanium at the conductive fins.

An example memory device 2 can include features of example memory device 1 and can include the conductive fins being doped more heavily than the transistor channel structure.

An example memory device 3 can include features of example memory device 2 and any of the preceding example memory devices and can include the transistor channel structure and the channel structure of the vertical pillar including n-type polysilicon.

An example memory device 4 can include features of example memory device 3 and any of the preceding example memory devices and can include the drain contact to include titanium nitride and tungsten.

An example memory device 5 can include features of example memory device 4 and any of the preceding example memory devices and can include the drain contact to include the titanium nitride arranged between the titanium and the tungsten.

An example memory device 6 can include features of any of the preceding example memory devices and can include the drain contact being coupled to the digit line by a vertical conductive contact.

An example memory device 7 can include features of example memory device 6 and any of the preceding example memory devices and can include the vertical conductive contact to include tungsten.

An example memory device 8 can include features of any of the preceding example memory devices and can include the segmented drain having six conductive fins.

In an example memory device 9, any of the memory devices of example memory devices 1 to 8 may include memory devices incorporated into an electronic apparatus further comprising a host processor and a communication bus extending between the host processor and the memory device.

In an example memory device 10, any of the memory devices of example memory devices 1 to 9 may be modified to include any structure presented in another of example memory device 1 to 9.

In an example memory device 11, any apparatus associated with the memory devices of example memory devices 1 to 10 may further include a machine-readable storage device configured to store instructions as a physical state, wherein the instructions may be used to perform one or more operations of the apparatus.

In an example memory device 12, any of the memory devices of example memory devices 1 to 11 may be operated in accordance with any of the below example methods 1 to 11 of forming a memory device.

An example memory device 13 can comprise a digit line; a vertical semiconductor pillar coupled to memory cells of a memory array, the vertical semiconductor pillar having a polysilicon channel structure arranged as channel portions of the memory cells; a drain-side select gate (SGD) transistor including: a polysilicon transistor channel structure integrated with the polysilicon channel structure; a segmented drain, the segmented drain having conductive fins integrated with the polysilicon transistor channel structure and extending vertically from a top border of the polysilicon transistor channel structure, the conductive fins separated from each other by non-conductive regions on the top border, the segmented drain including portions extending downward below the top border from intersections of the conductive fins with the non-conductive regions; a drain contact contacting the conductive fins, the drain contact including titanium at the conductive fins; and a memory controller including processing circuitry, the memory controller configured to perform an erase operation on the memory cells of the vertical semiconductor pillar with application of an erase voltage to a gate of the SGD transistor electrically coupling the vertical semiconductor pillar to the digit line.

An example memory device 14 can include features of example memory device 13 and can include the memory array being structured as multiple sub-blocks, each sub-block including one or more vertical semiconductor pillars coupled to multiple memory cells.

An example memory device 15 can include features of example memory device 14 and any of the preceding example memory device 13 and can include the SGD transistor being positioned in a first sub-block of the multiple sub-blocks and being isolated from a SGD transistor of an adjacent sub-block by a dielectric region having a thickness of a tier of an access line conductor.

An example memory device 16 can include features of any of the preceding example memory devices 13-15 and can include the conductive fins being n+ fins and the titanium being in a titanium silicide composition at the n+ fins.

An example memory device 17 can include features of any of the preceding example memory devices 13-16 and can include the drain contact being coupled to the digit line by a vertical tungsten contact.

In an example memory device 18, any of the memory devices of example memory devices 13 to 17 may include memory devices incorporated into an electronic apparatus further comprising a host processor and a communication bus extending between the host processor and the memory device.

In an example memory device 19, any of the memory devices of example memory devices 13 to 18 may be modified to include any structure presented in another of example memory device 13 to 18.

In an example memory device 20, any apparatus associated with the memory devices of example memory devices 13 to 19 may further include a machine-readable storage device configured to store instructions as a physical state, wherein the instructions may be used to perform one or more operations of the apparatus.

In an example memory device 21, any of the memory devices of example memory devices 13 to 20 may be operated in accordance with any of the below example methods 1 to 11 of forming a memory device.

In an example memory device 22, any of the memory devices of example memory devices 1 to 21 may be modified to include any structure presented in another of example memory device 1 to 21.

An example method 1 of forming a memory device can comprise: forming a vertical semiconductor pillar for vertically-arranged memory cells of a memory array; forming a drain-side select gate (SGD) transistor integrated with the vertical semiconductor pillar, including: forming a transistor channel structure of the SGD transistor extending vertically from a channel structure of the vertical semiconductor pillar; forming conductive fins extending vertically from a top border of the transistor channel structure, the conductive fins separated from each other by non-conductive regions on the top border, the conductive fins and non-conductive regions structured as a segmented drain of the SGD transistor; forming portions of the segmented drain extending downward below the top border from intersections of the conductive fins with the non-conductive regions; and forming a drain contact contacting the conductive fins, the drain contact including titanium at the conductive fins.

An example method 2 of forming a memory device can include features of example method 1 of forming a memory device and can include forming the conductive fins and the portions of the segmented drain as n+ regions and forming the transistor channel structure as a n region or a n− region.

An example method 3 of forming a memory device can include features of example method 2 of forming a memory device and any of the preceding example methods of forming a memory device and can include forming the transistor channel structure and the channel structure of the vertical pillar as n-type polysilicon channel structures.

An example method 4 of forming a memory device can include features of any of the preceding example methods of forming a memory device and can include forming the drain contact to include forming titanium nitride between the titanium and a tungsten region.

An example method 5 of forming a memory device can include features of any of the preceding example methods of forming a memory device and can include forming a vertical conductive contact coupling the segmented drain to a digit line.

An example method 6 of forming a memory device can include features of any of the preceding example methods of forming a memory device and can include forming a gate of the SGD transistor and gates of the memory cells using a single replacement gate metallization.

An example method 7 of forming a memory device can include features of any of the preceding example methods of forming a memory device and can include etching through a single tier thickness of a conductive access line to isolate the SGD transistor formed in a sub-block of the memory array from a SGD transistor of another sub-block of the memory array.

In an example method 8 of forming a memory device, any of the example methods 1 to 7 of forming a memory device may be performed in forming an electronic apparatus further comprising a host processor and a communication bus extending between the host processor and the memory device.

In an example method 9 of forming a memory device, any of the example methods 1 to 8 of forming a memory device may be modified to include operations set forth in any other of example methods 1 to 8 of forming a memory device.

In an example method 10 of forming a memory device, any of the example methods 1 to 9 of forming a memory device may be implemented at least in part through use of instructions stored as a physical state in one or more machine-readable storage devices.

An example method 11 of forming a memory device can include features of any of the preceding example methods 1 to 10 of forming a memory device and can include performing functions associated with any features of example memory devices 1 to 22.

An example machine-readable storage device storing instructions, that when executed by one or more processors, cause a machine to perform operations, can comprise instructions to perform functions associated with any features of example memory devices 1 to 22 or perform methods associated with any features of example methods 1 to 1.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and the phraseology or terminology employed herein is for the purpose of description. Combinations of the above embodiments and other embodiments will be apparent to those of skill in the art upon studying the above description.

What is claimed is:

1. A memory device comprising:

a vertical semiconductor pillar coupled to memory cells, the vertical semiconductor pillar having a channel structure arranged as channel portions of the memory cells;

a digit line; and a transistor to couple the digit line to the vertical semiconductor pillar, the transistor including:

a gate and a gate dielectric;

a transistor channel structure separated from the gate by the gate dielectric, the transistor channel structure vertically integrated with the channel structure of the memory cells of the vertical semiconductor pillar;

a segmented drain having conductive fins integrated with the transistor channel structure and extending vertically from a top border of the transistor channel structure, the conductive fins separated from each other by non-conductive regions on the top border, the segmented drain including portions extending downward below the top border from intersections of the conductive fins with the non-conductive regions; and a drain contact contacting the conductive fins, the drain contact including titanium at the conductive fins.

2. The memory device of claim 1, wherein the conductive fins are doped more heavily than the transistor channel structure.

3. The memory device of claim 2, wherein the transistor channel structure and the channel structure of the vertical pillar include n-type polysilicon.

4. The memory device of claim 1, wherein the drain contact includes titanium nitride and tungsten.

5. The memory device of claim 4, wherein the drain contact includes the titanium nitride arranged between the titanium and the tungsten.

6. The memory device of claim 1, wherein the drain contact is coupled to the digit line by a vertical conductive contact.

7. The memory device of claim 6, wherein the vertical conductive contact includes tungsten.

8. The memory device of claim 1, wherein the segmented drain has six conductive fins.

9. A memory device comprising:
- a digit line;
- a vertical semiconductor pillar coupled to memory cells of a memory array, the vertical semiconductor pillar having a polysilicon channel structure arranged as channel portions of the memory cells;
- a drain-side select gate (SGD) transistor including:
  - a polysilicon transistor channel structure integrated with the polysilicon channel structure; and
  - a segmented drain, the segmented drain having conductive fins integrated with the polysilicon transistor channel structure and extending vertically from a top border of the polysilicon transistor channel structure, the conductive fins separated from each other by non-conductive regions on the top border, the segmented drain including portions extending downward below the top border from intersections of the conductive fins with the non-conductive regions;
- a drain contact contacting the conductive fins, the drain contact including titanium at the conductive fins; and
- a memory controller including processing circuitry, the memory controller configured to perform an erase operation on the memory cells of the vertical semiconductor pillar with application of an erase voltage to a gate of the SGD transistor electrically coupling the vertical semiconductor pillar to the digit line.

10. The memory device of claim 9, wherein the memory array is structured as multiple sub-blocks, each sub-block including one or more vertical semiconductor pillars coupled to multiple memory cells.

11. The memory device of claim 10, wherein the SGD transistor is positioned in a first sub-block of the multiple sub-blocks and is isolated from a SGD transistor of an adjacent sub-block by a dielectric region having a thickness of a tier of an access line conductor.

12. The memory device of claim 9, wherein the conductive fins are n+ fins and the titanium is in a titanium silicide composition at the n+ fins.

13. The memory device of claim 9, wherein the drain contact is coupled to the digit line by a vertical tungsten contact.

14. A method of forming a memory device, the method comprising:
- forming a vertical semiconductor pillar for vertically-arranged memory cells of a memory array;
- forming a drain-side select gate (SGD) transistor integrated with the vertical semiconductor pillar, including:
  - forming a transistor channel structure of the SGD transistor extending vertically from a channel structure of the vertical semiconductor pillar;
  - forming conductive fins extending vertically from a top border of the transistor channel structure, the conductive fins separated from each other by non-conductive regions on the top border, the conductive fins and non-conductive regions structured as a segmented drain of the SGD transistor;
  - forming portions of the segmented drain extending downward below the top border from intersections of the conductive fins with the non-conductive regions; and
  - forming a drain contact contacting the conductive fins, the drain contact including titanium at the conductive fins.

15. The method of claim 14, wherein the method includes forming the conductive fins and the portions of the segmented drain as n+ regions and forming the transistor channel structure as a n region or a n− region.

16. The method of claim 15, wherein the method includes forming the transistor channel structure and the channel structure of the vertical pillar as n-type polysilicon channel structures.

17. The method of claim 14, wherein forming the drain contact includes forming titanium nitride between the titanium and a tungsten region.

18. The method of claim 14, wherein the method includes forming a vertical conductive contact coupling the segmented drain to a digit line.

19. The method of claim 14, wherein the method includes forming a gate of the SGD transistor and gates of the memory cells using a single replacement gate metallization.

20. The method of claim 14, wherein the method includes etching through a single tier thickness of a conductive access line to isolate the SGD transistor formed in a sub-block of the memory array from a SGD transistor of another sub-block of the memory array.

* * * * *